US010049760B2

(12) United States Patent
Shiino et al.

(10) Patent No.: US 10,049,760 B2
(45) Date of Patent: Aug. 14, 2018

(54) PROGRAMMING AND VERIFICATION METHODS FOR THREE-DIMENSIONAL MEMORY DEVICE

(71) Applicant: TOSHIBA MEMORY CORPORATION, Minato-ku (JP)

(72) Inventors: Yasuhiro Shiino, Fujisawa (JP); Tomoaki Nakano, Yokohama (JP); Shigefumi Irieda, Yokohama (JP); Masashi Yoshida, Yokohama (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/459,261

(22) Filed: Mar. 15, 2017

(65) Prior Publication Data

US 2018/0068739 A1 Mar. 8, 2018

(30) Foreign Application Priority Data

Sep. 6, 2016 (JP) ................................ 2016-173663

(51) Int. Cl.
*G11C 16/34* (2006.01)
*G11C 16/10* (2006.01)
*G11C 16/04* (2006.01)

(52) U.S. Cl.
CPC .......... *G11C 16/3459* (2013.01); *G11C 16/10* (2013.01); *G11C 16/04* (2013.01)

(58) Field of Classification Search
CPC ............................ G11C 16/3459; G11C 16/10
See application file for complete search history.

(56) References Cited

U.S. PATENT DOCUMENTS

2004/0109352 A1* 6/2004 Lee .................... G11C 16/3454 365/185.2
2007/0252201 A1 11/2007 Kito et al.
2009/0073763 A1 3/2009 Hosono
2009/0267128 A1 10/2009 Maejima
2009/0268522 A1 10/2009 Maejima
2010/0207195 A1 8/2010 Fukuzumi et al.
2010/0329005 A1* 12/2010 Yang .................. G11C 11/5628 365/185.03
2011/0069556 A1 3/2011 Higashi et al.
2011/0284946 A1 11/2011 Kiyotoshi
(Continued)

FOREIGN PATENT DOCUMENTS

JP 2007-266143 10/2007
JP 2010-27165 2/2010
(Continued)

*Primary Examiner* — Ajay Ojha
(74) *Attorney, Agent, or Firm* — Oblon, McClelland, Maier & Neustadt, L.L.P.

(57) ABSTRACT

According to one embodiment, a memory device includes a plurality of memory cells; and a first word line connected to the memory cells. When data is written, a first program voltage is applied to the first word line, a first verify voltage is applied to the first word line to obtain a first verify result, a second program voltage is applied to the first word line, a second verify voltage is applied to the first word line to obtain a second verify result, and among the memory cells, a first memory cell whose first verify result is a pass is set to a program inhibited state when the second program voltage is applied and set as a target of the detection of the second verify result.

17 Claims, 44 Drawing Sheets

(56) References Cited

U.S. PATENT DOCUMENTS

| | | | | |
|---|---|---|---|---|
| 2012/0069667 | A1 | 3/2012 | Shirakawa | |
| 2012/0134212 | A1 | 5/2012 | Higashi et al. | |
| 2015/0155045 | A1 | 6/2015 | Yano | |
| 2016/0035431 | A1 * | 2/2016 | Nam .................. | G11C 16/0483 365/185.25 |

FOREIGN PATENT DOCUMENTS

| | | |
|---|---|---|
| JP | 4510060 | 7/2010 |
| JP | 2011-70712 | 4/2011 |
| JP | 2012-119019 | 6/2012 |
| JP | 5259666 | 8/2013 |
| JP | 2015-109121 | 6/2015 |

* cited by examiner

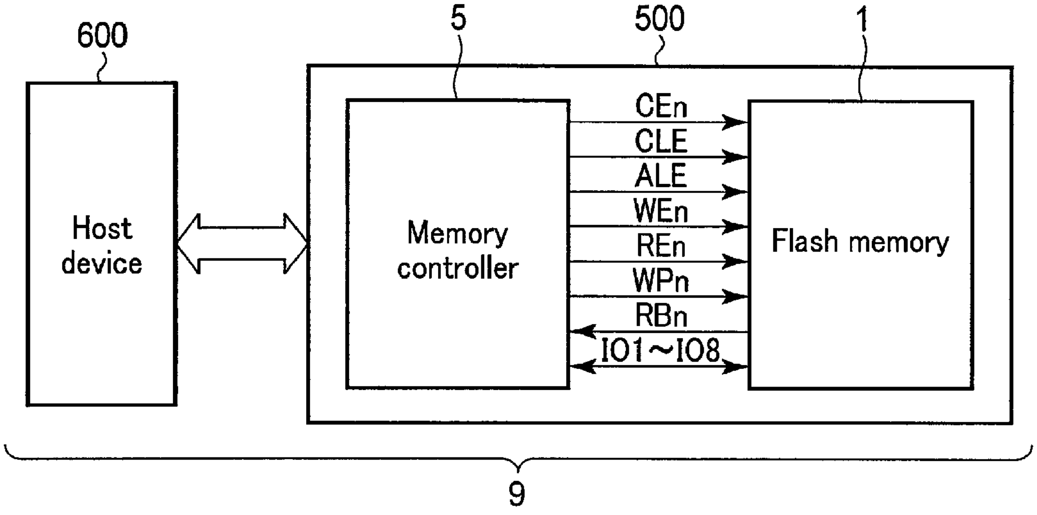
F I G. 1

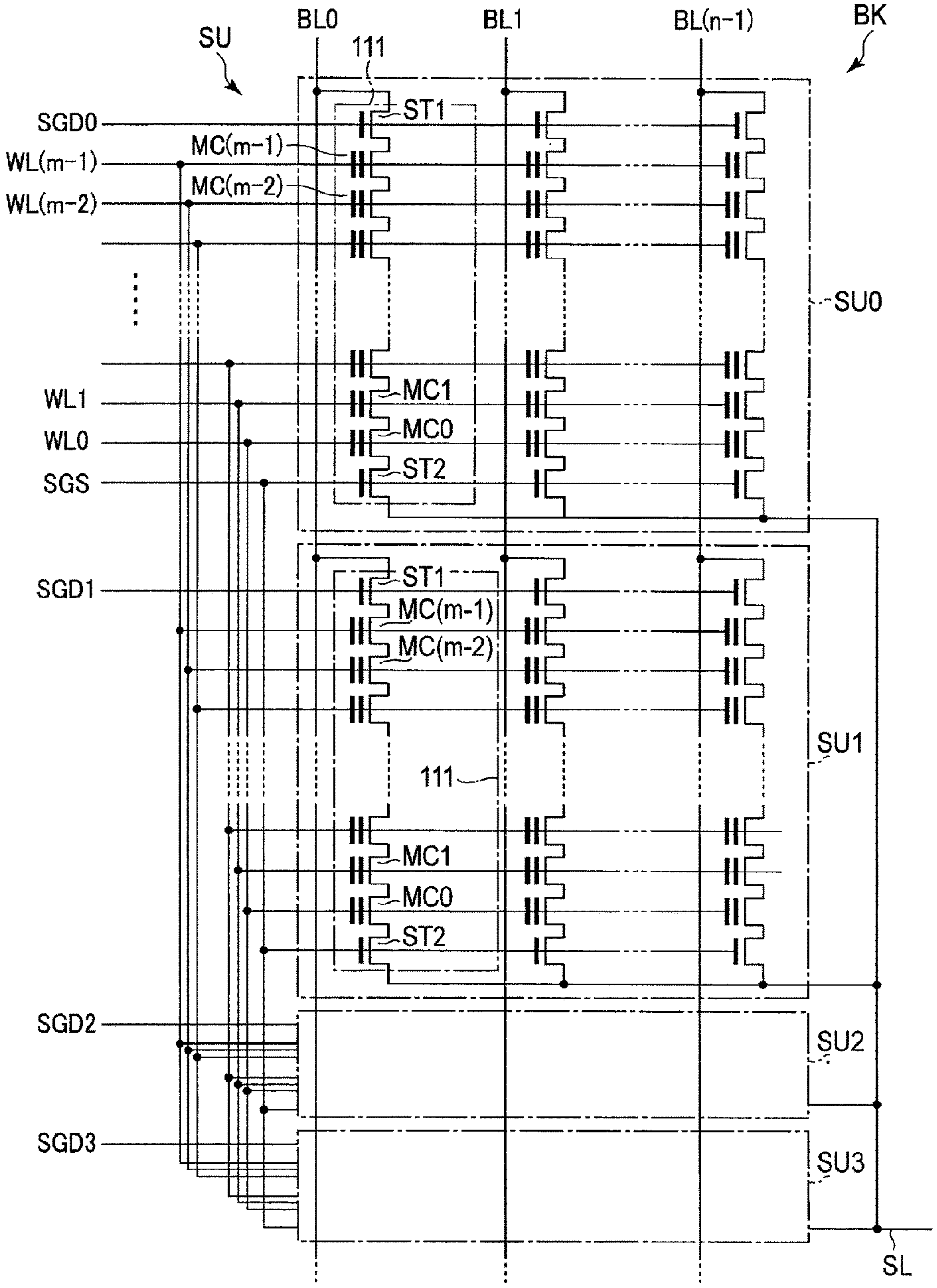
F I G. 3

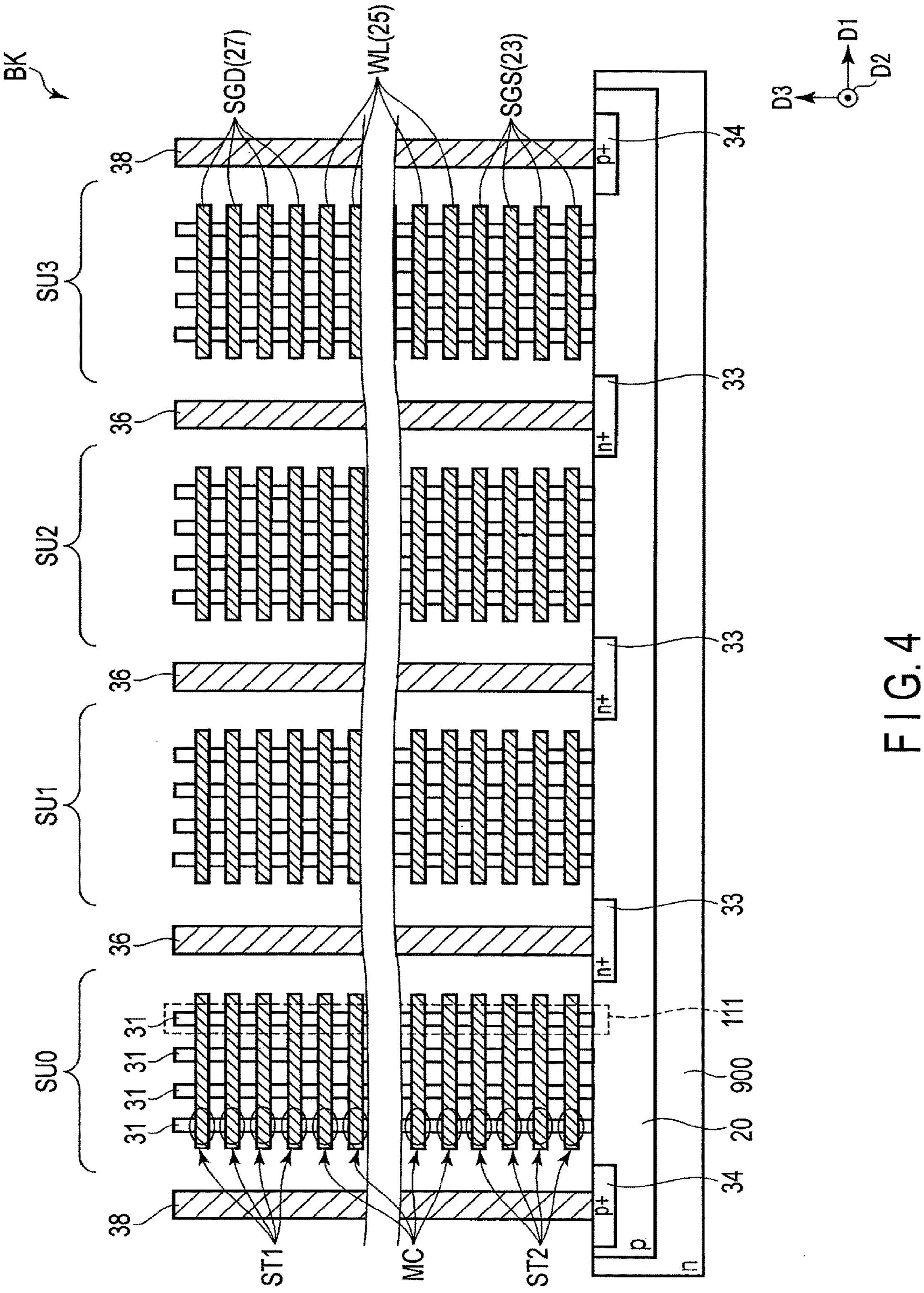
F I G. 4

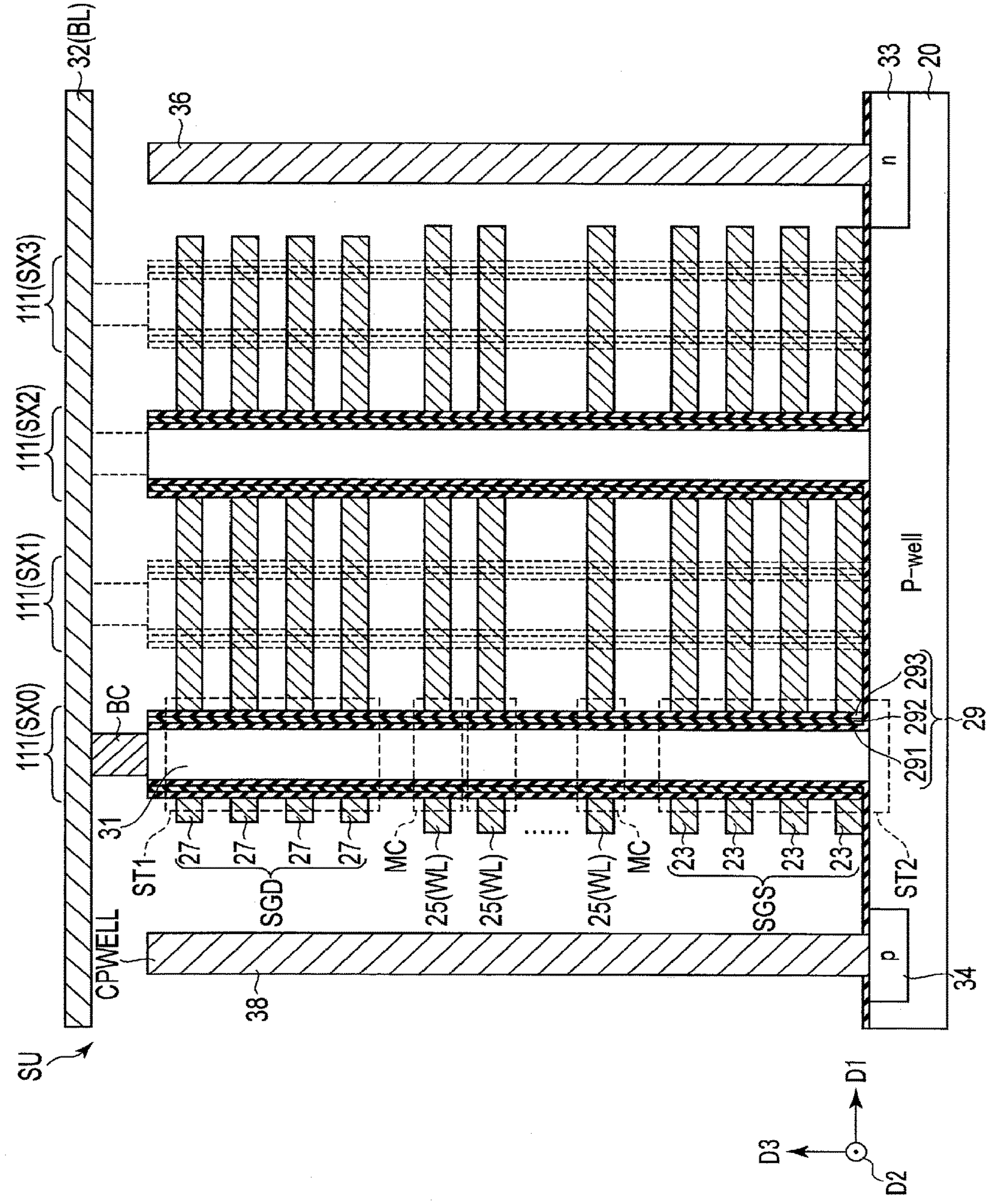
F I G. 5

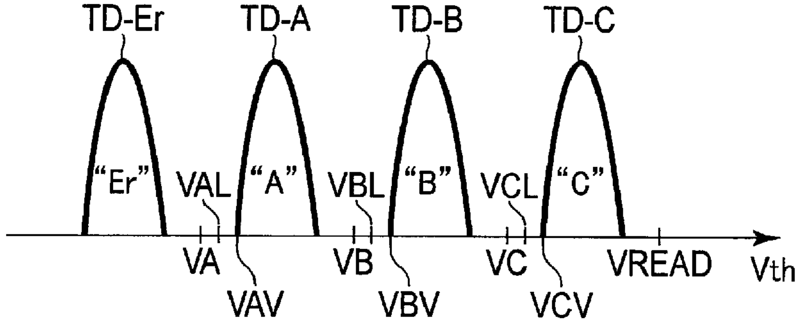
F I G. 6

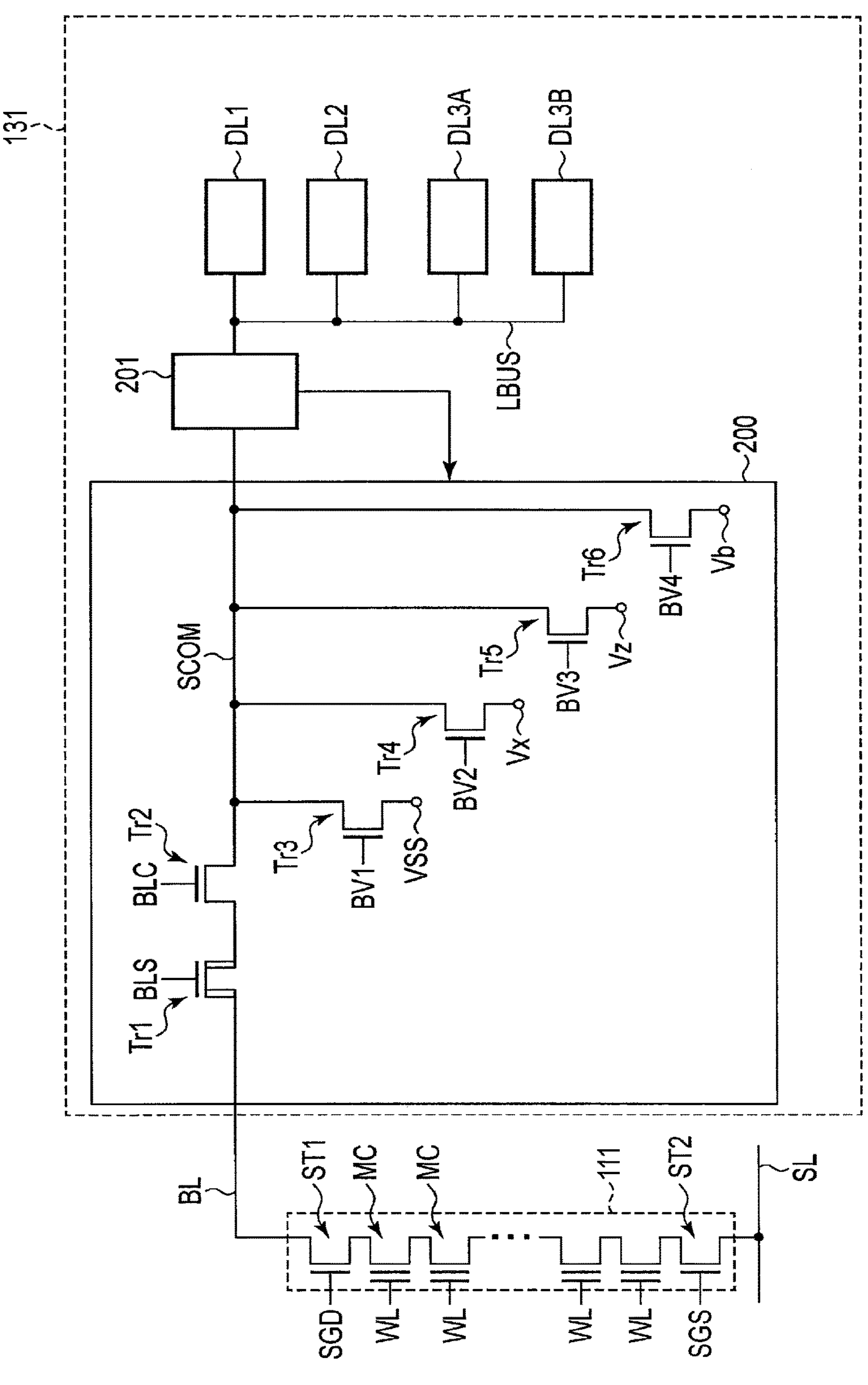
F I G. 7

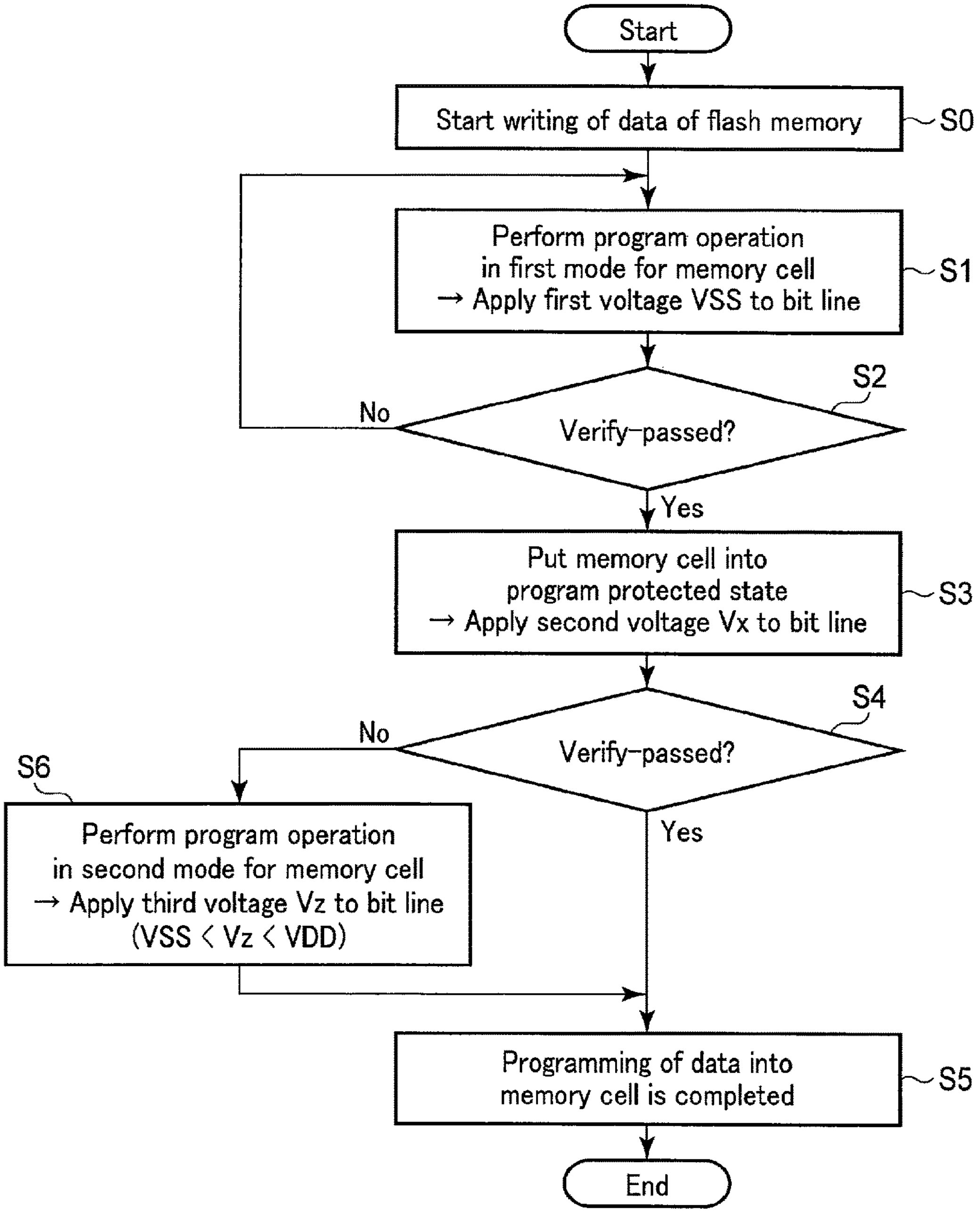
F I G. 8

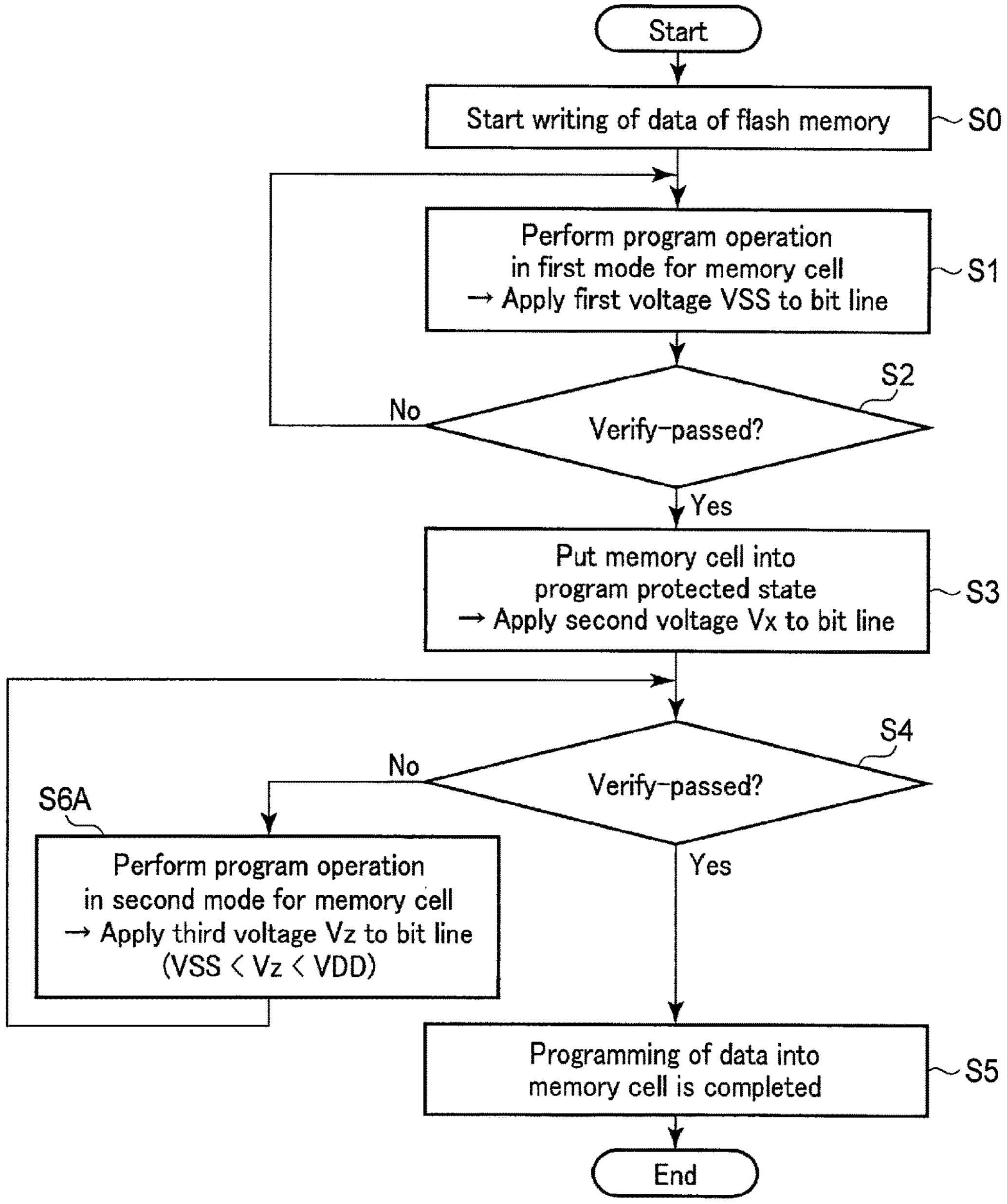
F I G. 11

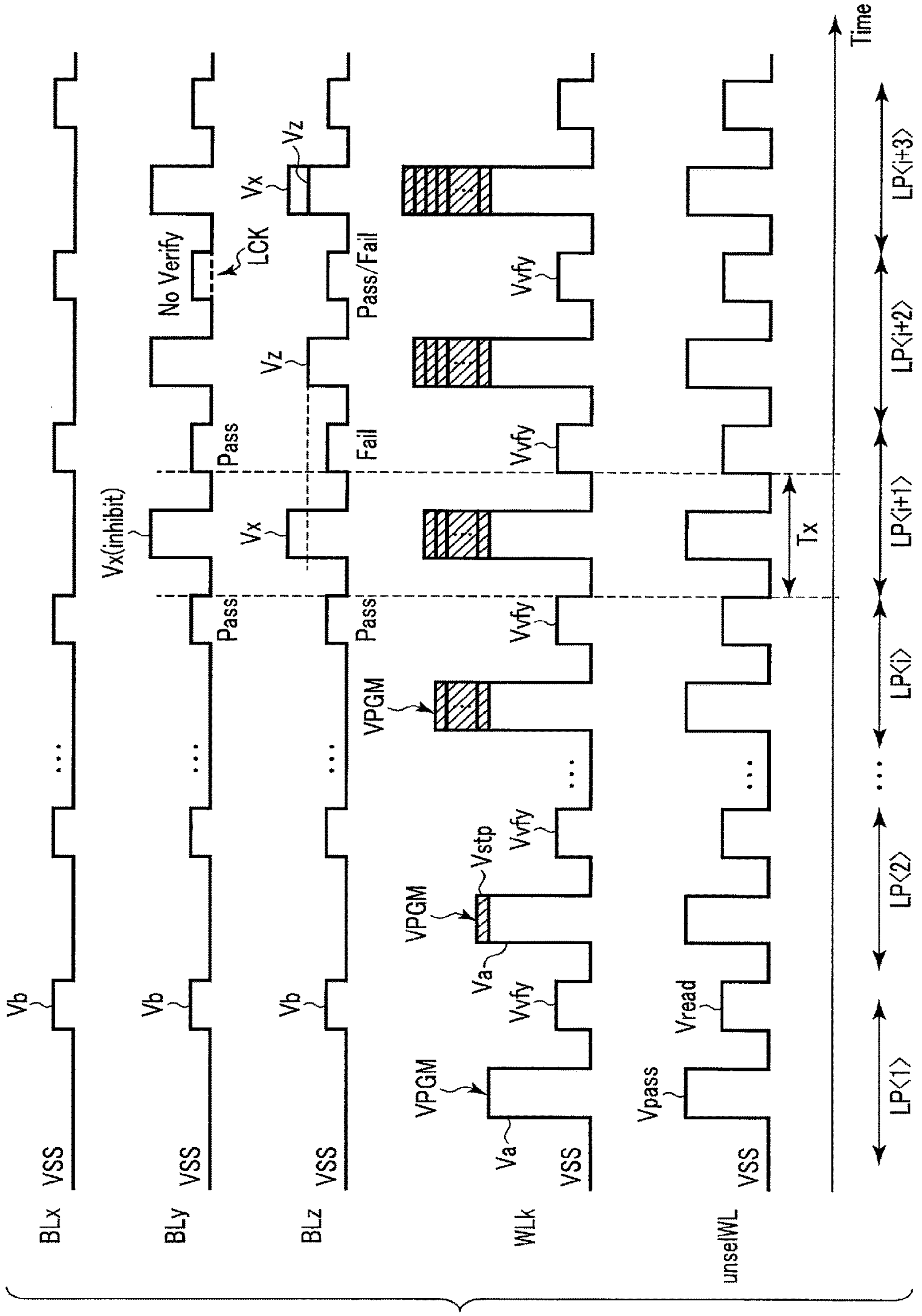
F I G. 12

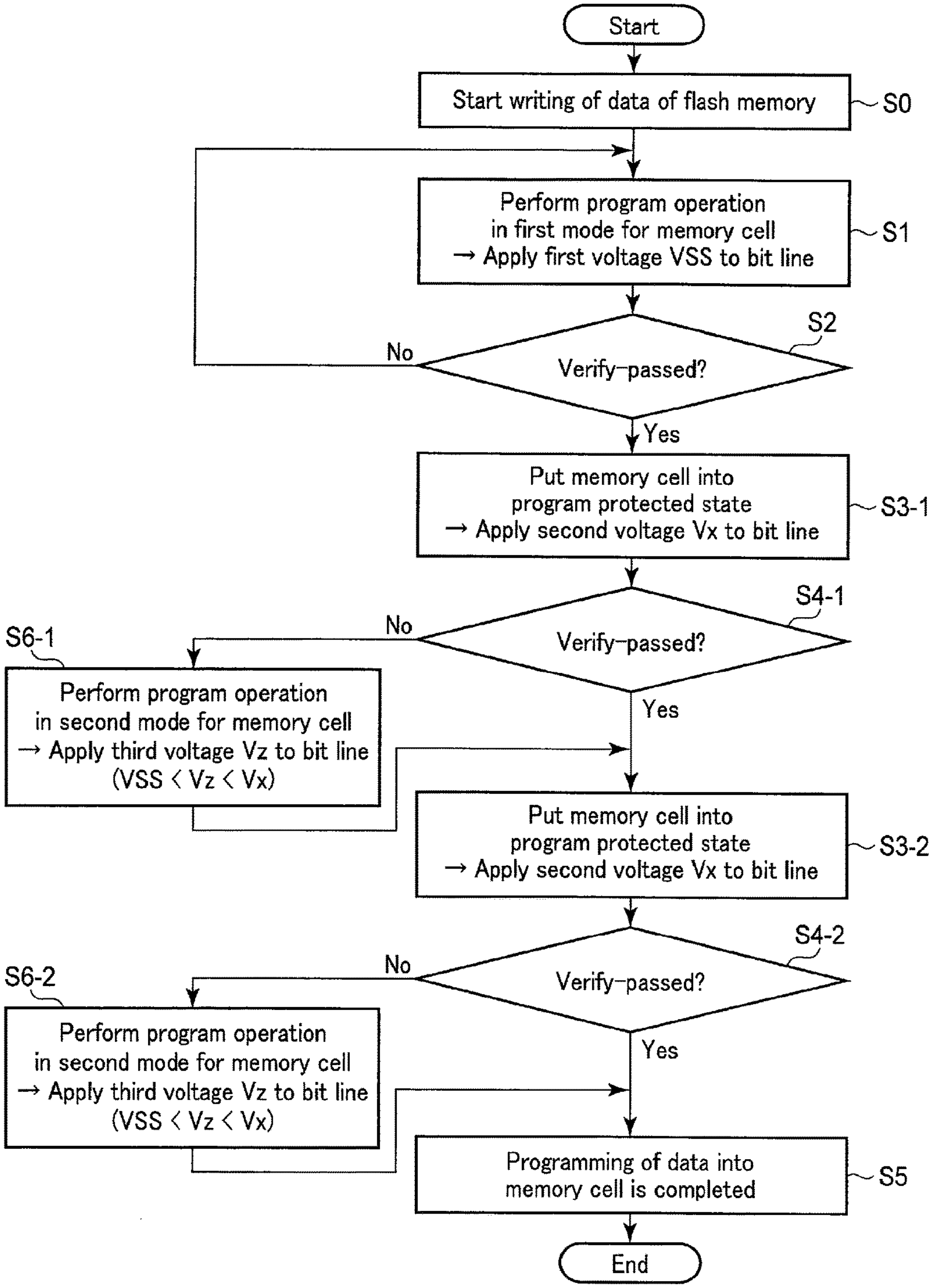
F I G. 13

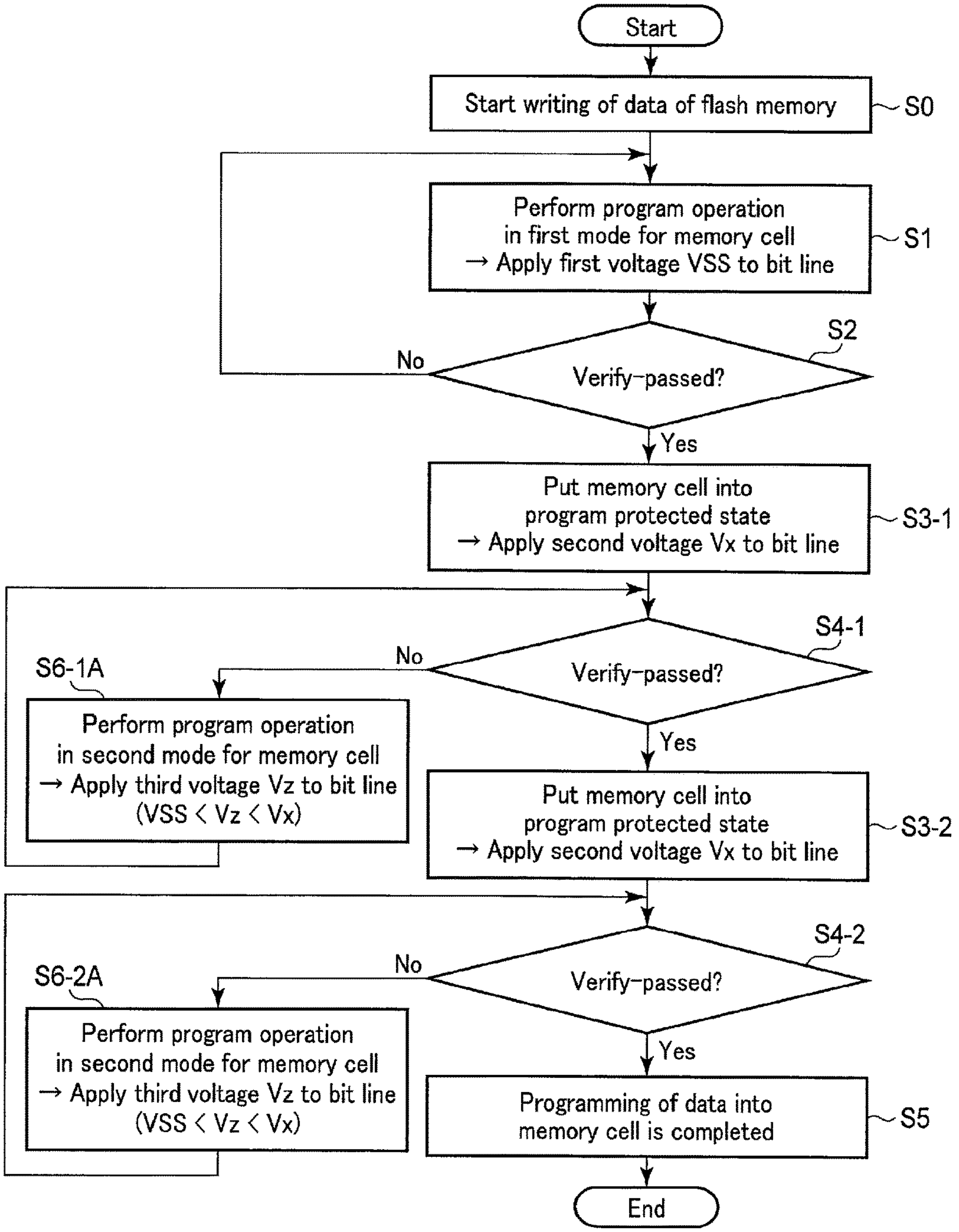
F I G. 15

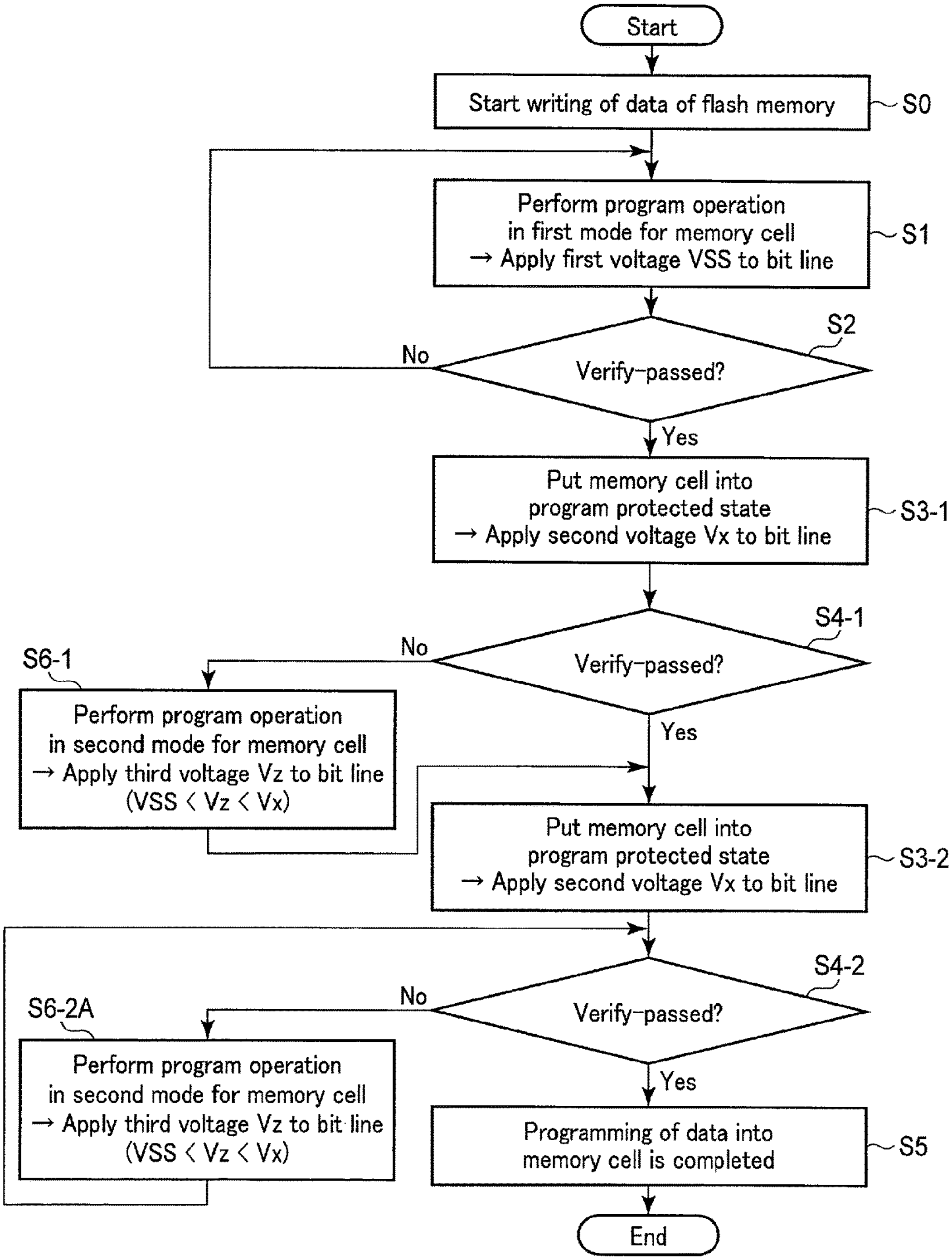
F I G. 18

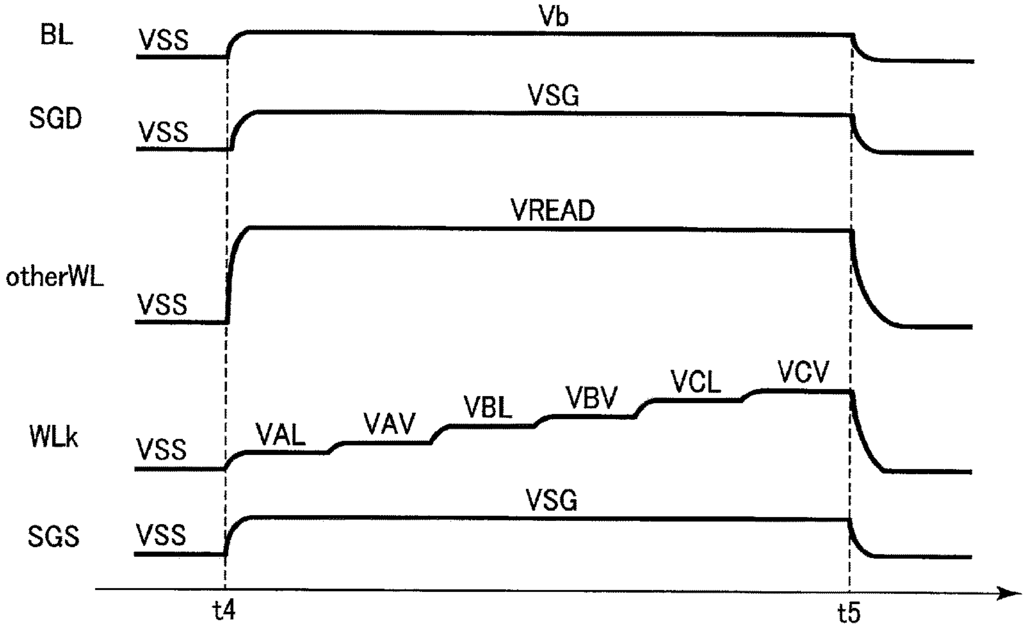
F I G. 19

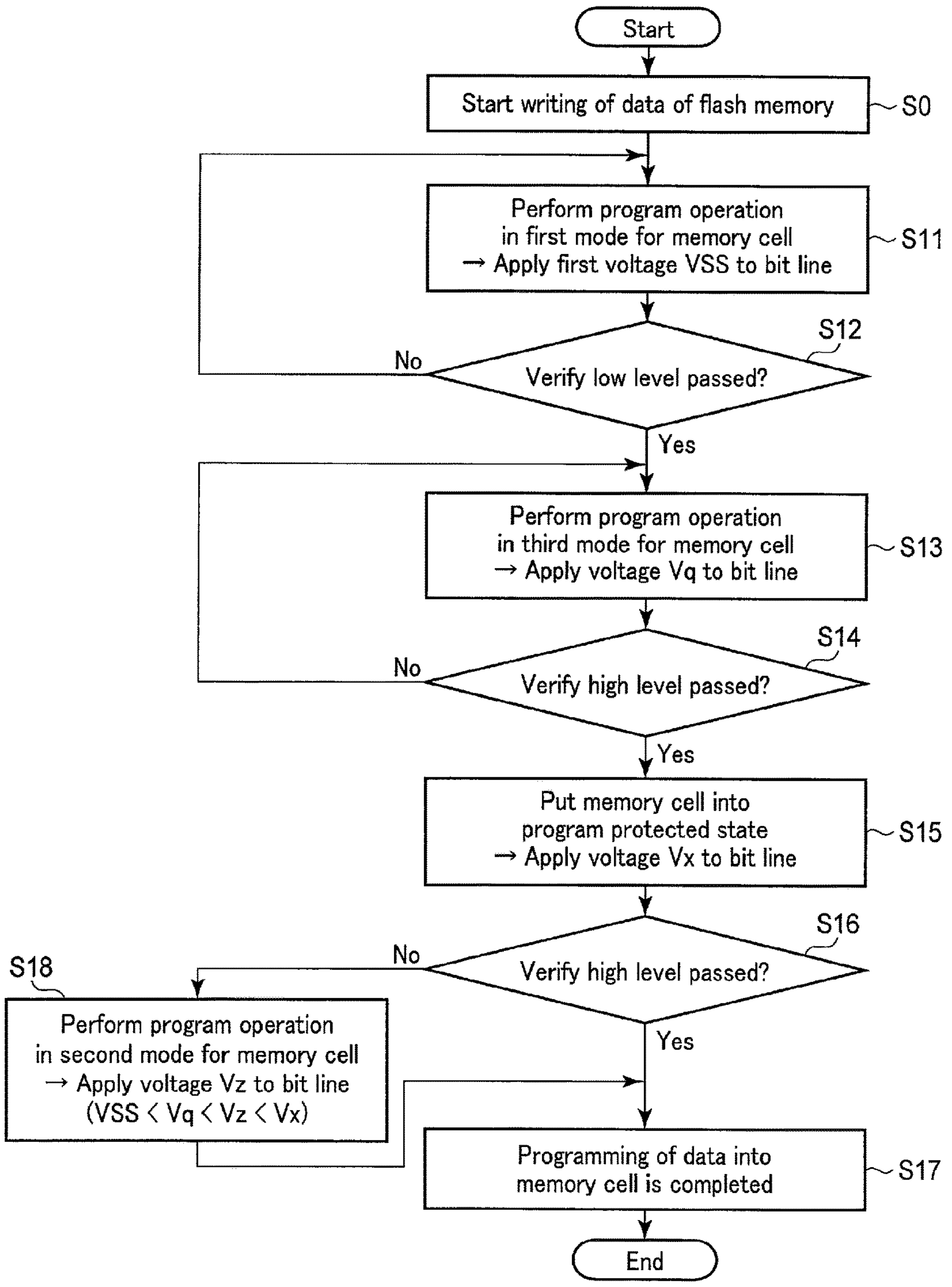
F I G. 20

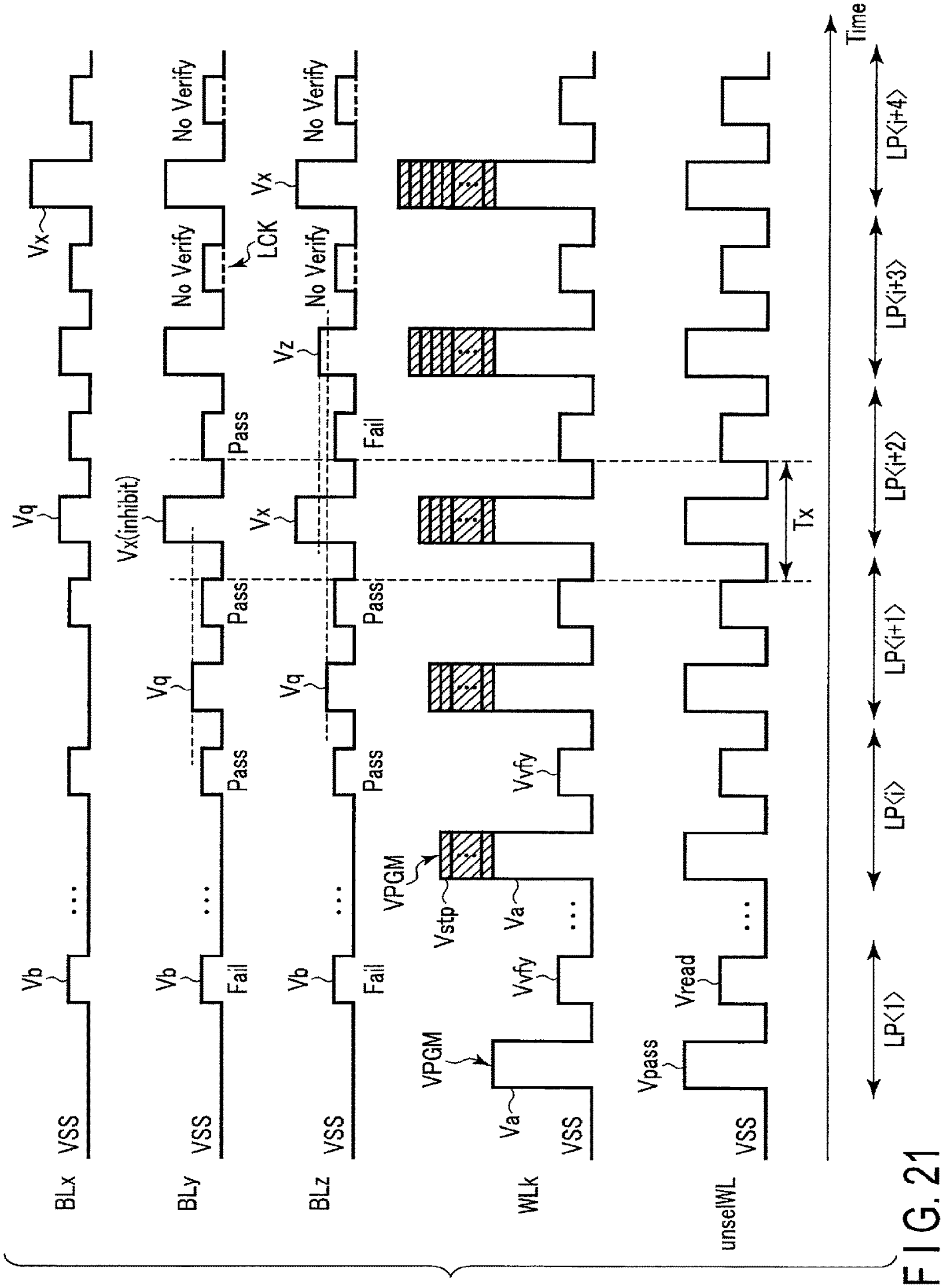
F I G. 21

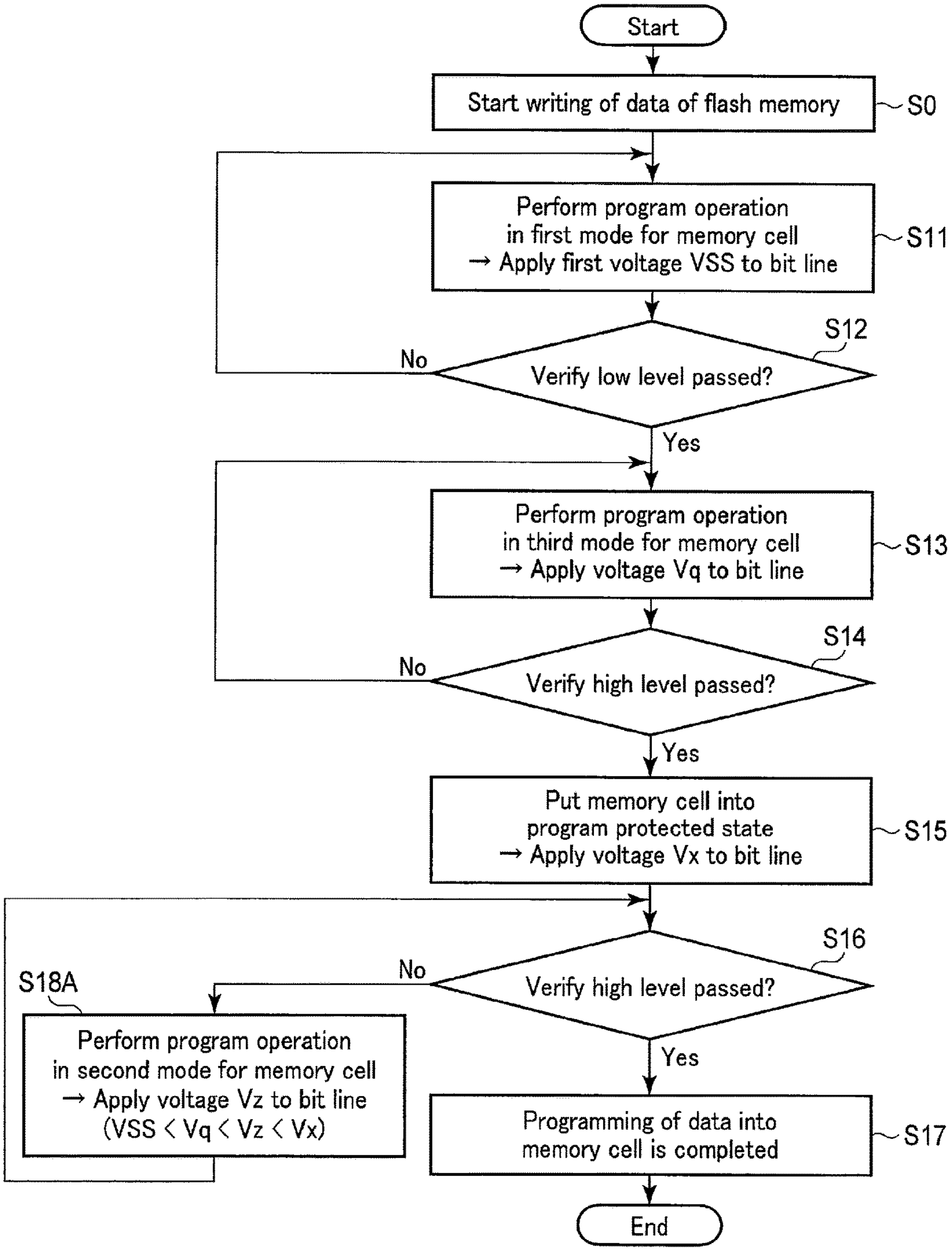
F I G. 22

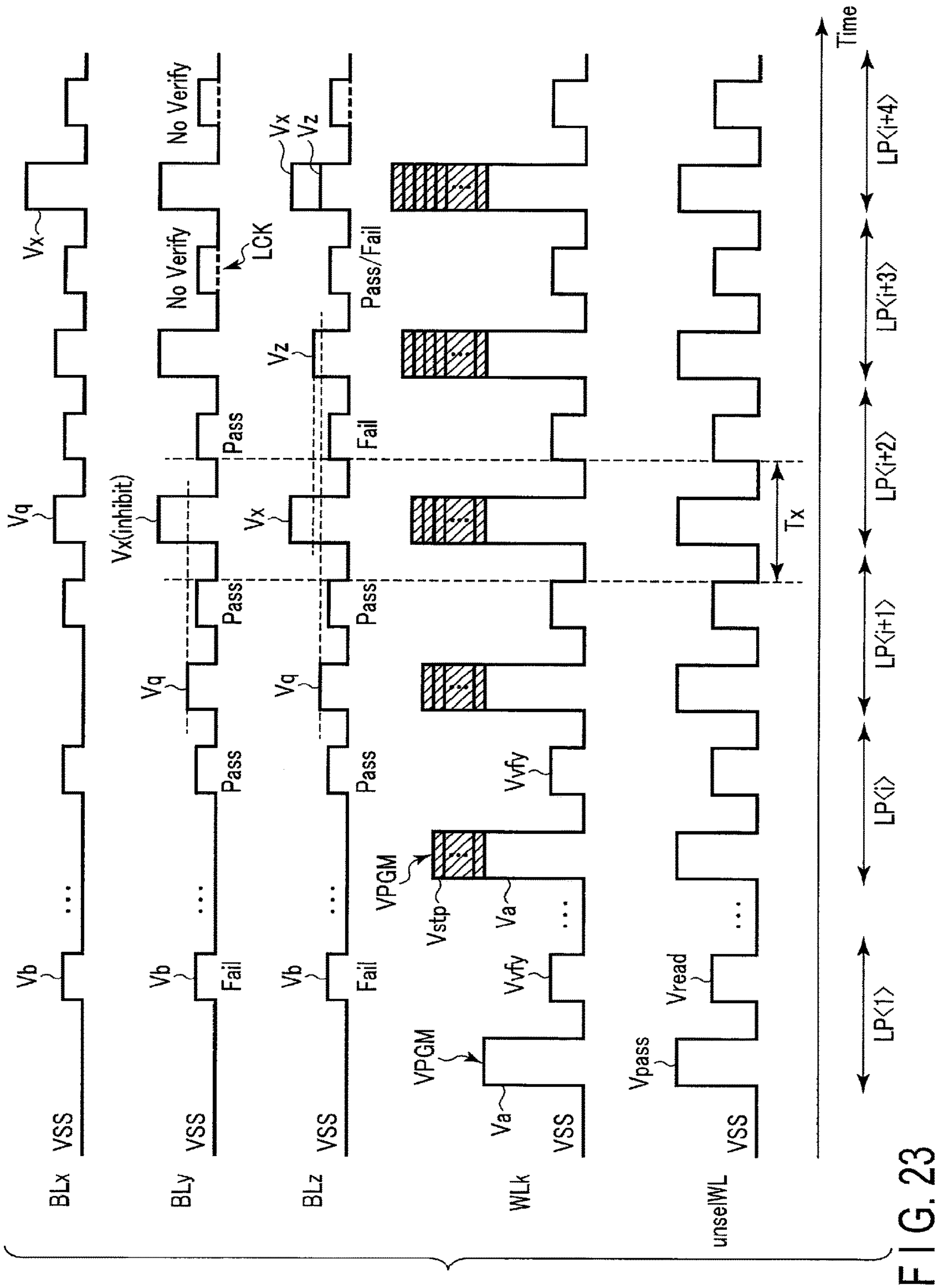
F I G. 23

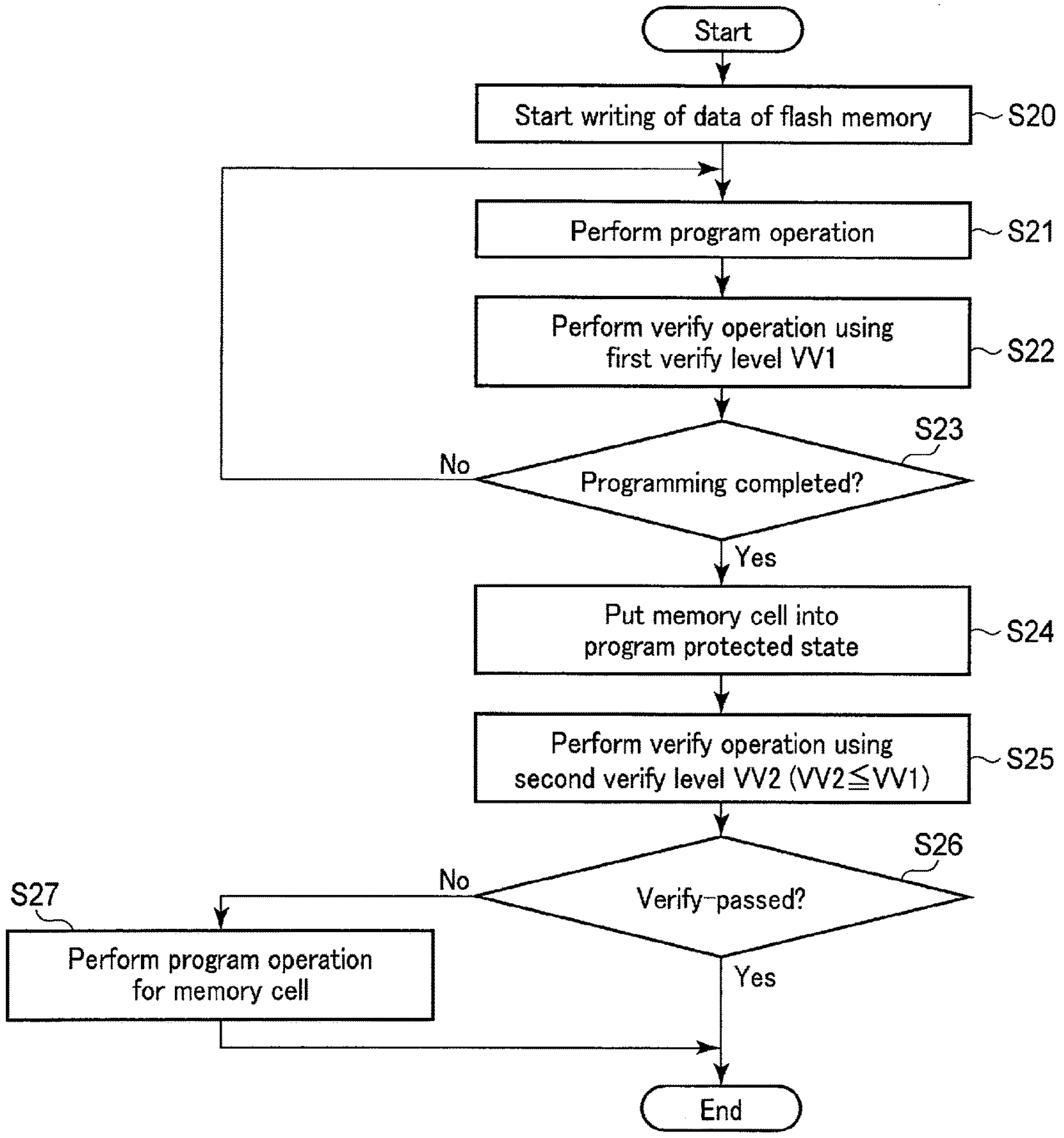
F I G. 24

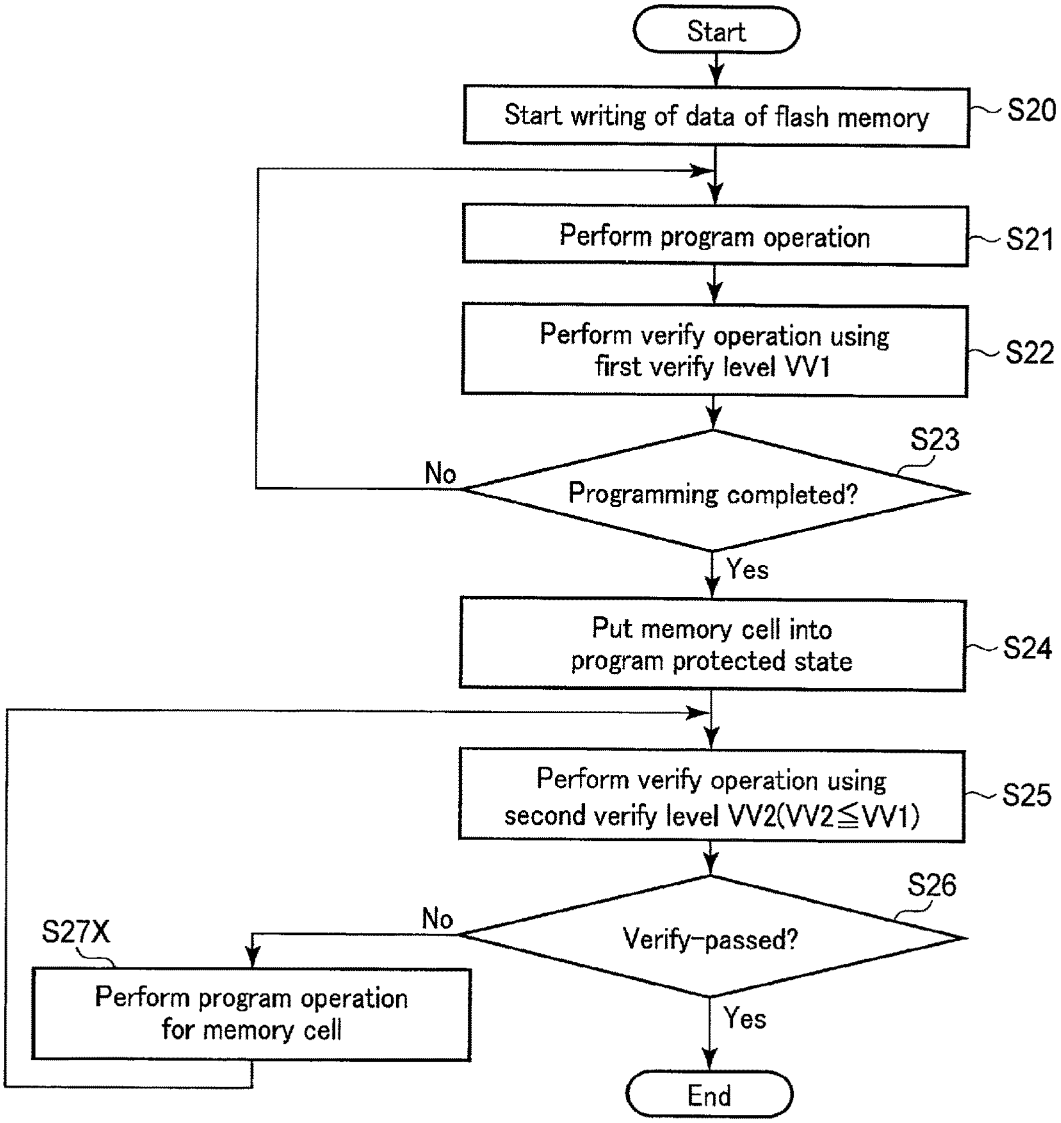
F I G. 25

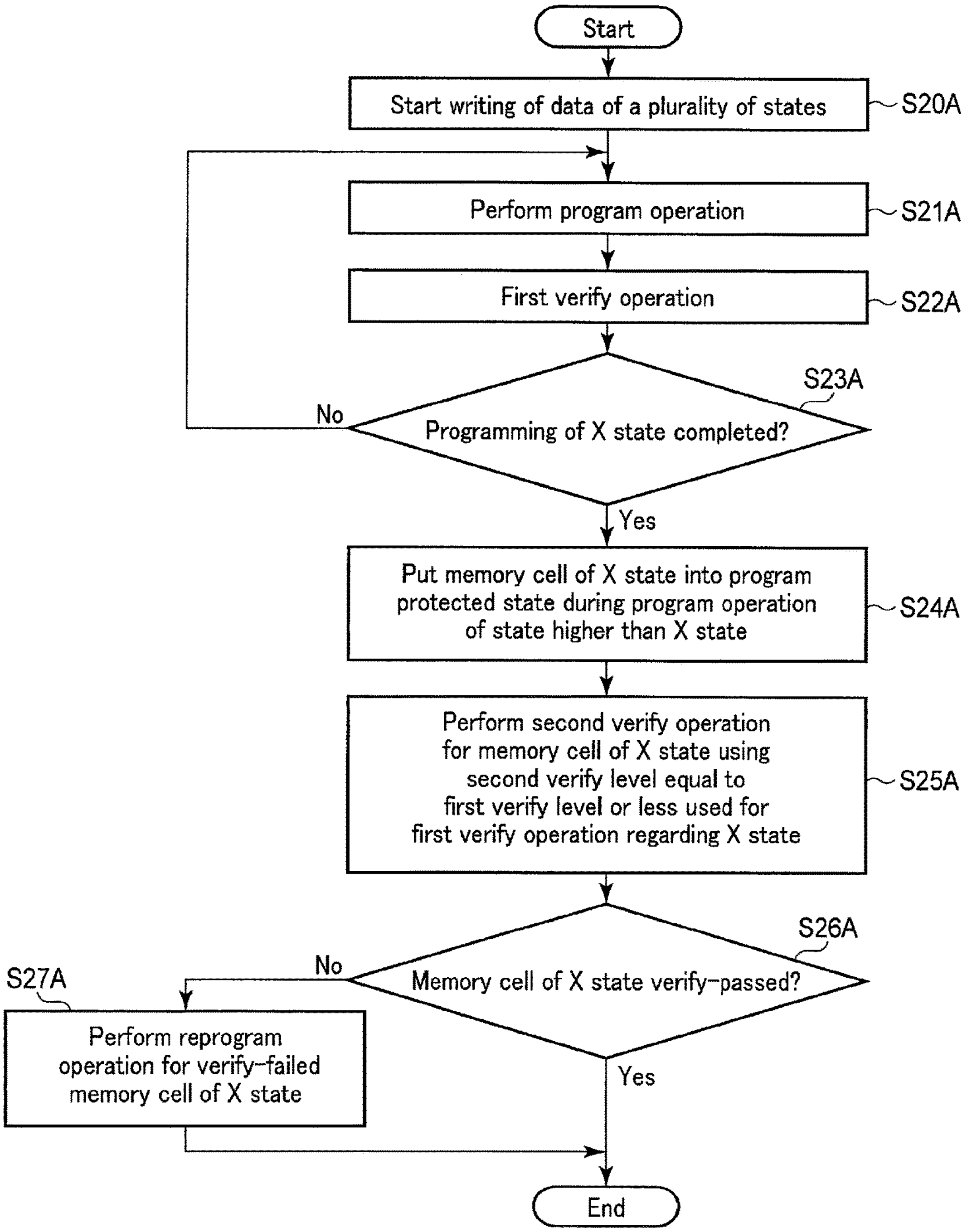
F I G. 26

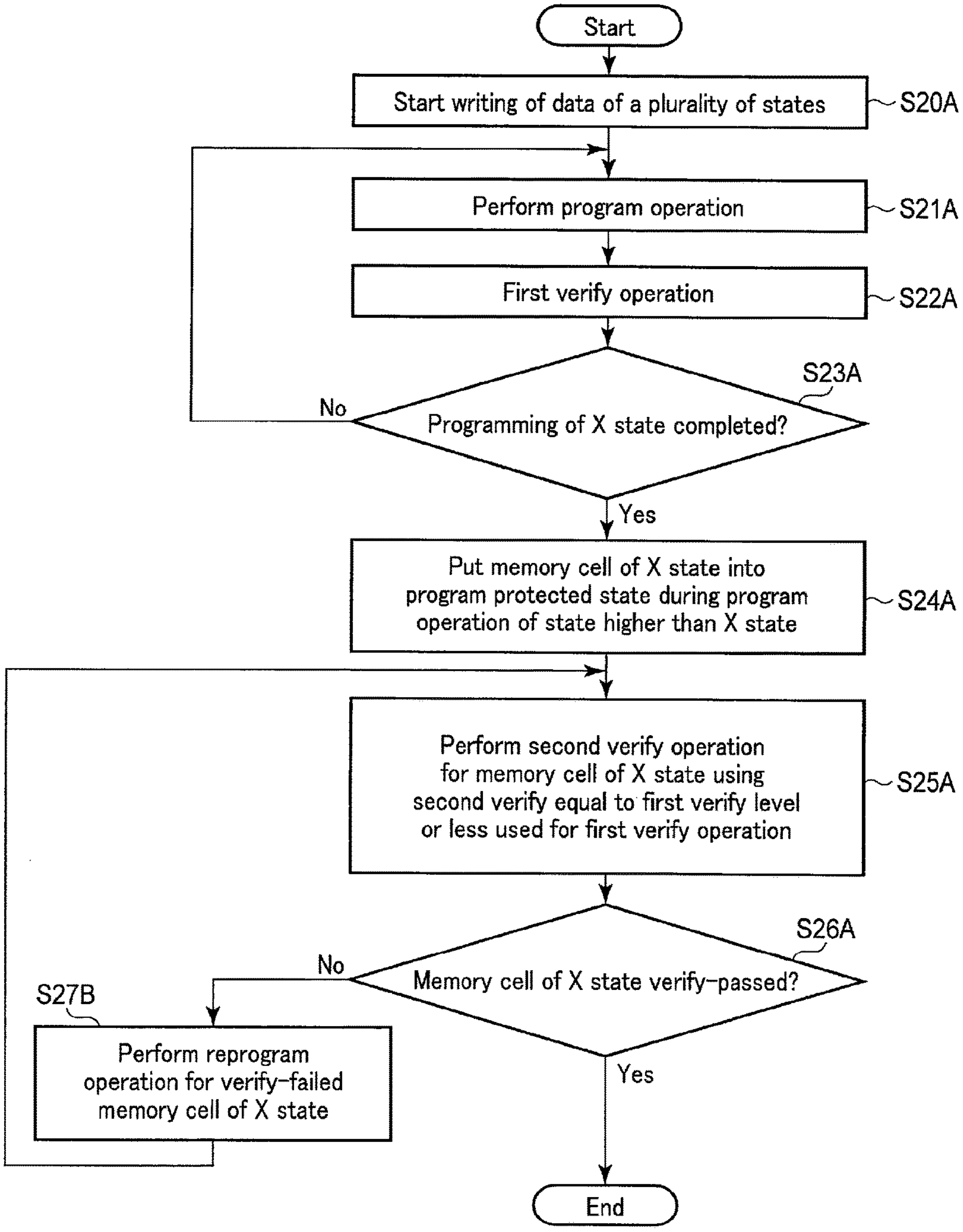
F I G. 28

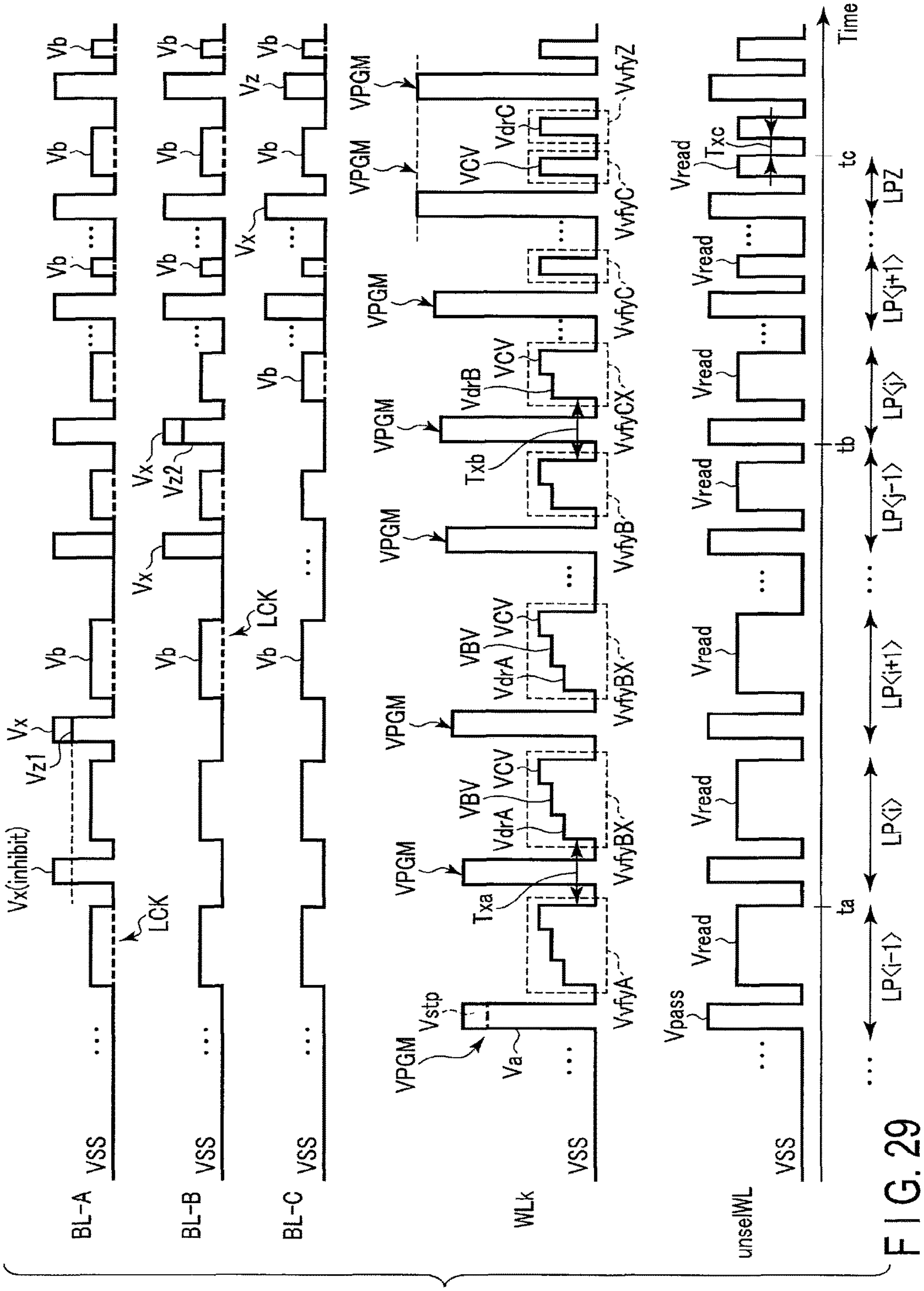
F I G. 29

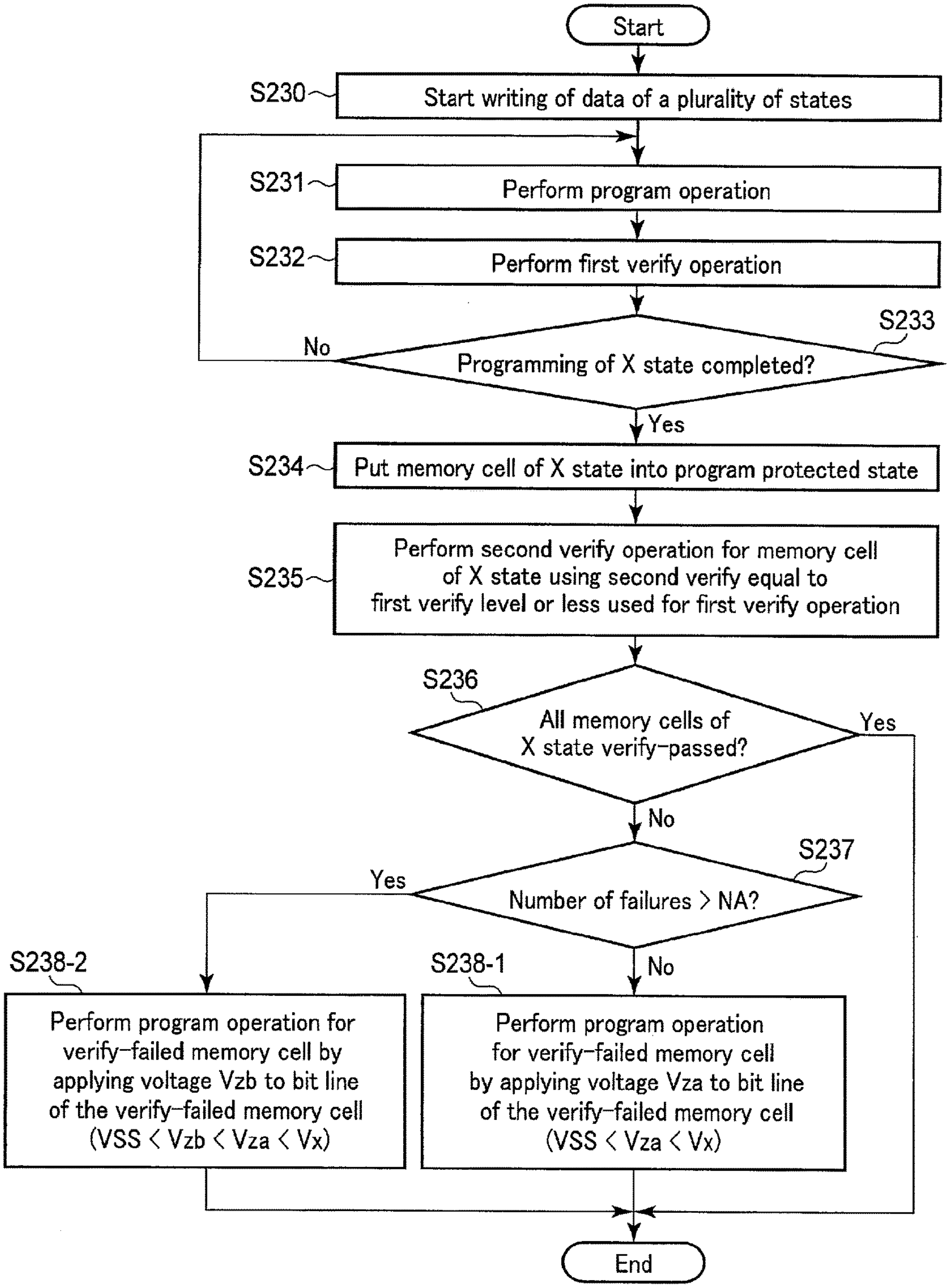
F I G. 32

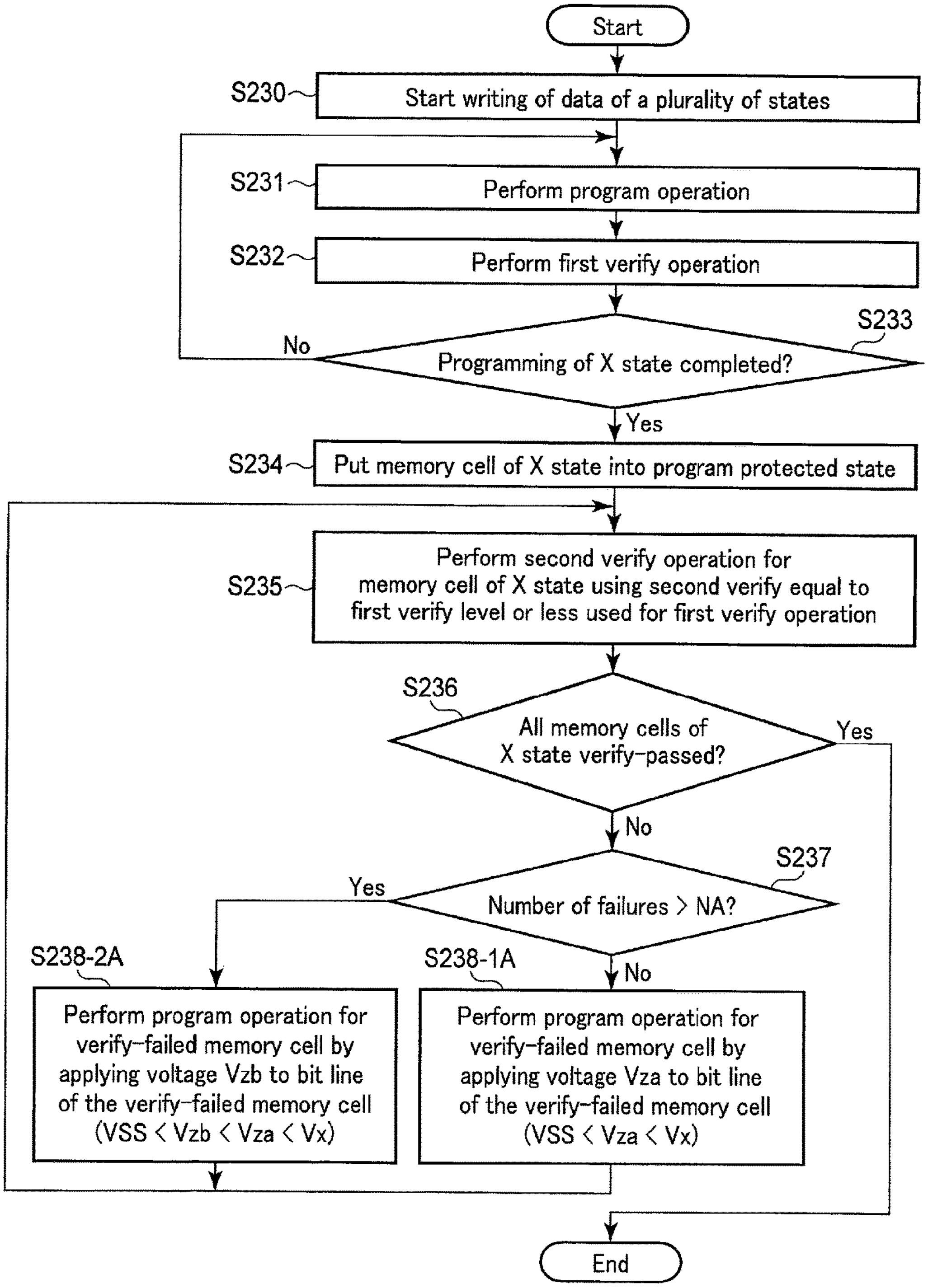
F I G. 33

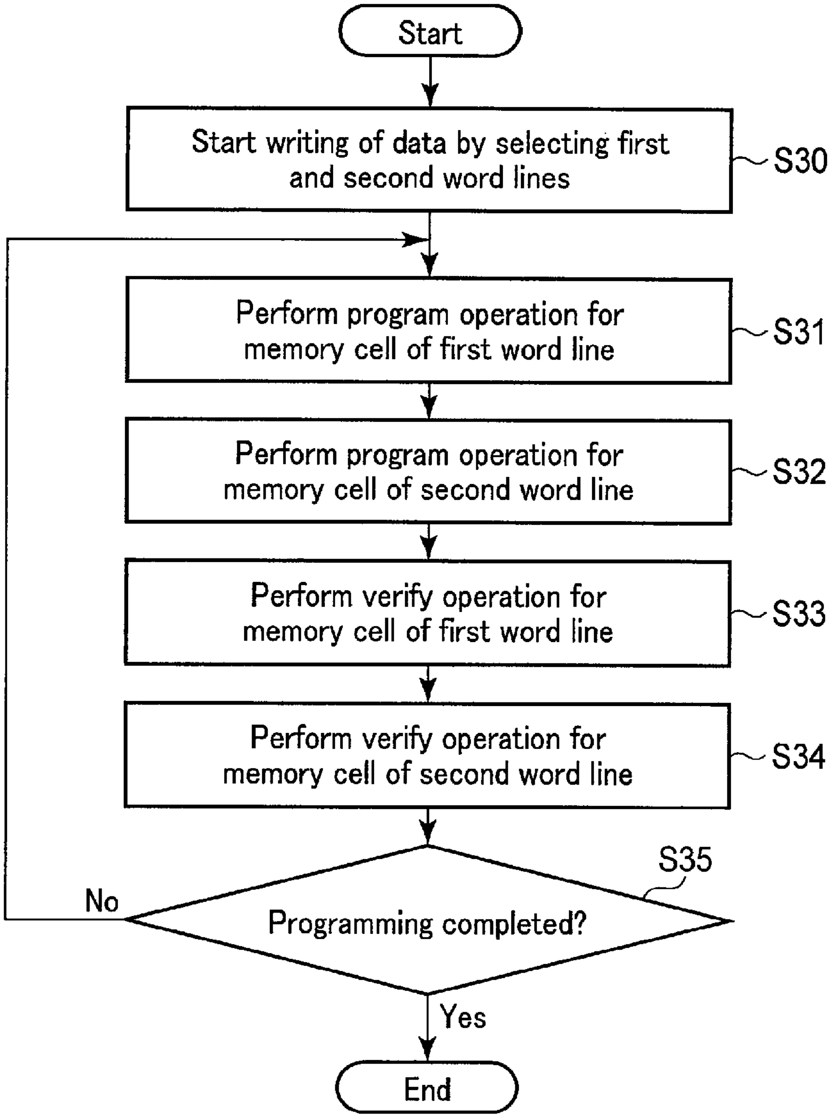
F I G. 34

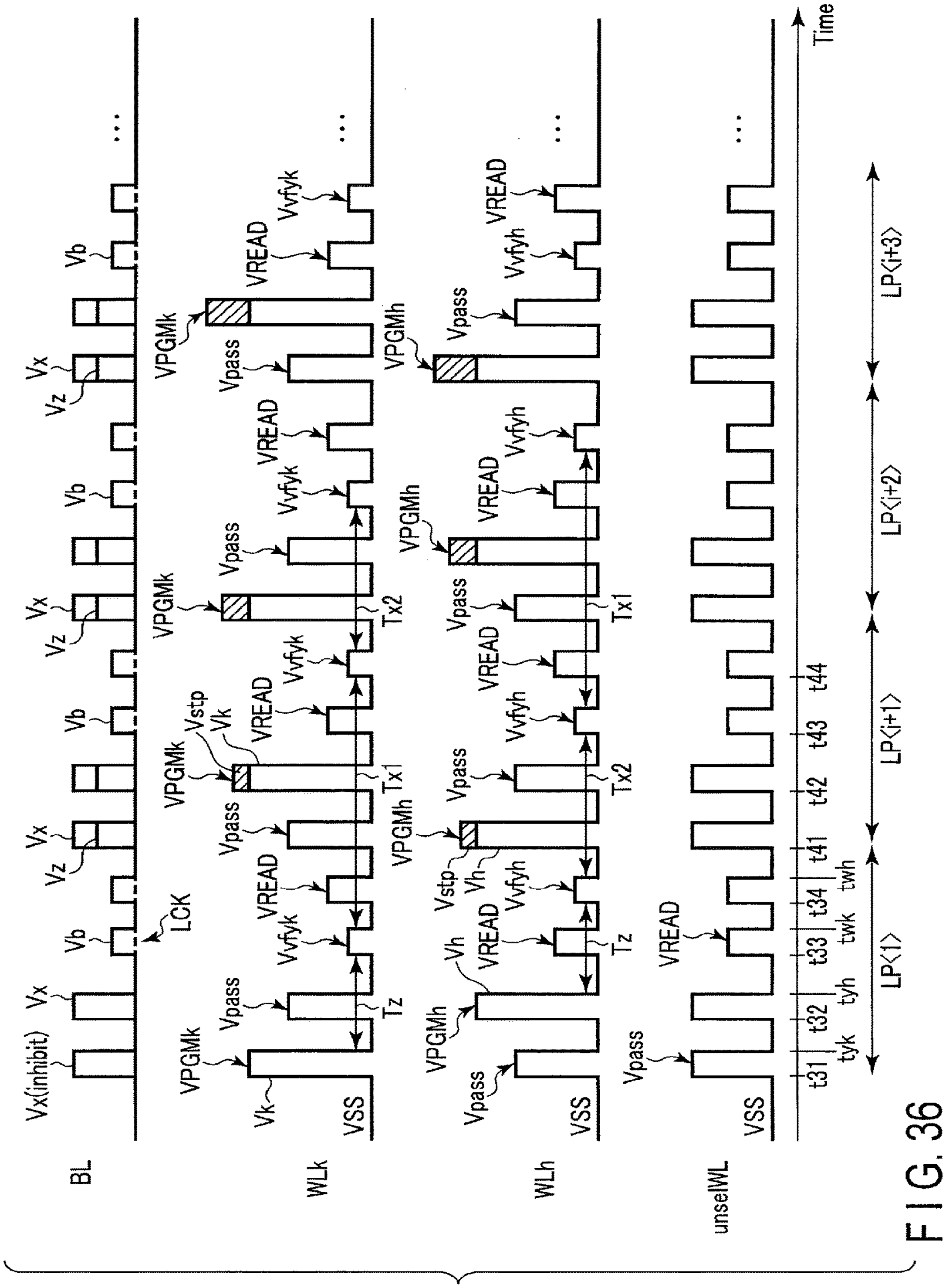
F I G. 36

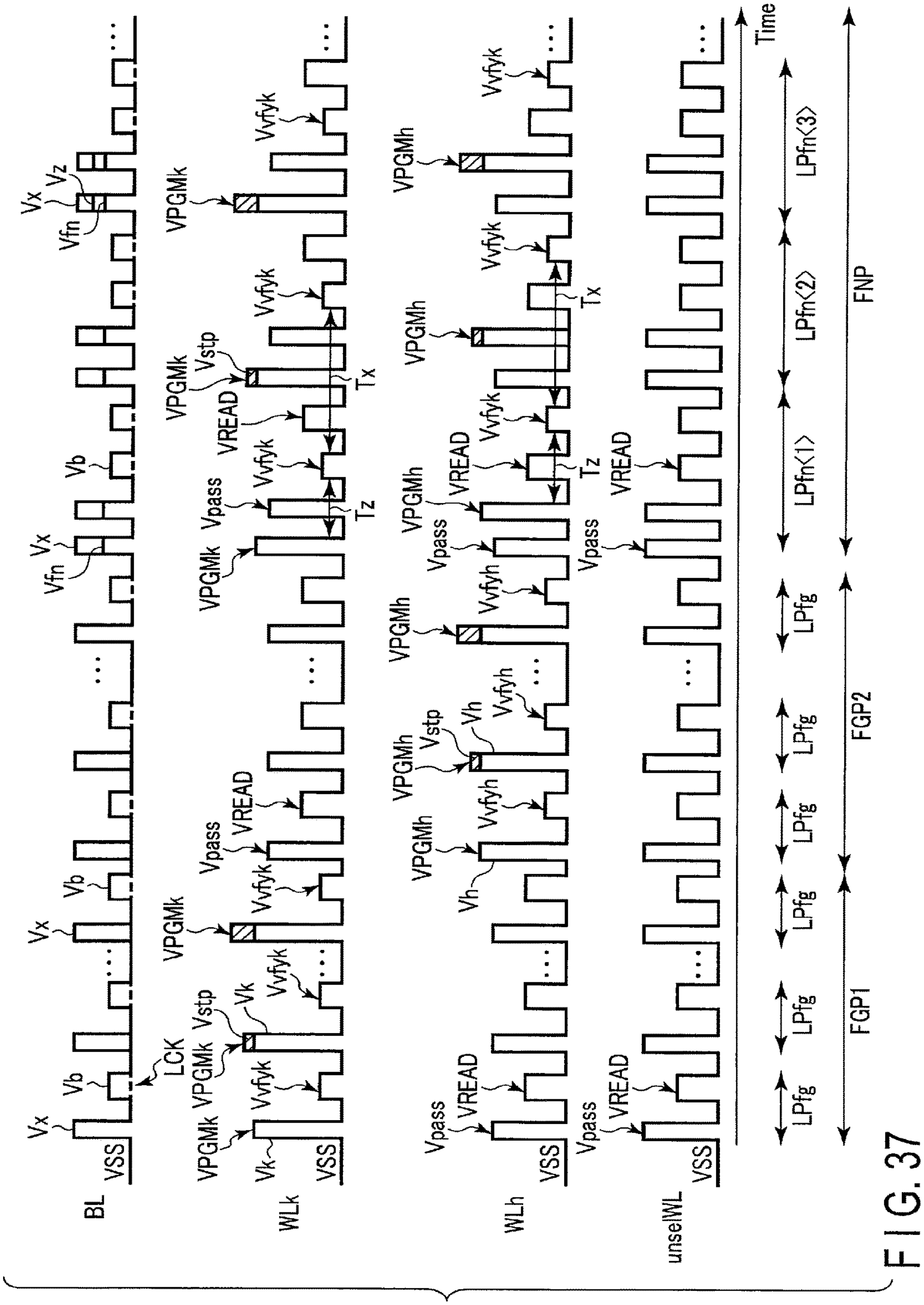
F I G. 37

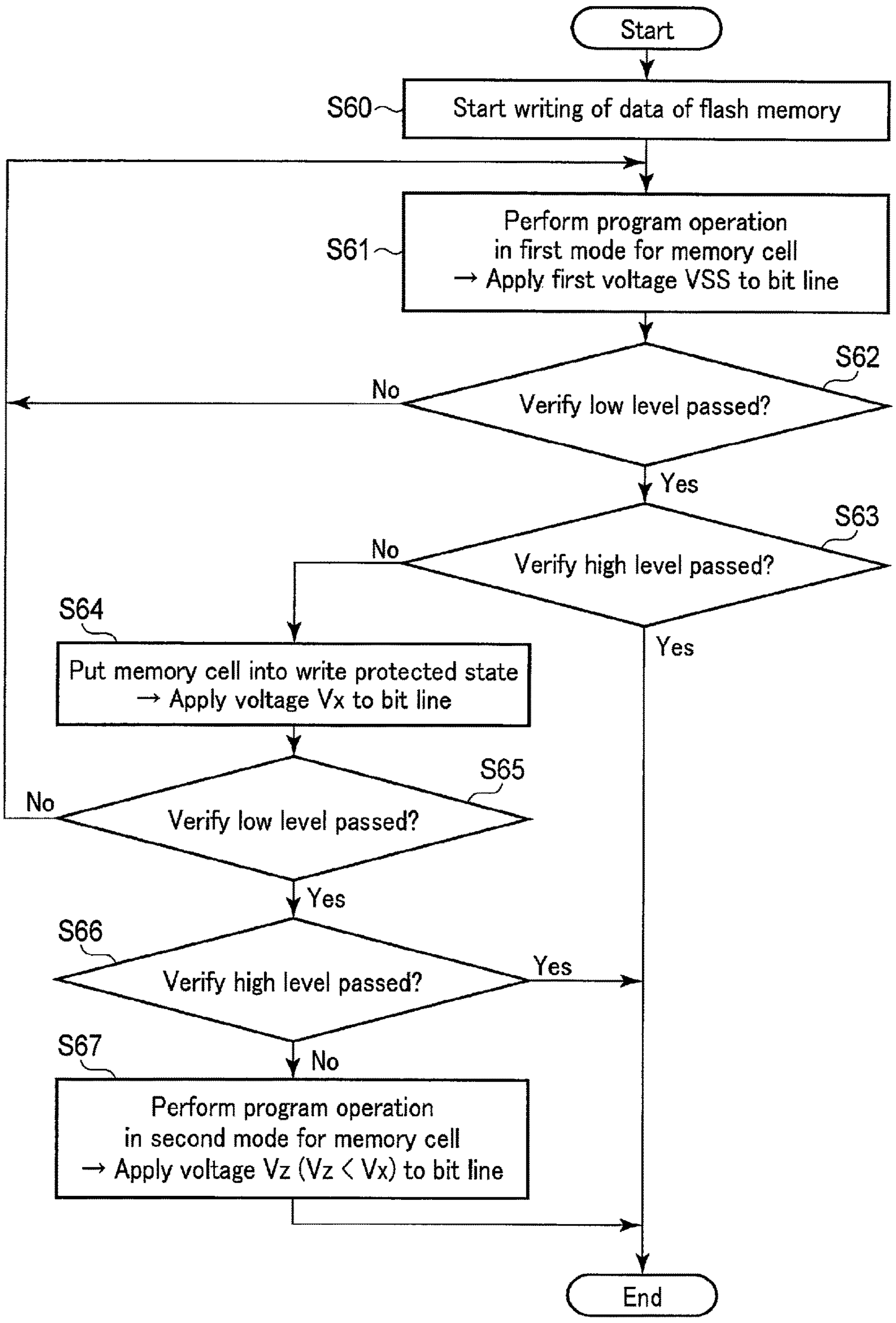
F I G. 41

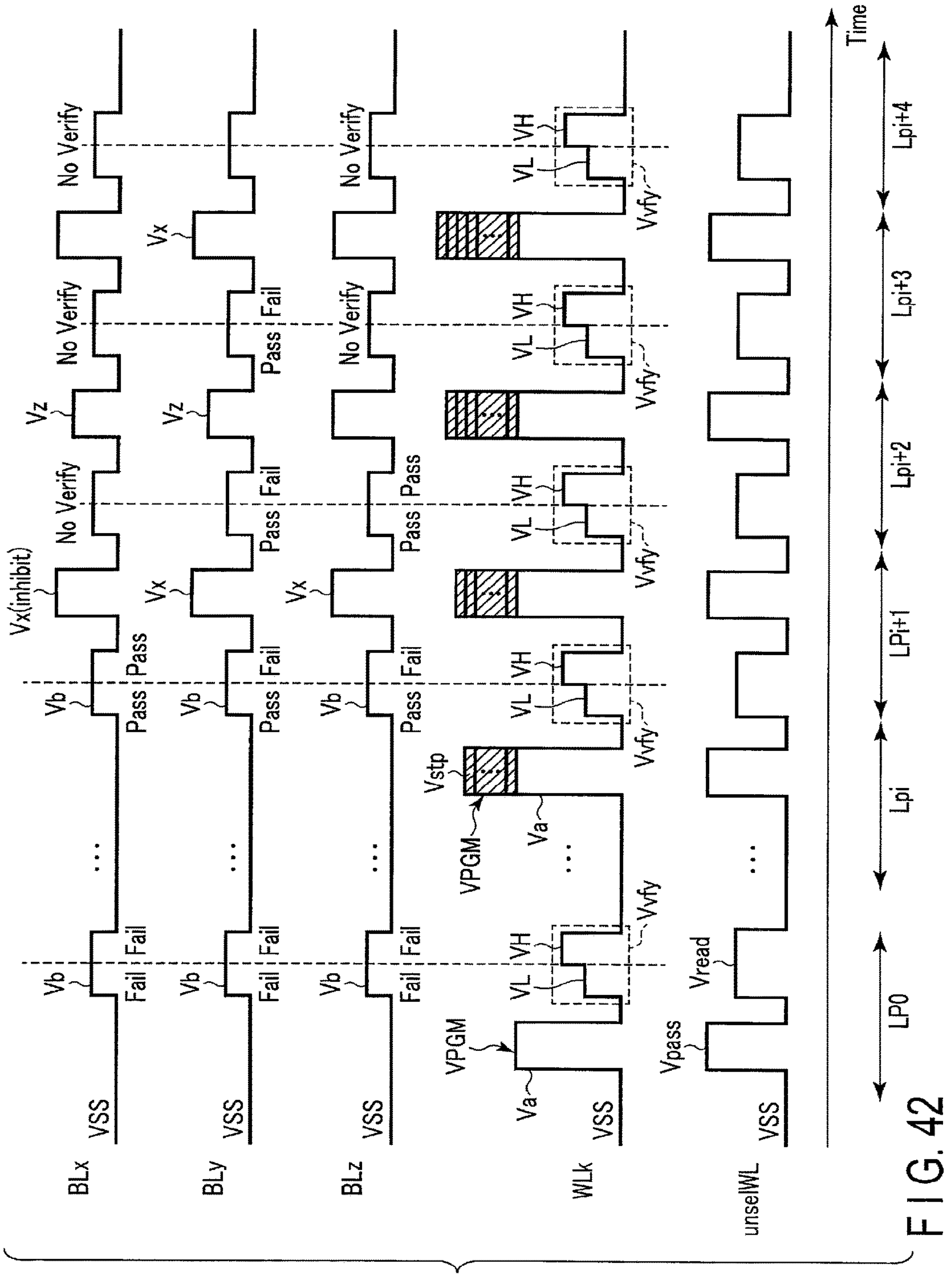
F I G. 42

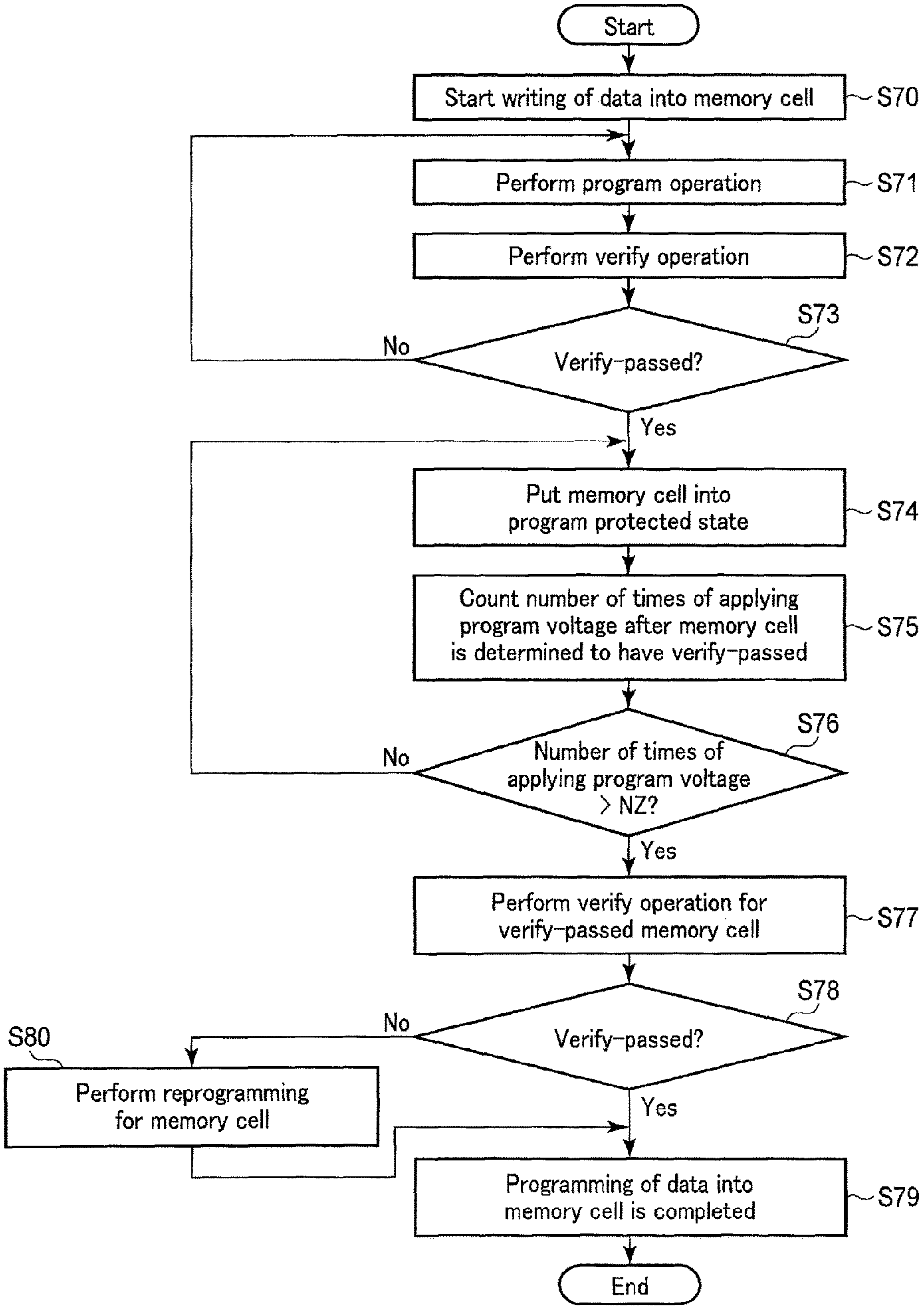
F I G. 43

PROGRAMMING AND VERIFICATION METHODS FOR THREE-DIMENSIONAL MEMORY DEVICE

CROSS-REFERENCE TO RELATED APPLICATIONS

This application is based upon and claims the benefit of priority from Japanese Patent Application No. 2016-173663, filed Sep. 6, 2016, the entire contents of which are incorporated herein by reference.

FIELD

Embodiments described herein relate generally to a memory device.

BACKGROUND

Memory devices such as flash memories are mounted on various electronic devices.

BRIEF DESCRIPTION OF THE DRAWINGS

FIG. 1 is a block diagram showing an overall configuration of a memory system;

FIG. 3 is an equivalent circuit diagram showing an example of the internal configuration of a memory cell array;

FIGS. 4 and 5 are schematic sectional views showing an example of a structure of the memory cell array;

FIG. 6 is a diagram illustrating a relationship between a threshold voltage of a memory cell and data;

FIG. 7 is an equivalent circuit diagram showing a configuration example of a sense amplifier circuit;

FIG. 8 is a flowchart showing an operation example of a memory device according to a first embodiment;

FIG. 11 is a flowchart showing an operation example of the memory device according to the first embodiment;

FIG. 12 is a timing chart showing an operation example of the memory device according to the first embodiment;

FIG. 13 is a flowchart showing an operation example of the memory device according to the first embodiment;

FIG. 15 is a flowchart showing an operation example of the memory device according to the first embodiment;

FIGS. 17 and 18 are flowcharts showing operation examples of the memory device according to the first embodiment;

FIG. 19 is a voltage waveform chart of an operation example of the memory device according to the first embodiment;

FIG. 20 is a flowchart showing an operation example of the memory device according to the first embodiment;

FIG. 21 is a timing chart showing an operation example of the memory device according to the first embodiment;

FIG. 22 is a flowchart showing an operation example of the memory device according to the first embodiment;

FIG. 23 is a timing chart showing an operation example of the memory device according to the first embodiment;

FIGS. 24 and 25 are flowcharts showing operation examples of a memory device according to a second embodiment;

FIG. 26 is a flowchart showing an operation example of the memory device according to the second embodiment;

FIG. 28 is a flowchart showing an operation example of the memory device according to the second embodiment;

FIG. 29 is a timing chart showing an operation example of the memory device according to the second embodiment;

FIGS. 32, 33, and 34 are flowcharts showing operation examples of the memory device according to the second embodiment;

FIGS. 35, 36, 37, 38, 39, and 40 are timing charts showing operation examples of a memory device according to a third embodiment;

FIG. 41 is a flowchart showing a modification of a memory device according to an embodiment;

FIG. 42 is a timing chart showing the modification of the memory device according to an embodiment;

FIG. 43 is a flowchart showing the modification of the memory device according to an embodiment.

DETAILED DESCRIPTION

Figure 2:
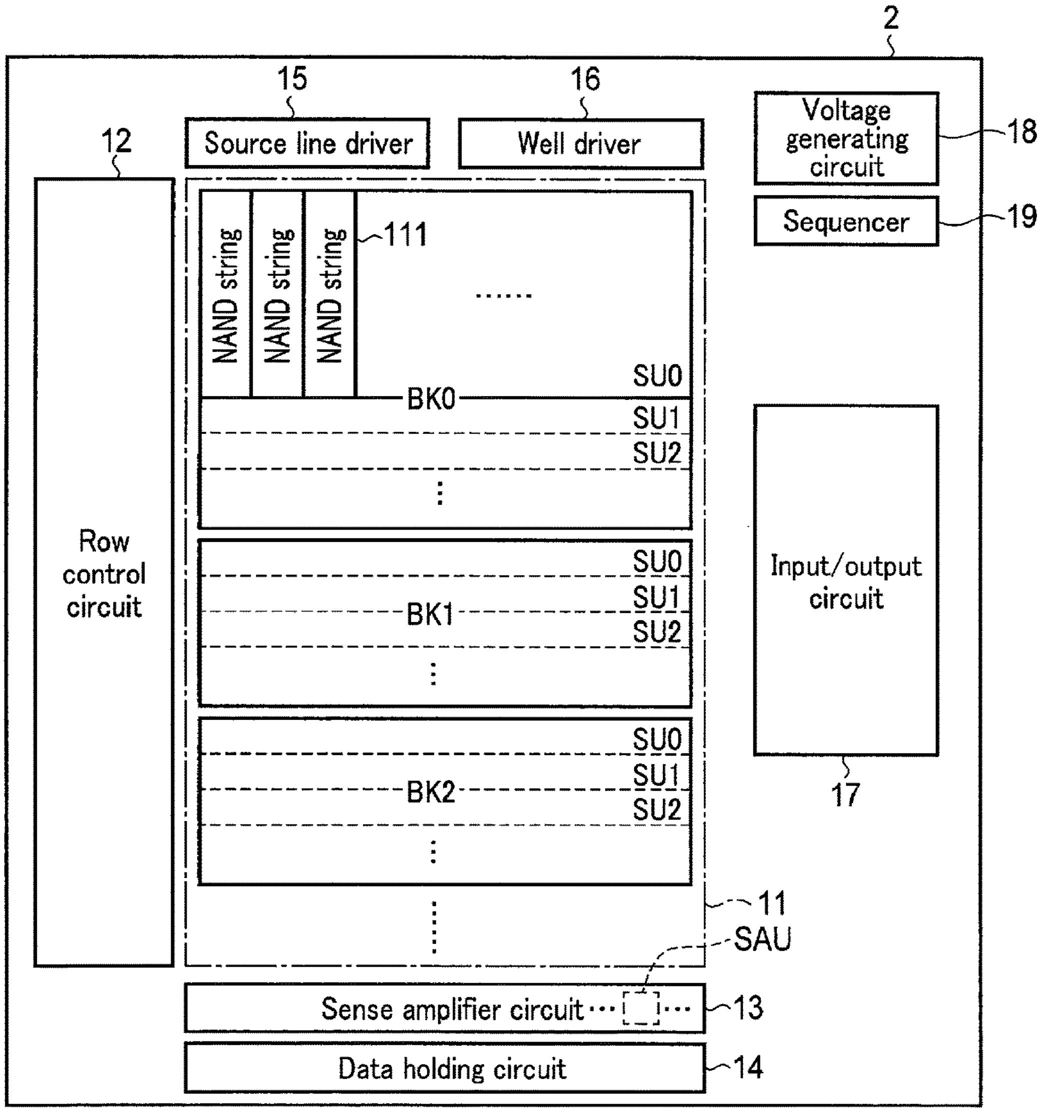
FIG. 2 is a block diagram showing an example of an internal configuration of a flash memory.

Hereinafter, embodiments will be described in detail with reference to the drawings. In the description that follows, elements having the same functions and configurations will be assigned the same reference numerals.

In general, according to one embodiment, a memory device includes a plurality of memory cells; and a first word line connected to the memory cells. When data is written, a first program voltage is applied to the first word line, a first verify voltage is applied to the first word line to obtain a first verify result, a second program voltage is applied to the first word line, a second verify voltage is applied to the first word line to obtain a second verify result, and among the memory cells, a first memory cell whose first verify result is a pass is set to a program inhibited state when the second program voltage is applied and set as a target of the detection of the second verify result.

EMBODIMENTS

(1) First Embodiment

A memory device according to a first embodiment will be described with reference to FIGS. 1 to 23.

(1a) Configuration

A configuration example of a memory device according to an embodiment will be described using FIGS. 1 to 7.

FIG. 1 is a diagram showing a memory system including the memory device according to the present embodiment.

As shown in FIG. 1, a memory system 9 including the memory device according to the present embodiment includes a storage device 500 and a host device 600.

The host device 600 is connected to the storage device 500 by, for example, a connector, a cable, and wireless communication or the Internet. The host device 600 requests the storage device 500 to write data, read data, or erase data.

The storage device 500 includes a memory controller 5 and a memory device (semiconductor memory) 1.

The memory controller 5 causes the memory device 1 to perform an operation in accordance with the request of the host device 600.

The memory controller 5 includes, for example, a processor (CPU), a built-in memory (for example, DRAM), a buffer memory (for example, SRAM), and an ECC circuit. The processor controls an overall operation of the memory controller 5. The built-in memory temporarily holds programs (software/firmware) and management information (management table) of the storage device/memory device. The buffer memory temporarily holds data transmitted/received between the memory device 1 and the host device 600. The ECC circuit detects an error in data read from the memory device 1 and corrects the detected error.

The memory device 1 stores data. The memory device 1 performs writing of data, reading of data, or erasure of data based on instructions from the memory controller 5 (requests of the host device 600).

The memory device 1 is, for example, a NAND flash memory. The storage device 500 (or the memory system 9) including the flash memory 1 is, for example, a memory card (for example, an SD™ card and eMMC™), a USB memory, Solid State Drive (SSD) or the like.

Various signals are transmitted and received between the NAND flash memory 1 and the memory controller 5. As control signals based on the NAND interface standard between the flash memory 1 and the memory controller 5, for example, a chip enable signal CEn, a command latch enable signal CLE, an address latch enable signal ALE, a write enable signal WEn, a read enable signal REn, a write protect signal WPn and the like are used.

The signal CEn is a signal to enable the flash memory 1. The signal CLE and the signal ALE are signals to notify that a signal on I/O lines IO (IO1 to IO8) is a command and an address respectively.

The signal WEn and the signal REn are signals indicating input and output of, for example, a signal via the eight I/O lines IO respectively. The signal WPn is a signal to set the flash memory 1 into a protected state when, for example, power is turned on or off.

A ready/busy signal RBn is generated based on an operating state of the flash memory 1 and transmitted to the memory controller 5. The signal RBn is a signal to notify the memory controller 5 of whether the flash memory 1 is in a ready state (state in which an instruction from the memory controller 5 is received) or a busy state (state in which an instruction from the memory controller 5 is not received). For example, the signal RBn is set to an "L" level (busy state) when the flash memory 1 performs a read operation of data or the like and set to an "H" level (ready state) when such an operation is completed.

FIG. 2 is a block diagram illustrating an internal configuration of the memory device (for example, a NAND flash memory) according to the present embodiment.

As shown in FIG. 2, the NAND flash memory 1 includes a memory cell array 11, a row control circuit 12, a sense amplifier circuit 13, a data holding circuit 14, a source line driver 15, a well driver 16, an input/output circuit 17, a voltage generating circuit 18, and a sequencer 19.

The memory cell array 11 includes a plurality of blocks BK (BK0, BK1, BK2, . . . ). Each block BK includes a plurality of NAND strings (memory cell strings) 111. The NAND string 111 includes a plurality of memory cells. The internal configuration of the memory cell array 11 will be described below.

The row control circuit 12 controls the rows (for example, word lines) of the memory cell array 11.

The sense amplifier circuit 13 senses and amplifies a signal (data) output to a bit line in the memory cell array 11 when data is read. For example, the sense amplifier circuit 13 senses generation of a current in a bit line (or a certain interconnect connected to the bit line) or fluctuations of the potential of the bit line as a signal from a memory cell MC. The sense amplifier circuit 13 thereby reads data held in the memory cell MC. The sense amplifier circuit 13 also controls the potential of the bit line in accordance with data to be written when data is written.

The data holding circuit (for example, a page buffer circuit) 14 temporarily holds data output from the memory cell array 11 or data to be input into the memory cell array 11 (data from the memory controller 5).

The source line driver 15 controls the potential of a source line in the memory cell array 11. The well driver 16 controls the potential of a well area in the memory cell array 11.

The input/output circuit 17 functions as an interface circuit of the above various control signals from the memory controller 5 and signals on the I/O lines IO1 to IO8. The voltage generating circuit 18 generates various voltages used for operation of the memory cell array 11.

The sequencer 19 controls the operation of the flash memory 1 as a whole. The sequencer 19 controls the operation inside the flash memory 1 based on control signals and commands transmitted and received between the memory controller 5 and the flash memory 1.

<Configuration of the Memory Cell Array>

An example of the internal configuration of the memory cell array in the flash memory according to the present embodiment will be described with reference to FIGS. 3 to 5.

FIG. 3 is an equivalent circuit diagram of a block in the memory cell array 11. In the memory cell array 11 of the NAND type flash memory, the block BK is an erase unit of data. However, an erase operation for the memory cell array 11 may also be performed for a unit (storage area) smaller than the block. Regarding an erase operation of the flash memory, the configuration described in U.S. patent application Ser. No. 12/679,991 filed on Mar. 25, 2010, entitled "Nonvolatile Semiconductor Memory Device and Manufacturing Method of the Same" and patent application Ser. No. 12/532,030 filed on Mar. 23, 2009, entitled "Semiconductor Memory and Manufacturing Method of the Same" is referred to and cited in the present embodiment.

In the flash memory 1 according to the present embodiment, for example, the memory cell array 11 has a three-dimensional structure.

In the memory cell array 11 in the three-dimensional structure, like an example shown in FIG. 3, one block BLK includes a plurality (for example, four) of string units SU (SU0, SU1, SU2, . . . ). The plurality of string units SU includes the plurality of NAND strings (memory cell strings) 111.

The NAND string 111 includes a plurality of memory cells (also called memory units or memory elements) MC and a plurality of select transistors ST1, ST2.

The memory cell MC (MC0, MC1, . . . , MC (m−2), MC (m−1)) includes a control gate and a charge storage layer. In the NAND string 111, the plurality of memory cells MC is connected in series between the two select transistors ST1, ST2. One end (one of the source/drain) of the memory cells MC on the drain side of the plurality of memory cells MC connected in series is connected to one end of the select transistor ST1 on the drain side. One end of the memory cells MC on the source side of the plurality of memory cells MC connected in series is connected to one end of the select transistor ST2 on the source side.

A plurality of word lines WL (WL0, WL1, . . . , WL(m−2), WL(m−1)) is connected to the respective gates of the corresponding memory cells MC. "m" is a natural number equal to 2 or greater. For example, one word line WL is connected to the memory cells MC in the plurality of string units SU in common.

Writing of data and reading of data are collectively performed for the memory cells MC connected to one of the word lines WL in one of the string units SU. The unit of writing data and reading data is called a page.

A plurality of select gate lines SGD (SGD0 to SGD3) on the drain side is connected to the respective gates of the select transistors ST1 on the drain side in the corresponding string units SU. A plurality of select gate lines SGS on the source side is connected to the gate of the select transistor ST2 on the source side in each of the string units SU in common.

A source line SL is connected to the other end (the other of the source/drain) of the select transistor ST2 on the source side. The other end of the select transistor ST1 on the drain side is connected to one bit line BL (BL0, BL1, . . . , BL(n−1)) of a plurality of bit lines. "n" is a natural number equal to 1 or greater.

The number of blocks BLK inside the memory cell array 11, the number of string units SU inside one block BLK, and the number of memory cells MC inside the NAND string 111 are arbitrary.

FIGS. 4 and 5 are schematic sectional views showing an example of a cross section structure of the memory cell array in a three-dimensional structure.

FIG. 4 shows a schematic cross section structure of the memory cell array. In FIG. 4, one block is extracted and illustrated.

In the block BK (memory cell array), the NAND string 111 is provided in a p-type well area 20 inside a semiconductor area (for example, an Si substrate) 900.

The p-type well area 20 is connected to the well driver 16 via a well contact 38. For example, four string units SU are provided in the one p-type well area 20. For example, the string unit SU in the block BK is provided in an area surrounded by the well contact 38. The well contact 38 is provided on a $p^+$-type diffusion layer 34 in the p-type well area 20.

A source line contact 36 is provided on an $n^+$-type diffusion layer 33 in the p-type well area 20 between the string units SU. The source line contact 36 is connected to the source line SL.

The NAND string 111 is provided in the p-type well area 20. The NAND string 111 includes a semiconductor pillar 31. The semiconductor pillar 31 is connected to the p-type well area 20. The semiconductor pillar 31 extends in a direction (D3 direction) approximately perpendicular to the surface of the p-type well area 20 (substrate 900). The semiconductor pillar 31 is arranged like an array in the p-type well area 20 along a D1 direction and a D2 direction. The semiconductor pillar 31 functions as a current path of the NAND string 111. The semiconductor pillar 31 is an area where channels of the memory cell MC and the transistor ST are formed when the memory cell MC and the select transistors ST1, ST2 operate.

A plurality of conductive layers 23, 25, 27 is stacked on the p-type well area 20. An interlayer dielectric (not shown) is provided between the plurality of conductive layers 23, 25, 27. Each of the conductive layers 23, 25, 27 is provided on a side surface of the semiconductor pillar 31 via a memory film.

FIG. 5 is a schematic sectional view illustrating the configuration of elements inside the memory cell array. In FIG. 5, one string unit SU is extracted and illustrated. In FIG. 5, members positioned on the depth side (or the forward side) in a direction perpendicular to the paper surface are indicated by a dotted line.

The select transistor ST1 is arranged in an area including the semiconductor pillar 31 and the conductive layer 27. A plurality (four in the present example) of stacked conductive layers 27 becomes a gate electrode of the select transistor ST1. The stacked conductive layers 27 are connected to the same select gate line SGD on the drain side. For example, the conductive layers 27 are connected to each other between the NAND strings 111 arranged in the D1 direction. Incidentally, the conductive layers 27 may be separated from each other between the NAND strings 111 arranged in the D1 direction in accordance with the internal configuration of the string unit SU and the connection relation between the NAND string 111 and the bit line.

The select transistor ST2 is arranged in an area including the semiconductor pillar 31 and the conductive layer 23. A plurality (four in the present example) of stacked conductive layers 23 becomes a gate electrode of the select transistor ST2. The stacked conductive layers 23 are connected to the select gate line SGS on the source side. For example, the conductive layers 23 in the same string unit SU are connected mutually in common.

The memory cell MC is arranged in an area including the semiconductor pillar 31 and the conductive layer 25. The conductive layers 25 become a control gate electrode of the memory cell MC. Each of the conductive layers 25 is connected to the word line WL.

A memory film 29 is provided between the side surface of the semiconductor pillar 31 and the conductive layers 23, 25, 27. In the memory film 29, a gate insulating film 291, a charge storage layer (insulating film) 292, and a block insulating film 293 are successively provided from the side of the semiconductor pillar 31. The memory film 29 is continuous between a plurality of memory cells adjacent to each other in the D3 direction.

A conductive layer 32 is provided above the upper end of the semiconductor pillar 31. The conductive layer 32 functions as a bit line BL. The bit line BL is electrically connected to the semiconductor pillar 31 via a plug BC. The conductive layer 32 extends in the D1 direction. For example, the two NAND strings 111 adjacent to each other in the D1 direction are connected to mutually different bit lines BL. In that case, the bit line contact BC is not arranged on the same straight line parallel to the D1 direction in a D1-D2 plane. In a plurality of the NAND strings 111 arranged in the D1 direction, the positions of the bit line contacts BC are shifted to each other in the D2 direction. The plurality of NAND strings (NAND strings indicated by a solid line and NAND strings indicated by a broken line) 111 arranged in a slanting direction is connected to mutually different bit lines BL.

In each of the NAND strings 111, as described above, the select transistor ST2, a plurality of memory cells MC, and the select transistor ST1 are successively stacked in the well area 20. Incidentally, in a flash memory according to the present embodiment, the structure of a memory cell array may be a two-dimensional structure (planar structure) in which a plurality of memory cells is two-dimensionally (D1-D2 plane) arranged on a semiconductor substrate.

A threshold voltage of the memory cell MC is changed by charges being injected into the memory film 29 (charge storage layer 292) of the memory cell MC. Data is written into the memory cell by using changes of the threshold voltage of the memory cell MC. For example, the memory cell MC can store data of one bit or more.

<Relationship Between the Threshold Voltage of the Memory Cell and Data>

FIG. 6 is a diagram illustrating a relationship between the threshold voltage of the memory cell and data.

When, as shown in FIG. 6, the memory cell MC stores 2-bit data, the threshold voltage of a plurality of memory cells MC in a memory cell array (block, page) can take four threshold distributions (states/levels) TD-Er, TD-A, TD-B, TD-C so as to correspond to the 2-bit (4-valued) data.

When data is stored, the threshold voltage of the memory cell MC belongs to one of the threshold distributions TD-A, TD-B, TD-C of an A state, a B state, and a C state respectively. An Er state corresponds to an erase state. The A state, the B state, and the C state correspond to a write state. The memory cell MC thereby stores 2-bit data.

A determination level (determination voltage) is set to between threshold distributions. When data is read from the memory cell MC, data stored in the memory cell MC is thereby discriminated. When, for example, 2-bit data is stored by the memory cell, levels VA, VB, VC are used as determination levels for reading data (hereinafter, called read levels).

A determination level for verification (hereinafter, called a verify level) is set to the neighborhood of a lower-limit voltage value of each threshold distribution. Accordingly, when data is written into the memory cell MC, whether the memory cell MC has reached the threshold distribution corresponding to data to be written into the memory cell MC is determined. Levels VAV, VBV, VCV as verify levels are set to the threshold distributions TD-A, TD-B, TD-C respectively. Incidentally, as verify levels, levels VAL, VBL, VCL may be provided between the read level and the verify level for each level. Hereinafter, for the sake of distinguishing the description, the levels VAV, VBV, VCV will be called verify high levels and the levels VAL, VBL, VCL will be called verify low levels.

In the above read operation and verify operation, the determination level is applied to the gate (word line) of the memory cell MC and whether the memory cell MC is turned on is thereby detected. Accordingly, data stored in the memory cell or the threshold voltage state of the memory cell into which data is being written is discriminated.

A read pass voltage VREAD has a voltage value higher than the upper limit of, among a plurality of threshold distributions, the highest threshold distribution. The memory cell MC to which the read pass voltage VREAD is turned on regardless of stored data.

However, data to be written into the memory cell MC is not limited to 2-bit data and 1-bit data may also be written into one memory cell MC. Also, 3-bit data or more may be written into one memory cell MC.

Regarding the structure, operation, and manufacturing method of a memory cell array in a three-dimensional structure, for example, the configuration described in U.S. patent application Ser. No. 12/407,403 filed on Mar. 19, 2009, entitled "Three-Dimensionally Stacked Nonvolatile Semiconductor Memory", U.S. patent application Ser. No. 12/406,524 filed on Mar. 18, 2009, entitled "Three-Dimensionally Stacked Nonvolatile Semiconductor Memory", U.S. patent application Ser. No. 12/679,991 filed on Mar. 25, 2010, entitled "Nonvolatile Semiconductor Memory Device and Manufacturing Method of the Same", and U.S. patent application Ser. No. 12/532,030 filed on Mar. 23, 2009, entitled "Semiconductor Memory and Manufacturing Method of the Same" is referred to and cited in the present embodiment.

<Internal Configuration Example of the Sense Amplifier Circuit>

FIG. 7 is an equivalent circuit diagram showing an example of the internal configuration of a sense amplifier circuit of the flash memory according to the present embodiment.

As described above, the sense amplifier circuit 13 includes a plurality of sense amplifier units 131.

As shown in FIG. 7, the one sense amplifier unit 131 corresponds to one bit line BL. In the internal configuration of a flash memory, the one sense amplifier unit 131 may correspond to two bit lines BL or more.

The sense amplifier unit 131 includes a control section 200, a processing section 201, and a plurality of latch circuits DL (DL1, DL2, DL3A, DL3B).

The control section 200 includes a plurality of n-type transistors (field effect transistors) Tr1, Tr2, Tr3, Tr4, Tr5, Tr6.

The transistor Tr1 controls activation of the bit line BL (NAND string 111). For the control of activation of the bit line BL, a control signal BLS is supplied to the gate of the transistor Tr1. For example, the transistor Tr1 has relatively high breakdown resistance to transfer a relatively high voltage to the bit line BL. As a result, the transistor Tr1 has a relatively high threshold voltage.

One end (one of the source/drain) of the transistor Tr1 is connected to the bit line BL. The other end (the other of the source/drain) of the transistor Tr1 is connected to one end of the transistor Tr2.

The transistor Tr2 controls the potential of the bit line BL. A control signal BLC is supplied to the gate of the transistor Tr2. The transistor Tr2 clamps the potential of the bit line BL to the potential in accordance with the control signal BLC.

The other end of the transistor Tr2 is connected to a node (interconnect or terminal) SCOM.

The transistors Tr3, Tr4, Tr5, Tr6 control electric connection between a power terminal and the node SCOM.

A control signal BV1 is supplied to the gate of the transistor Tr3. One end of the transistor Tr3 is connected to the node SCOM. The other end of the transistor Tr3 is connected to the power terminal. A voltage VSS is applied to the other end of the transistor Tr3 via the power terminal. The voltage VSS is the ground voltage. Hereinafter, the power terminal to which the ground voltage VSS is applied will be denoted also as a ground terminal VSS.

A control signal BV2 is supplied to the gate of the transistor Tr4. One end of the transistor Tr4 is connected to the node SCOM. The other end of the transistor Tr4 is connected to the power terminal. A voltage Vx is applied to the other end of the transistor Tr4 via the power terminal.

Hereinafter, the power terminal to which the voltage Vx is applied will be denoted also as a power terminal Vx. The voltage value of the voltage Vx is, for example, 1.8 V or more and 2.2 V or less.

A control signal BV3 is supplied to the gate of the transistor Tr5. One end of the transistor Tr5 is connected to the node SCOM. The other end of the transistor Tr5 is connected to the power terminal. A voltage Vz is applied to the other end of the transistor Tr5 via the power terminal. The voltage Vz is higher than the ground voltage VSS and lower than the voltage Vx. Hereinafter, the power terminal to which the voltage Vz is applied will be denoted also as a power terminal Vz. The voltage value of the voltage Vz is, for example, 0.3 V or more and 0.5 V or less.

A control signal BV4 is supplied to the gate of the transistor Tr6. One end of the transistor Tr6 is connected to the node SCOM. The other end of the transistor Tr6 is connected to the power terminal. A voltage Vb is applied to the other end of the transistor Tr5 via the power terminal. The voltage Vb is higher than the ground voltage VSS and lower than the voltage Vx. The voltage Vb is equal to the voltage Vz or less. However, the voltage Vb may be higher than the voltage Vz. Hereinafter, the power terminal to which the voltage Vb is applied will be denoted also as a power terminal Vb.

One of the transistors Tr3, Tr4, Tr5, Tr6 is activated based on signals of the control signals BV1, BV2, BV3, BV4 in accordance with the operation/process on the memory cell MC. Accordingly, one of the voltages VSS, Vx, Vz, Vb is applied to the bit line BL.

The processing section 201 is connected to the bit line BL via the transistors Tr1, Tr2 and the node SCOM. The processing section 201 is connected to the latch circuit DL. The processing section 201 can sense generation of a current or fluctuations of the potential in the bit line BL. The processing unit 201 can transfer a sense result to the latch circuit DL. The processing section 201 can transfer data (signal) in the latch circuit DL to the bit line BL (memory cell MC).

Using data (signal) in the latch circuit DL, the processing unit 201 can perform various calculation processes such as an OR operation and an AND operation. Based on calculation results, the processing unit 201 can control the signal level of the control signals BV1, BV2, BV3, BV4. As a result, the processing section 201 can control the potential of the bit line BL.

In the sense amplifier unit 131, for example, the four latch circuits DL (DL1, DL2, DL3A, DL3B) or more are connected to the processing section 201 via a bus LBUS.

The upper data latch circuit DL1 holds, when, for example, the memory cell MC can store 2-bit data, the upper one bit of two bits. The lower data latch circuit DL2 holds, when, for example, the memory cell MC can store 2-bit data, the lower one bit of two bits.

A plurality of the latch circuits DL3A, DL3B temporarily holds, for example, signals (information) to control the bit line. For example, the latch circuits DL3A, DL3B hold a verify result when data is written. The latch circuits DL3A, DL3B hold a determination result of ON/OFF of the memory cell at the read level and a calculation result by the processing unit 201 during read operation.

The flash memory 1 according to the present embodiment includes the plurality of latch circuits DL3A, DL3B so that results of a plurality of verify operations in the memory cell MC can be held independently of each other.

In the present embodiment, for example, the flash memory 1 includes the two latch circuits DL3A, DL3B. Accordingly, regarding a certain memory cell, while the one latch circuit DL3A continues with a holding state of a signal indicating a verify-pass, the other latch circuit DL3B can hold the result of a verify operation performed after the result of the verify-pass is obtained. Incidentally, the number of the latch circuits DL3A, DL3B capable of holding verify results may be three or more in accordance with the number of times of verification (number of times of detecting a verify-pass) regarding the threshold voltage state of a certain memory cell.

Hereinafter, a memory cell having passed a verify operation at least once will be called a pass cell. A memory cell having failed in a verify operation will be called a fail cell.

In the present embodiment, the flash memory 1 performs verification of the threshold voltage again for memory cells having verify-passed when data is written.

Accordingly, the flash memory according to the present embodiment can verify the threshold voltage state of memory cells having verify-passed when a certain period passes after the verify-pass during writing of data.

As a result, the flash memory 1 according to the present embodiment can detect a defect in which the threshold voltage of a memory cell having verify-passed changes to a value different from the voltage value corresponding to data to be written during writing of data. For example, the flash memory according to the present embodiment detects, among memory cells having verify-passed once, memory cells whose threshold voltage has fallen to a value smaller than the verify level regarding data to be written.

When a defect resulting from the threshold voltage of a memory cell is detected, the flash memory 1 according to the present embodiment brings the threshold voltage of the memory cell including the detected defect back to the value corresponding to data to be written during writing of data.

As a result, a flash memory according to the present embodiment can improve reliability of data.

(1b) Operation Examples

Write operations of a memory device according to the first embodiment will be described with reference to FIGS. 8 and 23.

(1b-1) First Example

Figure 9:
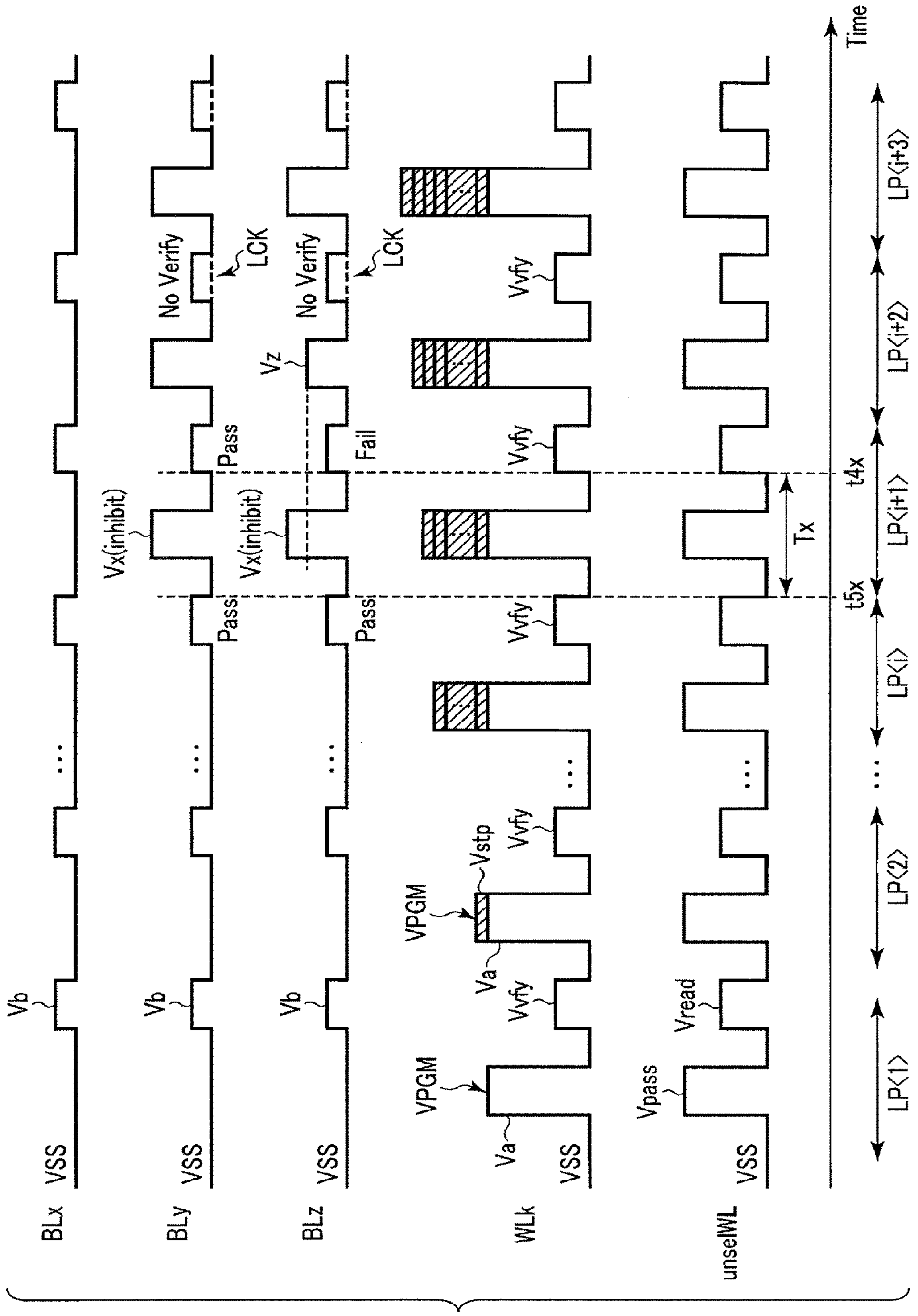
FIG. 9 is a timing chart showing an operation example of the memory device according to the first embodiment.

First, a first example of the write operation will be described with reference to FIGS. 8 and 9. FIG. 8 is a flowchart illustrating an operation example of the flash memory according to the present embodiment. FIG. 9 is a timing chart schematically showing a voltage waveform (horizontal axis: time, vertical axis: potential) of each interconnect during write operation of an operation example of the flash memory according to the present embodiment. FIG. 8 is a flowchart showing a process on a certain memory cell by focusing on the memory cell and bit line.

As shown in FIG. 8, the memory controller 5 issues an instruction to write data to the flash memory 1 based on a request from the host device. The memory controller 5 transmits a write command, an address (selected address) where data should be written, and data to be written. Then, the flash memory 1 receives the write command, selected address, and data from the memory controller 5. The flash memory 1 starts to write data based on the received write command (step S0).

As shown in FIG. 9, writing of data by the flash memory 1 includes one write loop LP (LP<1>, LP<2>, . . . , LP<i>, . . . , LP<i+3>) or more. "i" is a natural number equal to 1 or greater. One write loop LP includes at least a program operation and a verify operation.

The sequencer 19 performs a program operation in the first write loop LP<1> (step S1).

In each of the sense amplifier units 131 of the sense amplifier circuit 13, the latch circuit DL holds data to be written into the memory cell. The processing unit 201 performs a calculation process on data in the latch circuit DL. Based on the calculation result, the voltage to be applied to the bit line BL (BLx, BLy, BLz) is determined.

Each of the sense amplifier units 131 applies the ground voltage VSS to, among a plurality of bit lines, the bit line BL connected to the memory cell MC into which data should be written based on the calculation result of data in the latch circuit DL during program operation. For example, the ground voltage VSS is applied to the bit line BL by the transistor Tr3 being turned on based on the control signal BV1 at the H level. Accordingly, the memory cell MC is put into a programmable state.

The sense amplifier unit 131 applies the voltage Vx to bit lines connected to memory cells into which data is not to be written (for example, memory cells that should be maintained in an Er state). The voltage Vx has a voltage value of, for example, about a power supply voltage VDD (VDD>VSS). For example, the voltage Vx is applied to the bit line BL by the transistor Tr4 being turned on based on the control signal BV2 at the H level. Accordingly, the memory cell MC is put into a program inhibited state.

The row control circuit 12 selects a word line indicated by the address (hereinafter, called a selected word line).

The sequencer 19 applies a program voltage VPGM to a selected word line WLk via the row control circuit 12 and a write pass voltage (write non-selection voltage) Vpass to word lines unselWL other than the selected word line WLk (hereinafter, called unselected word lines). k is a natural number equal to 0 or greater.

Figure 10:
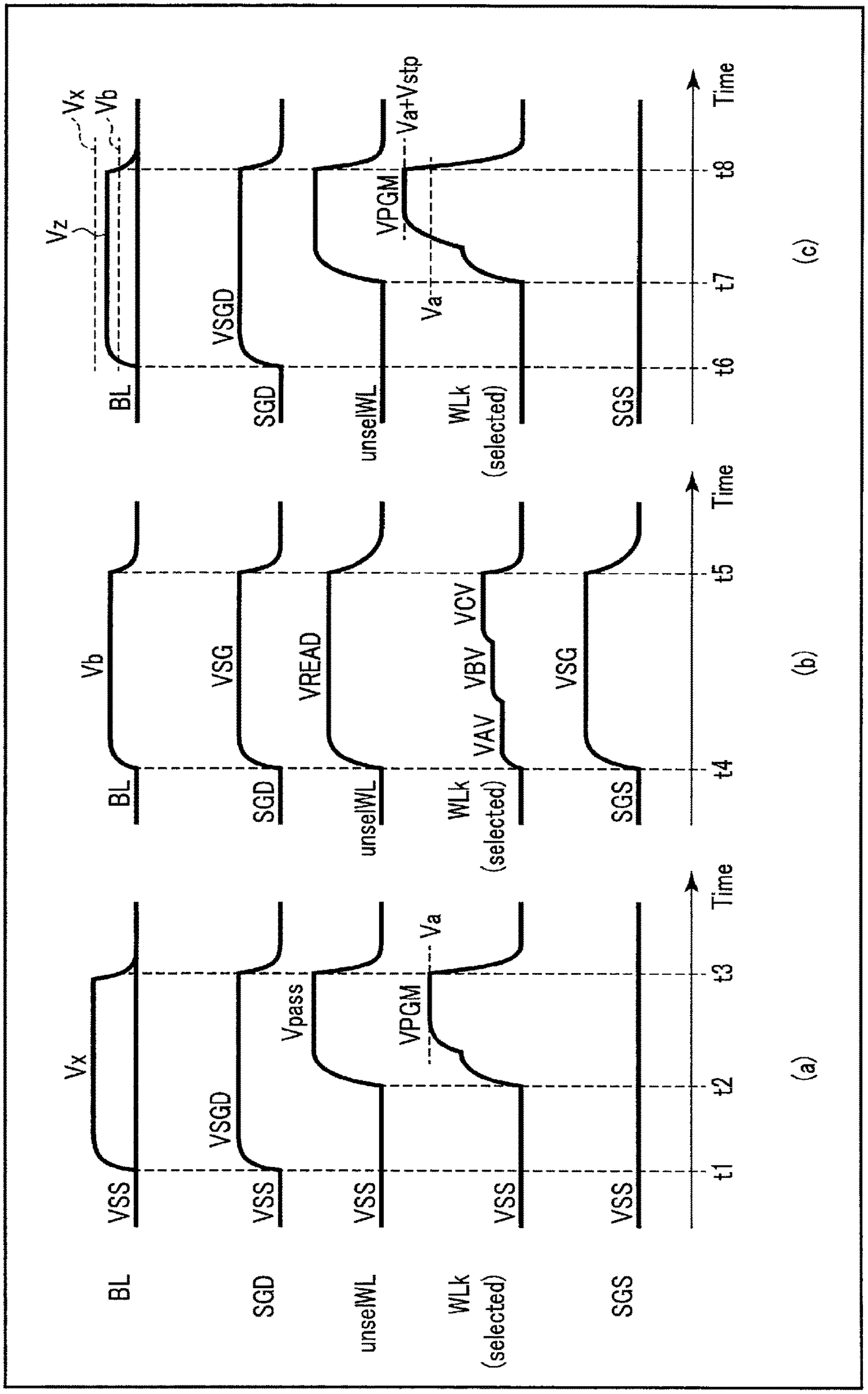
FIG. 10 is a voltage waveform chart of an operation example of the memory device according to the first embodiment.

FIG. 10 is a waveform chart showing the potential of each interconnect in each operation when data is written into the flash memory according to the present embodiment.

(a) of FIG. 10 is a waveform chart illustrating each voltage used for program operation of the flash memory 1.

In (a) of FIG. 10, the application of a voltage to the bit line is started at some time t1 during program operation and the potential of the bit line BL is set to the voltage Vx or the ground voltage VSS. When the voltage Vx is applied to the bit line BL, the memory cell is set to a program inhibited state. When the voltage VSS is applied to the bit line BL, the memory cell is set to a programmable state.

At time t1, a voltage VSGD is applied to the select gate line SGD on the drain side. In a memory cell array having the structure shown in FIGS. 3 to 5, the string unit SU corresponding to the select gate line SGD to which the voltage VSGD is applied is put into a selected state. The ground voltage VSS is applied to the select gate line SGS on the source side during a period of program operation.

At some time t2, the application of the program voltage VPGM to the selected word line WLk is started. The write pass voltage Vpass is applied to the unselected word lines unselWL. While the program voltage VPGM is applied to the selected word line WLk, the potential of the selected word line WLk is set to a desired voltage value Va after being raised to about the write pass voltage Vpass. Incidentally, as will be described below, the upper limit of the program voltage VPGM changes depending on the number of times of the write loop and the level to be written.

Here, if the voltage Vx is applied to the bit line BL, the select transistor ST1 connected to the bit line BL is cut off by the gate voltage VSGD and the potential of the bit line BL. As a result, the memory cell corresponding to the bit line BL to which the voltage Vx is applied is channel-boosted so that the injection of charges into the memory cell is inhibited.

If the voltage VSS is applied to the bit line BL, on the other hand, the select transistor ST1 connected to the bit line BL is turned on. As a result, charges of the quantity corresponding to the potential difference between the potential of the bit line BL and the program voltage VPGM are injected into the memory cell corresponding to the bit line BL to which the voltage VSS is applied.

Thus, the injection of charges (and the amount of injected charges) into the memory cell is controlled in accordance with the potential of the bit line BL.

At some time t3, the reduction of potentials of the word lines WLk, unselWL is started and the potentials of the word lines WLk, unselWL are set to the ground voltage VSS. Also at time t3, the reduction of the potential of the bit line BL is started and the potential of the bit line BL is set to the ground voltage VSS.

In this manner, the potential of each interconnect is controlled and a program operation thereof is performed.

After the program operation, the sequencer 19 performs a verify operation. Then, the sequencer 19 determines whether the verify result of a certain memory cell is pass/fail (step S2).

The processing unit 201 performs a calculation process on data in the latch circuit DL during verify operation. Based on the calculation result of the processing unit 201, each of the sense amplifier units 131 controls the potential of the bit line BL. The sequencer 19 applies a verify voltage Vvfy including one or more verify levels to the selected word line WLk via the row control circuit 12 and the read pass voltage (read unselection voltage) VREAD to the unselected word lines unselWL.

(b) of FIG. 10 is a waveform chart illustrating each voltage used for verify operation of the flash memory 1.

As shown in (b) of FIG. 10, at some time t4, the control of the potential of the bit line BL is started.

The voltage Vb is applied to, among a plurality of bit lines, the bit line BL connected to the memory cell to be verified. The voltage Vb is higher than the voltage VSS and lower than the voltage VDD. For example, the ground voltage VSS may be applied to the bit line BL connected to a memory cell not to be verified. Incidentally, memory cells not to be verified include at least a memory cell that should maintain the Er state. Hereinafter, a process (operation) that applies the voltage VSS to some bit line BL will be called a lockout process.

At time t4, a voltage VSG (for example, VSG<VSGD) is applied to the select gate lines SGD, SGS. Accordingly, the select transistors ST1, ST2 are turned on.

At time t4, the control of the potential of each of the word lines WLk, unselWL is started.

The read pass voltage VREAD is applied to the unselected word lines unselWL. Accordingly, memory cells connected to the unselected word lines unselWL are turned on.

The verify voltage Vvfy is applied to the selected word line WLk. When the memory cell MC stores 2-bit (4-valued) data, the verify voltage Vvfy includes the verify level (voltage value) VAV related to the A state, the verify level VBV related to the B state, and the verify level VCV related to the C state.

However, in accordance with the progress of writing of data (the number of times of performing the write loop), the verify level corresponding to data for which programming is completed may be omitted from the verify voltage Vvfy. If, for example, programming of the A state is completed, the verify voltage Vvfy includes the verify levels VBV, VCV of the B state and the C state and does not include the verify level of the A state. If programming of the A state and the B state is completed, the verify voltage Vvfy includes only the verify level VCV of the C state. When data held by the memory is 1-bit or 3-bit data or data of more bits, the verify voltage Vvfy includes verify levels of the number of levels in accordance with data to be held.

In FIG. 9, the verify voltage Vvfy including a plurality of verify levels is indicated by a quadrangular voltage waveform to simplify the illustration.

A memory cell in an ON state when a certain verify level is applied has a threshold voltage of the certain verify level or below. A memory cell in an OFF state when a certain verify level is applied has a threshold voltage higher than the certain verify level. A memory cell in an ON state when a certain verify level is applied is a verify-failed memory cell concerning the verify level. A memory cell in an OFF state when a certain verify level is applied is a verify-passed memory cell concerning the verify level.

The sense amplifier unit 131 senses generation of a current or fluctuations of the potential in the bit line (node) resulting from ON or OFF of the memory cell MC.

The sense result is stored in, for example, the latch circuit DL3 as a signal indicating the result (verify-pass or verify-fail) of a verify operation.

When a signal indicating a verify-pass (hereinafter, called a pass signal) is stored in the latch circuit DL3, the memory cell corresponding to the latch circuit DL3 is in a verify-passed state in the verify operation at some time (in some write loop). When a signal indicating a verify-fail (hereinafter, called a fail signal) is stored in the latch circuit DL3, the memory cell corresponding to the latch circuit DL3 is in a verify-failed state.

The processing unit 201 performs a calculation process of data to be written and a verify result (data in the latch circuit DL3) at the verify level corresponding to the data to be written. Based on the result of the calculation process, the processing unit 201 determines whether the memory cell MC has verify-passed.

In this manner, whether the threshold voltage of the memory cell MC has reached the value corresponding to data to be written is verified by the verify operation.

If a verify-fail is included in the result of a verify operation, the sequencer 19 performs a second write loop LP<2>.

In the second write loop LP<2>, the voltage value of the program voltage VPGM is changed. For example, a certain voltage value (called a step-up voltage) Vstp is added to the voltage value Va of the program voltage VPGM in the last write loop LP<1>. In this manner, the step-up voltage Vstp is successively added with an increasing number of times of the write loop, thereby increasing the voltage value of the program voltage VPGM.

In the second write loop LP<2>, a verify operation is performed after a program operation and a verify result is stored in the latch circuit DL3.

In this manner, the sequencer 19 successively performs the write loop.

Then, it is assumed that memory cells connected to the bit lines BLy, BLz verify-pass in the i-th write loop LP<i>.

As a result, the potentials of certain nodes connected to the bit lines BLy, BLz are each stored in the latch circuits DL3A as a pass signal. That is, the latch circuits DL3A corresponding to the bit lines BLy, BLz hold a pass signal and the latch circuit DL3A corresponding to the bit line BLx holds a fail signal.

In the (i+1)-th write loop LP<i+1>, the ground voltage VSS is applied to the bit line BLx corresponding to the verify-failed memory cell in the i-th write loop LP<i>. Accordingly, the memory cell connected to the bit line BLx is set to a programmable state.

Also, the voltage Vx is applied to the bit lines BLy, BLz corresponding to the verify-passed memory cells based on data in the latch circuits DL3A. Accordingly, the memory cells connected to the bit lines BLy, BLz are set to a program inhibited state (step S3).

A verify operation is performed after the program voltage VPGM is applied.

In the present embodiment, in addition to memory cells to be programmed, memory cells for which a verify-pass result is obtained in the last write loop LP<i> are also selected as memory cells to be verified. A period Tx is secured between the end of a verify operation in the last write loop LP<i> and the start of a verify operation in the current write loop LP<i+1>. For example, the period Tx corresponds to a period from time t5*x* of the fall of the verify voltage Vvfy in the last write loop LP<i> to time t4*x* of the rise of the verify voltage Vvfy in the current write loop LP<i+1>.

The threshold voltage of the memory cell MC that has verify-passed once is verified regarding data to be written (threshold voltage state to be held) (step S4). Accordingly, based on the result of a verify operation on a memory cell having undergone a program inhibited state, whether a memory cell set to a program inhibited state maintains a passed state of the verify level corresponding to the data to be written is determined.

For example, a memory cell connected to the bit line BLx is determined to have verify-failed (No in step S2). The verify result (fail signal) is stored in the latch circuit DL3A corresponding to the bit line BLx.

Among memory cells for which a verify-pass result is once obtained, the memory cell connected to the bit line BLy verify-passes (Yes in step S4). Therefore, in the sense amplifier unit 131 in which a pass signal is stored in the latch circuit DL3A, the second verify-pass result is stored in the latch circuit DL3B as a pass signal.

On the other hand, among memory cells for which a verify-pass result is once obtained, for example, the memory cell connected to the bit line BLz fails in verification of data to be written (No in step S4).

Thus, regarding the memory cell that has verify-passed once, the threshold voltage of the memory cell when the period Tx passes after the verify-pass is verified.

If, among memory cells having verify-passed once in a certain write loop, a memory cell fails in verification performed in a subsequent write loop during write operation, the threshold voltage of the memory cell is lower than the voltage value corresponding to the data to be written.

In the sense amplifier unit 131 in which a signal indicating a verify-pass is stored in the latch circuit DL3A, the result of a verify-fail in re-verification for the threshold voltage of the memory cell is stored in the latch circuit DL3B. The latch circuit DL3A in the sense amplifier unit 131 continues with a holding state of a pass signal.

In the (i+2)-th write loop LP<i+2>, the above program operation is performed for memory cells for which a verify-pass result is not yet obtained.

Therefore, in the example of FIG. 9, like the memory cell connected to the bit line BLy, the memory cell having verify-passed twice is recognized that programming is completed and put into an unselected state (program inhibited state) (step S5). That is, the sense amplifier unit 131 applies the voltage Vx to the bit line BLy.

On the other hand, if, among memory cells having verify-passed once, a memory cell that fails in program verification after the verify-pass is reset for programming (step S6).

In the sense amplifier unit 131 corresponding to the memory cell for which the verification after the verify-pass (after a program inhibited state is set) is a fail, the sense amplifier unit 131 controls the potential of the bit line BLz based on calculation results of the latch circuits DL3A, DL3B.

(c) of FIG. 10 is a waveform chart illustrating each voltage used for program operation performed for memory cells having verify-passed once in the flash memory 1 according to the present embodiment.

If, as shown in (c) of FIG. 10, a memory cell having verify-passed once is in a verify-failed state in the re-verification, the voltage Vz is applied to the bit line BLz connected to the memory cell at time t6 during program operation. The voltage value of the voltage Vz is lower than that of the voltage Vx and higher than that of the voltage VSS. The ground voltage VSS is applied to bit lines (for example, the bit line BLx) connected to memory cells that have not once verify-passed. The control of the potential at other times t7, t8 is the same as in (a) of FIG. 10.

Accordingly, even if the voltage value of the program voltage applied to the selected word line WLk is a relatively high voltage value, the amount of charges injected into the charge storage layer of a memory cell having verify-passed once is smaller than that of charges injected into the charge storage layer of a memory cell having not once verify-passed.

In the present embodiment, an operation of injecting charges into the charge storage layer of a memory cell in a state in which the potential of the bit line BL is set to a potential higher than the ground voltage VSS and lower than the voltage Vx to put the memory cell into a program inhibited state is called slow programming (slow programming mode). In contrast to the slow programming, a program operation performed in a state in which the ground voltage VSS is applied to the bit line is called a normal program (normal program mode).

Due to the slow programming, the threshold voltage of a memory cell that has passed the first verification of two verifications and failed in re-verification (verification after the memory cell being set to a program inhibited state) rises.

Thus, in the present embodiment, a memory cell whose threshold voltage has fallen in a state in which the potential of the bit line BL is set higher than the ground voltage VSS and lower than the voltage Vx is set for programming and the fallen threshold voltage of the memory cell is brought back by the program operation to the value corresponding to the data to be written.

After the program operation including slow programming, a verify operation is performed.

The voltage Vb is applied to the bit line BLx to verify the threshold voltage of the memory cell MC connected to the bit line BLx.

In the verify operation, not only memory cells having passed two verifications (here, the memory cell connected to the bit line BLy), but also slow-programmed memory cells are excluded from verification. For example, a signal indicating that slow programming has been performed (hereinafter, called slow programming complete signal) is stored in the latch circuit DL3B. Accordingly, the sense amplifier unit 131 can determine whether a slow-programmed memory cell is to be verified during verify operation after the slow programming.

Thus, a memory cell for which slow programming has been performed is determined to be programming complete without program verification after the slow programming (step S5). As a result, in the write loop LP<i+3> after the write loop LP<i+2> in which the slow programming is performed, the memory cell for which the slow programming has been performed is set to a program inhibited state.

Incidentally, a memory cell having passed two verifications may be put into a lockout state LCK in the verify operation in a subsequent write loop. If the memory cell is put into the lockout state LCK during verify operation, the ground voltage VSS is applied to the bit line BLy based on data of the latch circuits DL3A, DL3B.

A plurality of write loops is repeated as described above until all memory cells belonging to the selected address pass verification.

When all memory cells pass verification, writing of data into the flash memory 1 is completed. Incidentally, the completion of writing of data may be determined whether the number of times of performed write loops has reached a predetermined number of times or the number of verify-failed memory cells is within a permitted value.

The flash memory 1 notifies the memory controller 5 of the completion of writing of data.

Incidentally, reading of data and erasure of data in the flash memory 1 according to the present embodiment are performed by known technology. Therefore, the description of reading of data and erasure of data in the flash memory 1 according to the present embodiment is omitted.

As shown in FIGS. 8 and 9, the flash memory according to the present embodiment re-verifies the threshold voltage of memory cells having verify-passed once regarding data to be written during write operation of data.

If the re-verified memory cell verify-fails, a program operation is performed for the memory cell. Accordingly, the threshold voltage of a verify-failed memory cell in the re-verification of the threshold voltage is brought back to the threshold voltage corresponding to data to be written.

In the present embodiment, the amount of injected charges into a memory cell is controlled by controlling the potential of the bit lines in a program operation for a verify-failed memory cell in the re-verification. Accordingly, the flash memory according to the present embodiment can prevent over-programming for memory cells verify-passed once.

Also in the present embodiment, a program operation for verify-failed memory cells in the re-verification is performed simultaneously with a normal program operation (program operation for memory cells not once verify-passed).

A flash memory according to the present embodiment can, as described above, make the width of the threshold distribution of the state corresponding to data to be written narrower without prolongation of the operation in a period of the write operation of data so that an error can be inhibited from occurring in data of memory cells.

Therefore, the flash memory according to the present embodiment can improve reliability of data.

(1b-2) Second Example

A second example of the operation example of a flash memory cell according to the present embodiment will be described with reference to FIGS. 11 and 12. FIG. 11 is a flowchart illustrating an operation example of the flash memory according to the present embodiment. FIG. 12 is a timing chart schematically showing the voltage waveform (horizontal axis: time, vertical axis: potential) of each interconnect during write operation of the operation example of the flash memory according to the present embodiment. FIG. 11 is a flowchart showing a process on a certain memory cell by focusing on the memory cell and bit line.

In the present example, slow-programmed memory cells are included for verification, together with programmed memory cells.

As shown in FIGS. 11 and 12, like in the first example, a verify operation is performed again for memory cells in a verify-passed state in the (i+1)-th write loop LP<i+1>. In the (i+2)-th write loop LP<i+2>, a program operation including slow programming is performed (step S6A). For example, in the program operation of the write loop LP<i+2>, the voltage vz is applied to the bit line BLz and slow programming is performed for a memory cell connected to the bit line BLz.

In a verify operation after the slow programming, the threshold voltage of the memory cell for which the slow programming has been performed is verified (step S4).

In the present example, for example, the holding state of data in the latch circuit DL3B is maintained, after the slow programming, in a state holding a fail signal without being changed by a signal indicating execution of the slow programming. Accordingly, in a flash memory according to the present embodiment, the sequencer 19 and the sense amplifier unit 131 can detect that the slow-programmed memory cell is to be verified.

The sense amplifier unit 131 applies the voltage Vb to the bit line BLz based on data (verify result) of the latch circuits DL3A, DL3B.

If the slow-programmed memory cell has verify-passed (Yes in step S4), a pass signal is stored in the latch circuit DL3B. Accordingly, the program operation and the verify operation for a memory cell whose number of times of the verify-pass is two are completed (step S5). In this case, as shown in FIG. 12, the voltage Vx is applied to the bit line BLz to put the memory cell MC into a program inhibited state during program operation of the (i+3)-th write loop LP<i+3>.

If the slow-programmed memory cell has verify-failed (No in step S4), the program operation is performed again for the memory cell based on data in the latch circuit DL3B in the write loop LP<i+3>. In this case, as shown in FIG. 12, the voltage Vz is applied to the bit line BLz to perform the slow programming for the memory cell MC during program operation of the (i+3)-th write loop LP<i+3>. After the slow programming for the memory cell, program verification is performed for the slow-programmed memory cell.

The slow programming (step S6A) and verification (step S4) are repeatedly performed for the memory cell connected to the bit line BLz until the verify result of the slow-programmed memory cell becomes a verify-pass.

By performing the verify operation for the slow-programmed memory cell like in the present example, reliability of writing of data can be improved.

(1b-3) Third Example

Figure 14:
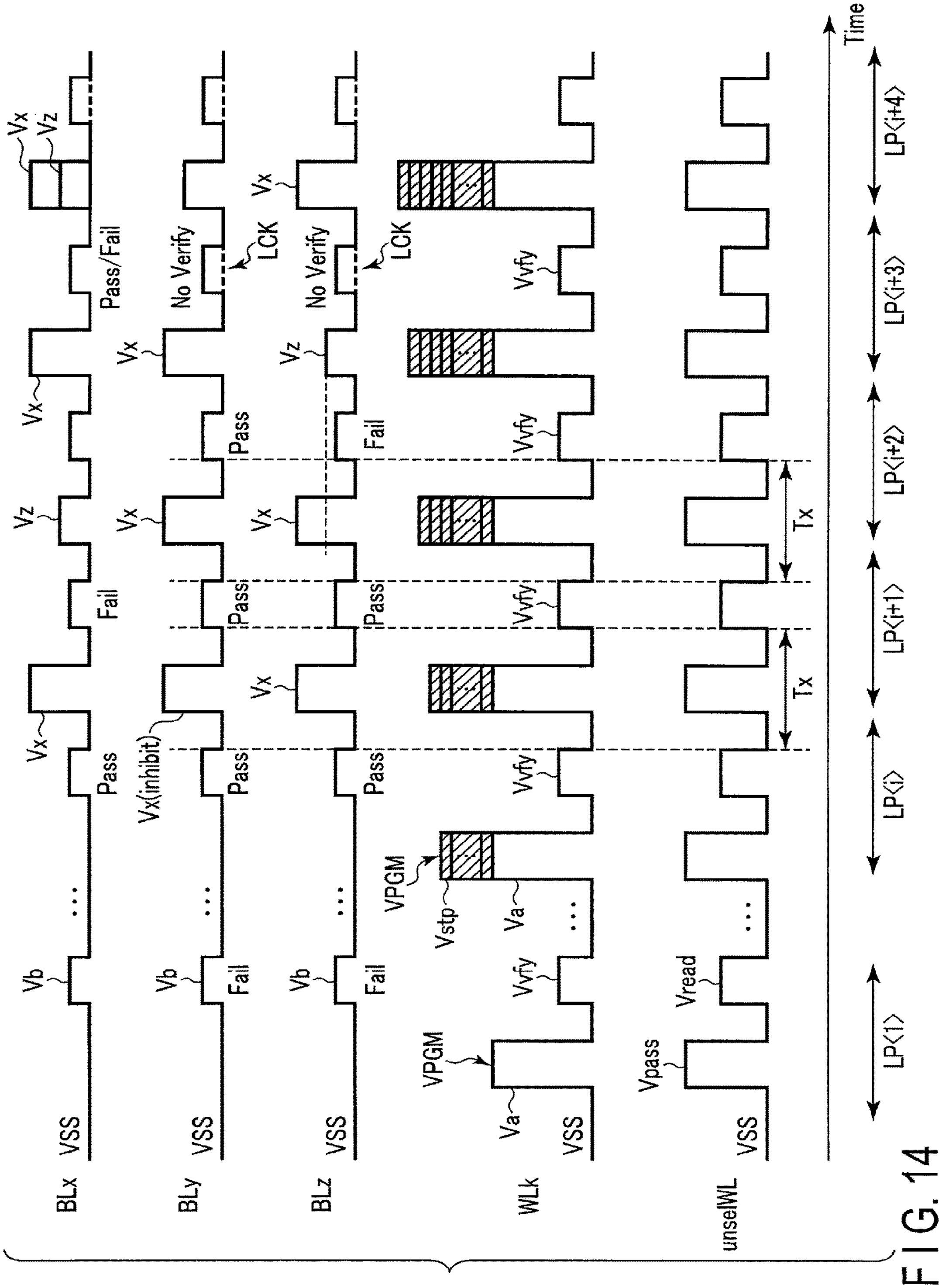
FIG. 14 is a timing chart showing an operation example of the memory device according to the first embodiment.

A third example of the operation example of the flash memory according to the present embodiment will be described with reference to FIGS. 13 and 14. FIG. 13 is a flowchart illustrating an operation example of the flash memory according to the present embodiment. FIG. 14 is a timing chart schematically showing the voltage waveform (horizontal axis: time, vertical axis: potential) of each interconnect during write operation of the flash memory according to the present embodiment. FIG. 13 is a flowchart showing a process on a certain memory cell by focusing on the memory cell and bit line.

Regarding the verify operation after a verify-pass performed for a certain memory cell like in the present example, two verify operations or more may be performed for the verify-passed memory cell to re-verify the threshold voltage state of the memory cell.

Regarding the memory cell for which the first verify-pass is obtained in a certain write loop LP<i>, as shown in FIGS. 13 and 14, the voltage Vx is applied, like memory cells connected to the bit lines BLx, BLy, BLz, to the bit lines BLx, BLy, BLz in the program operation of the next write loop LP<i+1>. Accordingly, the memory cell MC is set to a program inhibited state (step S3-1).

Then, in the write loop LP<i+1>, program verification is performed for the memory cell having verify-passed once (memory cell put into a program inhibited state) (step S4-1).

If the result of the program verification of the last write loop LP<i+1> is a pass (Yes in step S4-1), in the program operation of the write loop LP<i+2> after the write loop LP<i+1>, the memory cell having verify-passed twice (for example, memory cells connected to the bit lines BLy, BLz) is set to a program inhibited state (step S3-2).

On the other hand, like the memory cell of the bit line BLx, if the result of the last program verification for a memory cell having verify-passed once is a fail (No in step S4-1), in the write loop LP<i+2>, slow programming is performed for the memory cell (step S6-1).

In the verify operation of the write loop LP<i+2>, a verify operation is performed for a memory cell set to a program inhibited state based on the last verify result (step S4-2).

In the write loop LP<i+2>, for example, a memory cell connected to the bit line BLy verify-passes and a memory cell connected to the bit line BLz verify-fails. The memory cell connected to the bit line BLy acquires a third verify-pass result (pass signal) regarding the program verification. Accordingly, programming of data for the memory cell connected to the bit line BLy is completed (step S5).

In the verify operation of the write loop LP<i+2>, the next write loop is performed for a slow-programmed memory cell without program verification being performed.

In the write loop LP<i+3> after the write loop LP<i+2>, a memory cell having verify-passed three times (memory cell of the bit line BLy) or a slow-programmed memory cell (memory cell of the bit line BLx) is set to a program inhibited state.

If the verify result of a memory cell having verify-passed twice is a fail in the last verify operation (No in step S7), slow programming is performed for the verify-failed memory cell (here, the memory cell of the bit line BLz) (step S6-2).

The voltage Vz is applied to the bit line BLz during program operation of the write loop LP<i+3>. Accordingly, the slow programming is performed for the memory cell connected to the bit line BLz (memory cell whose number of times of the verify-pass is twice).

In the write loop LP<i+3>, programming of data for the slow-programmed memory cell is completed in the program verification after the slow programming without verification being performed (step S5).

In the write loop LP<i+3>, a verify operation is performed for a memory cell for which the slow programming has been performed in the last write loop LP<i+2> (memory cell of the bit line BLx). In the next write loop LP<i+3>, the memory cell of the bit line BLx is set to a program inhibited state or slow programming is performed therefor in accordance with the result of the verify operation. Accordingly, programming of data for the memory cell of the bit line BLx is completed.

Thus, if the total of the number of times of the verify-pass and the number of times of slow programming is three for a certain memory cell, writing of data into the memory cell is completed.

Incidentally, writing of data into a memory cell is controlled by pass signals and slow programming complete signals being stored in the three latch circuits DL3.

If the criterion for terminating programming of a certain memory cell is three times (or four times or more), the timing the verify-pass may be continuous or discontinuous. However, it is desirable to be able to obtain the result of verify-pass for a certain memory cell twice or more consecutively.

Thus, a flash memory according to the present embodiment performs a plurality of program verifications for a verify-passed memory cell.

Therefore, the flash memory according to the present embodiment has a longer period secured to detect the fall of the threshold voltage of memory cells. As a result, the flash memory according to the present embodiment has more opportunities to detect memory cells whose threshold voltage has fallen. Consequently, the flash memory according to the present embodiment can perform re-verification of the threshold voltage of a memory cell after the state of the threshold voltage of the memory cell has reached a relatively stable state. Therefore, the flash memory according to the present embodiment can improve the accuracy of re-verification of the threshold voltage of a memory cell having verify-passed.

As a result, a flash memory according to the present embodiment can improve reliability of data.

(1b-4) Fourth Example

Figure 16:
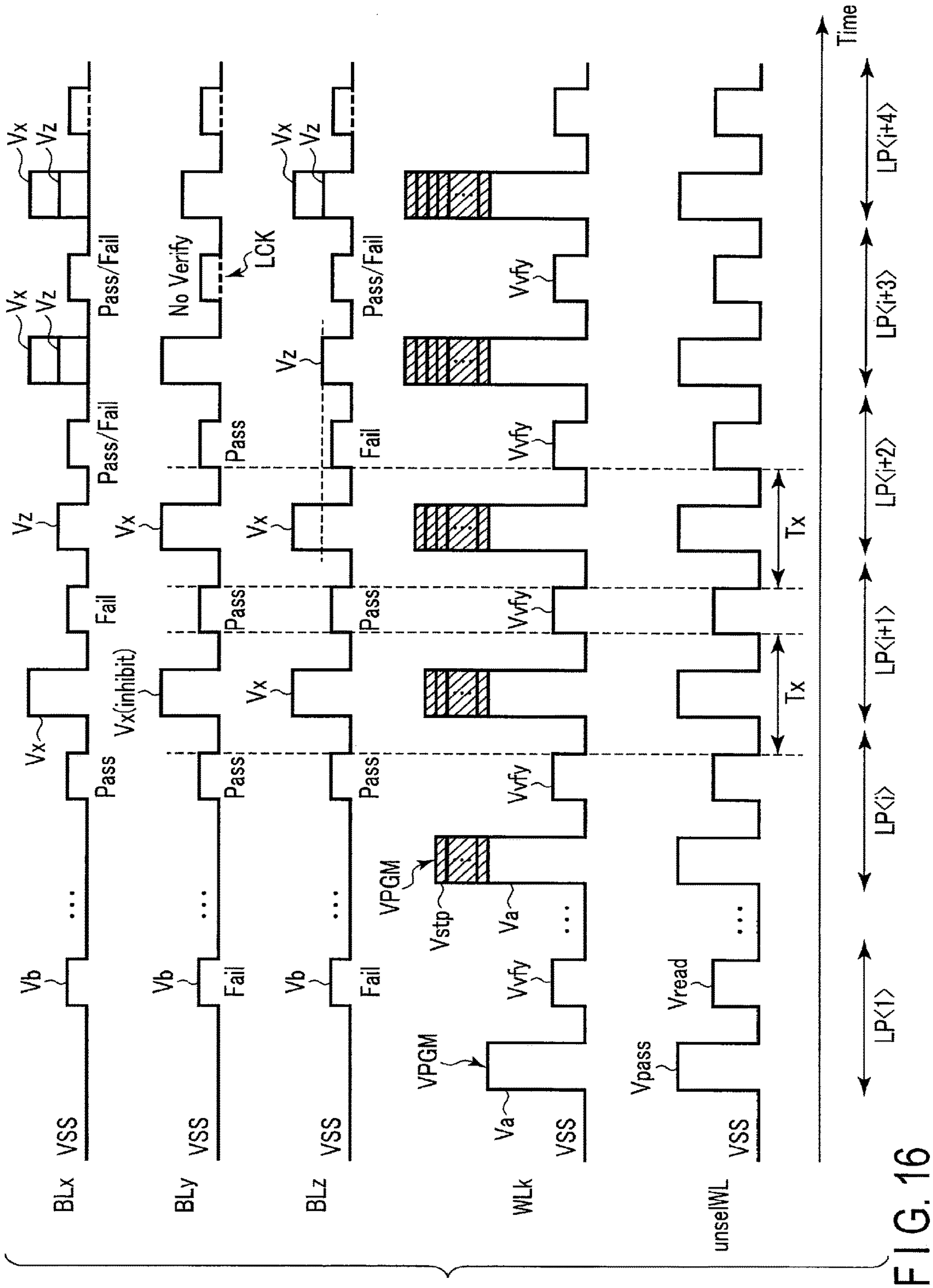
FIG. 16 is a timing chart showing an operation example of the memory device according to the first embodiment.

A fourth example of the operation example of the flash memory according to the present embodiment will be described with reference to FIGS. 15 to 18. FIG. 15 is a flowchart illustrating an operation example of the flash memory according to the present embodiment. FIG. 16 is a timing chart schematically showing the voltage waveform (horizontal axis: time, vertical axis: potential) of each interconnect during write operation of the flash memory according to the present embodiment. FIG. 15 is a flowchart showing a process on a certain memory cell by focusing on the memory cell and bit line.

When, like the flash memory in the present example, program verification is performed twice or more for a memory cell having verify-passed once, a memory cell for which the slow programming has been performed may be selected for verification.

As shown in FIGS. 15 and 16, like memory cells connected to the bit lines BLx, BLy, BLz, memory cells having verify-passed in the last write loop LP<i> are set to a program inhibited state in the (i+1)-th write loop LP<i+1>. Then, program verification is performed for the memory cells having been set to a program inhibited state (step S4-1). Accordingly, the state of the threshold voltage of the memory cells having verify-passed once is re-verified.

If, like the memory cell of the bit line BLx, the result of the program verification for a memory cell is a fail (No in step S4), in the write loop LP<i+2>, slow programming is performed for the memory cell (step S6-1A). In the write loop LP<i+2>, program verification is performed again for the slow-programmed memory cell (step S4). The slow programming and program verification are repeatedly performed until the memory cell acquires the result of the second verify-pass.

The memory cell of the bit line BLz verify-passes in the (i+1)-th write loop LP<i+1>. Therefore, in the write loop LP<i+2>, the memory cell of the bit line BLz is set to a program inhibited state by the program operation (step S3-2) and then, whether the result of a third verify-pass is obtained is determined (step S4-2).

After the write loop LP<i+2>, the (i+3)-th write loop LP<i+3> is performed. If, in the verify operation of the last write loop LP<i+2>, the verify result of the memory cell of the bit line BLz is a fail (No in step S4-2), the voltage Vz is applied to the bit line BLz during program operation of the current write loop LP<i+3>. Accordingly, the slow programming is performed for memory cells (memory cells having verify-passed twice).

Regarding the memory cell of the bit line BLx, the memory cell is set to a program inhibited state or slow programming is performed therefor in accordance with the verify result of the write loop LP<i+2>.

Program verification is performed for the memory cell of the bit line BLz during verify operation of the write loop LP<i+3> (step S4-2). Accordingly, the program verification is performed for the memory cells having verify-passed twice.

If, like the memory cell of the bit line BLy, the program verification for a memory cell is a fail (No in step S4-2), slow programming is performed for the memory cell (step S6-2A). In steps S4-2, S6-2A, the slow programming and program verification are repeatedly performed for a memory cell having verify-passed twice until a third verify-pass is obtained.

If the memory cell verify-passes (Yes in step S4-2) and the number of times of the verify-pass reaches three, programming of data for the memory cell is completed (step S5).

Figure 17:
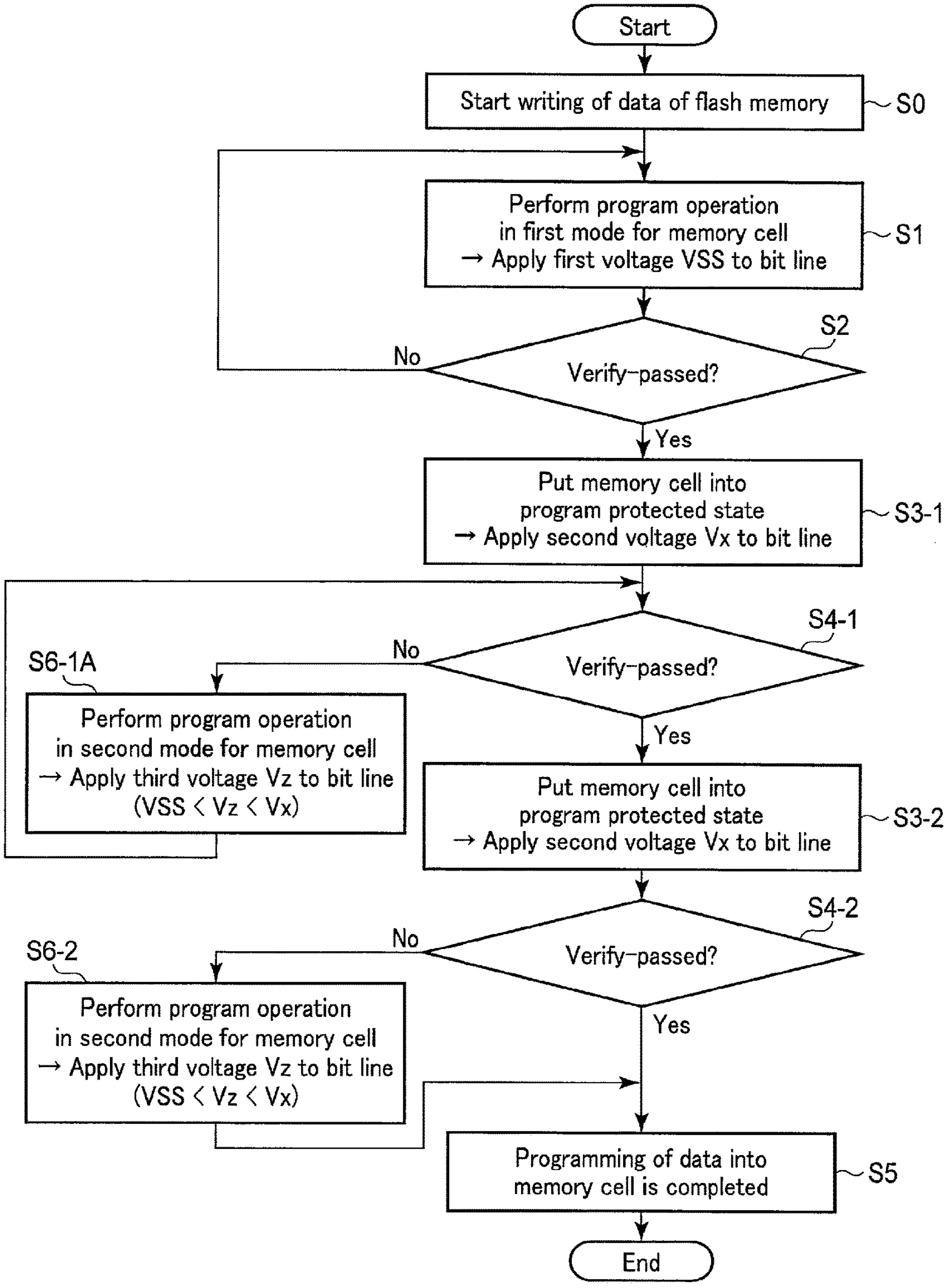

FIGS. 17 and 18 show a modification of the operation of the flash memory shown in FIGS. 15 and 16.

As shown in FIG. 17, the slow programming (step S6-1A) and program verification (step S4-1) are repeatedly performed until a memory cell acquires the result of a second verify-pass and the program verification concerning the slow programming (step S5-2) for the memory cell having verify-passed twice may not be performed.

Also, as shown in FIG. 18, the slow programming (step S6-2A) and verification (step S4-2) may repeatedly be performed until the memory cell having verify-passed once verify-passes three times without the program verification concerning the slow programming (step S6-1) for the memory cell being performed.

When, as described above, the completion of programming of data for a memory cell is determined based on two verify-pass results or more in the flash memory in the present example, program verification is performed for the slow-programmed memory cell.

Accordingly, a flash memory according to the present embodiment can improve reliability of data.

(1b-5) Fifth Example

A fifth example of the operation example of the flash memory according to the present embodiment will be described with reference to FIGS. 19 to 21.

The Quick Pass Write (QPW) method may be applied as a write method of data of a flash memory.

FIG. 19 is a diagram illustrating the QPW method of the flash memory.

In a flash memory of the QPW method, two verify levels are set as the verify levels of each state.

For example, as shown in FIG. 19, regarding the A state, the verify level (here, called the verify high level) VAV and the verify level (here, called the verify low level) VAL are set. The verify level VAL has a voltage value between the verify level VAV and a read level VAR.

Regarding the B state, the high level VBV and the verify low level VBL are set. The verify low level VBL has a voltage value between the verify level VBR and the verify high level VBV.

Regarding the C state, the high level VCV and the verify low level VCL are set. The verify low level VCL has a voltage value between the verify level VCR and the verify high level VCV.

In each state, the verify low level is lower than the verify high level. Incidentally, the verify low level VCL regarding the C state may not be set so that the verify low level VCL may not be included in the verify voltage Vvfy.

Regarding memory cells having passed the verify low levels VAL, VBL, VCL corresponding to data to be written, the potential of the bit line BL during program operation is controlled to adjust the write speed of the memory cell MC (amount of injected charges into the charge storage layer).

A voltage Vq is applied to the bit line BL in memory cells having verify-passed regarding the verify low level. The voltage value of the voltage Vq is lower than that of the voltage Vx and higher than that of the ground voltage VSS. For example, the voltage value of the voltage Vq is lower than the voltage value of the voltage Vz (for example, about 0.3 V to 0.5 V).

The sense amplifier unit 131 further includes a latch circuit to hold a verify result regarding the verify low level in order to, for example, write data in QPW format.

An operation example of a flash memory in the present example will be described with reference to FIGS. 20 and 21. FIG. 20 is a flowchart illustrating an operation example of the flash memory according to the present embodiment. FIG. 21 is a timing chart schematically showing the voltage waveform (horizontal axis: time, vertical axis: potential) of each wire during write operation of the operation example of the flash memory according to the present embodiment. FIG. 21 is a flowchart showing a process on a certain memory cell by focusing on the memory cell and bit line.

As shown in FIGS. 20 and 21, after writing of data is started (step S0), a program operation and a verify operation are performed.

In the i-th write loop LP<i>, after the program voltage is applied (step S11), the sequencer 19 applies the verify voltage Vvfy to the selected word line WLk. As shown in FIG. 19, the verify voltage Vvfy includes the verify low levels VAL, VBL, VCL and the verify high levels VAV, VBV, VCV for each level.

In the verify operation, whether a memory cell verify-passes regarding the verify low level corresponding to data to be written is determined (step S12). The verify result at the verify low level is held in a latch circuit to hold a determination result of the verify low level.

After the write loop LP<i>, a program operation is performed in the next write loop LP<i+1>.

It is assumed that, like the memory cell connected to the bit line BLx in FIG. 21, the memory cell verify-fails regarding the verify low level of data to be written. In this case (No in step S12), the ground voltage VSS is applied to the bit line BLx to perform normal-mode programming for the memory cell (step S11.). Programming in normal mode is repeatedly performed for a failed memory cell regarding the verify low level until the verify result passes.

It is assumed that, like the memory cells connected to the bit lines BLy, BLz in FIG. 21, the memory cell verify-passes regarding the verify low level of data to be written. In this case (Yes in step S12), programming in QPW mode (third mode) is performed for a memory cell having passed the verify low level (step S13). In a memory cell programmed in QPW mode, the voltage Vq is applied to the bit lines BLy, BLz connected to the memory cell. The voltage value of the voltage Vq is higher than the ground voltage VSS and lower than the voltage Vx (for example, 2.0 V). The voltage Vq has the voltage value of, for example, about 0.15 V to 0.25 V.

With the application of the voltage Vq (for example, 0.2 v) to the bit line BLy, the shift amount (amount of injected charges into the charge storage layer) of the threshold voltage of the memory cell connected to the bit line BLy decreases.

After the program voltage VPGM is applied, the verify voltage Vvfy is applied to the selected word line WLk for verify operation.

In a memory cell for which programming in QPW mode has been performed (memory cell having passed the verify low level), whether the memory cell verify-passes regarding the verify high level corresponding to data to be written is determined (step S14). The verify result regarding the verify high level for the memory cell programmed in QPW mode is stored in the latch circuit DL3A.

After the write loop LP<i+1>, the write loop LP<i+2> is performed.

If the memory cell MC verify-fails regarding the verify high level (No in step S12), programming in QPW mode is performed again for the memory cell in the write loop LP<i+2>. Programing in QPW mode (step S13) and verification of the verify high level (step S14) are repeatedly performed for the memory cell until the memory cell verify-passes regarding the verify high level.

If the memory cell MC verify-passes regarding the verify high level (Yes in step S14), the memory cell is set to a program inhibited state in the write loop LP<i+2> (step S15).

In the present example, program verification is performed in a verify operation of the write loop LP<i+2> for a memory cell having passed the verify high level in the last write loop LP<i+1>.

In the verify operation of the write loop LP<i+2>, verification regarding the verify high level is performed again for a memory cell having verify-passed once regarding the verify high level (step S16). Accordingly, the state of the threshold voltage of a verify-passed memory cell when the period Tx passes after a verify-pass determination is obtained is verified. The second verify result (pass signal or fail signal) at the verify high level is stored in the latch circuit DL3B.

After the verify operation of the write loop LP<i+2>, a program operation and a verify operation of the write loop LP<i+3> are performed.

If the second verify result at the verify high level is a pass (Yes in step S16), programming of data for the memory cell is determined to be completed (step S17). Thus, in a memory cell having verify-passed twice at the verify high level, like the memory cell connected to the bit line BLy, the voltage Vx is applied to the bit line BLy so that the memory cell MC is set to a program inhibited state. A memory cell having verify-passed twice at the verify high level is not verified during the verify operation.

If the second verify result regarding the verify high level is a fail (No in step S16), slow programming for the memory cell is performed (step S18). Thus, in a memory cell for which the second verify result regarding the verify high level is a fail, like the memory cell connected to the bit line BLz, the voltage Vz (for example, 0.4 V) is applied to the bit line BLz to perform slow programming for the memory cell MC.

Thus, the slow-programmed memory cell is determined that programming therefor is completed without a verify operation being performed for the slow-programmed memory cell (step S17).

In a flash memory according to the present embodiment to which the QPW mode is performed, as described above, a verify operation is performed again for a memory cell having verify-passed at the verify high level.

Therefore, the flash memory according to the present embodiment can improve reliability of data of a flash memory to which the QPW mode is applied.

(1b-6) Sixth Example

A sixth example of the operation example of the memory device according to an embodiment will be described using FIGS. 22 and 23. FIG. 22 is a flowchart illustrating an operation of the flash memory according to the present embodiment. FIG. 23 is a timing chart schematically showing the voltage waveform (horizontal axis: time, vertical axis: potential) of each interconnect during write operation of the operation example of the flash memory according to the present embodiment. FIG. 22 is a flowchart showing a process on a certain memory cell by focusing on the memory cell and bit line.

In writing of data in QPW mode, after slow programming for a memory cell having failed in the second verification at the verify high level, program verification may be performed for the memory cell.

In the write loop LP<i+2>, as shown in FIGS. 22 and 23, verification of the verify high level is performed again for memory cells having verify-passed once regarding the verify high level like the memory cells connected to the bit lines BLy, BLz (step S16).

If the second verify result regarding the verify high level for a certain memory cell is a pass, as described above, programming of data for the memory cell is completed (step S17).

If, for example, like the memory cell connected to the bit line BLz, the second verify result regarding the verify high level is a fail, slow programming is performed for the memory cell in the next write loop LP<i+3>. (step S18A).

In the write loop LP<i+3>, verification of the verify high level is performed for the slow-programmed memory cell (step S16).

If, in the verify operation after the slow programming, the slow-programmed memory cell verify-passes regarding the verify high level, the memory cell is set to a program inhibited state to complete programming for the memory cell (step S17).

If, by contrast, the slow-programmed memory cell verify-fails regarding the verify high level, slow programming is performed in the next write loop LP<i+4> (step S18A) and program verification is performed again for the memory cell (step S16).

The slow programming (step S18) and verification using the verify high level (step S14) are repeatedly performed for the memory cell to be slow-programmed until the verify result regarding the verify high level passes twice.

Accordingly, a flash memory according to the present embodiment can improve reliability of data.

(1c) Conclusion

In a memory cell used for a flash memory, the capture of charges and desorption of captured charges at a trap level of a gate insulating film, movement of charges between memory cells, or movement (for example, desorption) of charges inside the charge storage layer may occur. As a result, the threshold voltage of a memory cell may be changed to a value different from the value corresponding to data to be stored. Such unintended changes of the threshold voltage of the memory cell may occur in the memory cell into which data is being written in a relatively short period like after a program operation or a verify operation.

In a flash memory according to the present embodiment and a memory system, verification regarding the threshold voltage of a memory cell is performed again for memory cells whose verify result is a pass (memory cells having reached the threshold voltage corresponding to data to be written or memory cells set to a program inhibited state based on the verify result) during write operation of data.

Accordingly, a flash memory according to the present embodiment detects an error (error during programming) resulting from the fall of the threshold voltage that occurs during write operation. If a memory cell having a threshold voltage fallen below the verify level of data to be written is detected by a re-verify operation, the flash memory according to the present embodiment performs a program operation for the memory cell.

In the present embodiment, verification is performed again when a certain period Tx passes after the result of a verify-pass is obtained. As a result, compared with a case in which the threshold voltage of a memory cell is verified immediately after a program operation, the flash memory according to the present embodiment can re-verify the threshold voltage of a memory cell when the state of charges in the charge storage layer has converged to a relatively stable state.

Then, by performing a program operation again for the memory cell whose threshold voltage has fallen during write operation, the flash memory according to the present embodiment can inhibit the width of the threshold distribution of the state corresponding to data to be written from broadening due to the fall of the threshold voltage. Accordingly, the flash memory according to the present embodiment can inhibit an error from occurring in data.

Therefore, as described above, a flash memory according to the present embodiment and a memory system can improve reliability of data.

(2) Second Embodiment

A memory device according to a second embodiment and a memory system will be described with reference to FIGS. 24 to 33.

(2a) Basic Example

A basic example of the memory device according to the present embodiment will be described with reference to FIGS. 24 and 25. FIGS. 24 and 25 are flowcharts illustrating a basic example of the memory device according to the present embodiment.

As shown in FIG. 24, based on a command from a memory controller 5, a flash memory 1 starts writing of data from the memory controller (step S20). The flash memory 1 performs a program operation for a memory cell to program data of a certain state (hereinafter, called an X state) (step S21).

After the program operation, the flash memory 1 performs a verify operation using a first verify level VV1 (step S22).

Based on the result of the verify operation using the first verify level VV1, the flash memory 1 determines whether the memory cell MC has completed programming regarding data to be written (step S23).

If the memory cell verify-fails regarding the first verify level VV1, the program operation (step S21) and the verify operation (step S22) are performed again.

If the memory cell verify-passes regarding the first verify level VV1, the flash memory 1 puts the memory cell into a program inhibited state (step S24).

The flash memory 1 performs a verify operation regarding the threshold voltage state of the memory cell after programming is completed using the second verify level VV2 for the memory cell set to the program inhibited state (step S25). For example, the second verify level VV2 has a voltage value equal to the first verify level VV1 or less and higher than the read level of data to be written.

Based on the result of the verify operation using the second verify level VV2, whether the memory cell MC verify-passes regarding data to be written is determined (step S26).

If the memory cell MC has verify-passed regarding the second verify level VV2, writing of data into the memory cell MC is completed.

If the memory cell has verify-failed regarding the second verify level VV2, the flash memory 1 performs a program operation (hereinafter, also called a reprogram operation) of data to be held for the memory cell MC (step S27). With the execution of the reprogram operation, the flash memory 1 determines that writing of data into the verify-failed memory cell regarding the second verify level VV2 is completed.

FIG. 25 shows a modification of the operation example in FIG. 24.

As shown in FIG. 25, after reprogramming for the memory cell is performed (step S27X), a verify operation using the second verify level may be performed for the memory cell for which the reprogramming has been performed. The reprogramming is repeatedly performed until the reprogrammed memory cell verify-passes regarding the second verify level.

As shown in FIGS. 24 and 25, the flash memory according to the present embodiment performs a verify operation using the second verify level VV2 (VV2≤VV1) for a memory cell having verify-passed once regarding the first verify level VV1 after a certain period Tx undergoing a program inhibited state. Therefore, the flash memory according to the present embodiment performs a verify operation regarding the lower limit of the threshold distribution (lower hem of the threshold distribution) corresponding to data to be written for a memory cell having reached the threshold voltage corresponding to data to be written once.

Accordingly, the flash memory according to the present embodiment can detect a defect in which the threshold voltage of the memory cell falls from the value corresponding to data to be written during write operation of data. The flash memory according to the present embodiment can inhibit an error from occurring in data to be held by the memory cell by performing a program operation again for the memory cell in which the threshold voltage has fallen.

Therefore, the flash memory according to the present embodiment can improve reliability of data.

(2b) Operation Examples

Write operations of a memory device according to the second embodiment will be described with reference to FIGS. 26 and 32.

(2b-1) First Example

Figure 27:
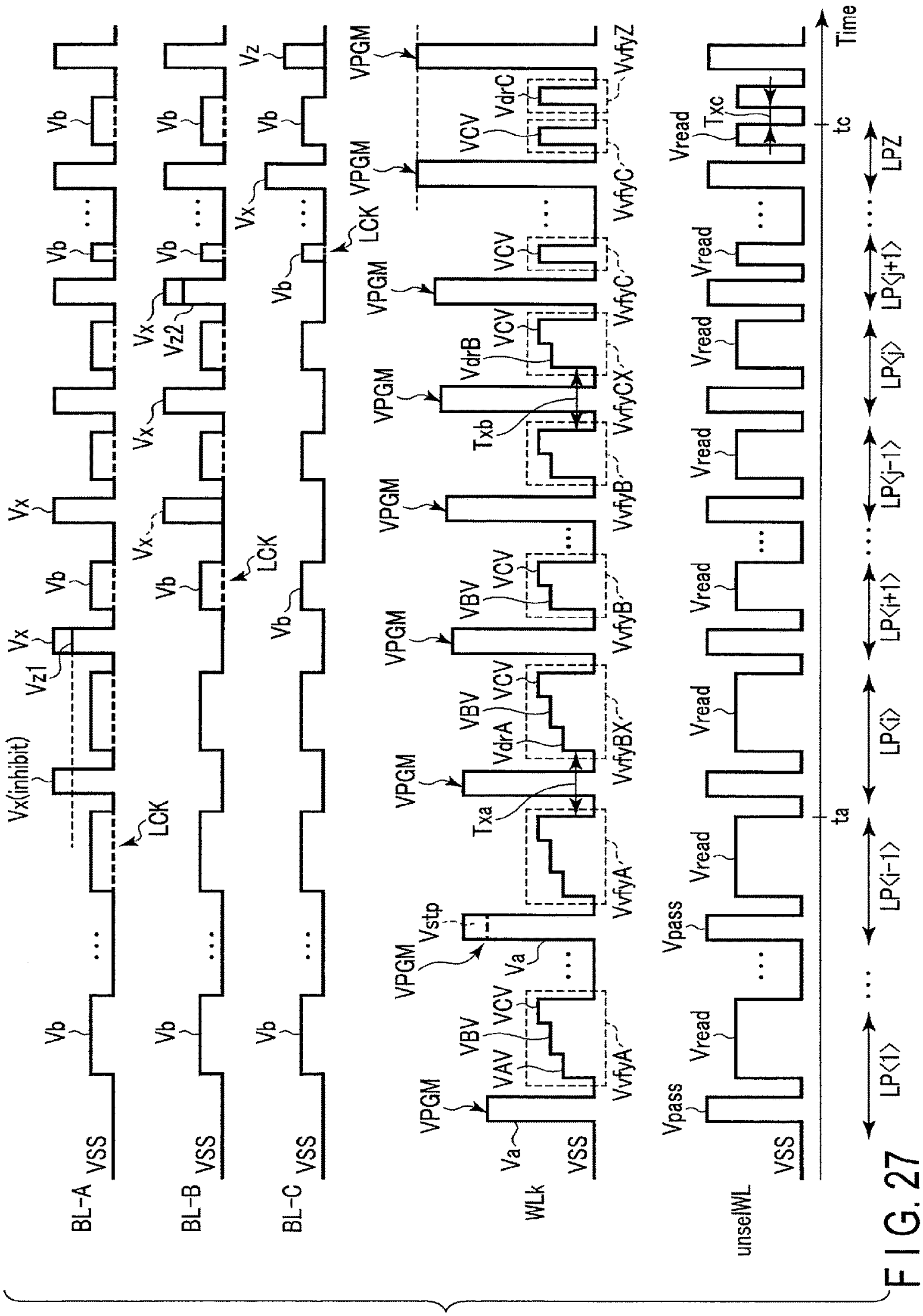
FIG. 27 is a timing chart showing an operation example of the memory device according to the second embodiment.

A first example of the operation example of a memory device (for example, a NAND flash memory) according to the present embodiment will be described with reference to FIGS. 26 and 27. FIG. 26 is a flowchart illustrating an operation of the flash memory according to the present embodiment. FIG. 27 is a timing chart schematically showing the voltage waveform (horizontal axis: time, vertical axis: potential) of each interconnect during write operation of the operation example of the flash memory according to the present embodiment. FIG. 26 is a flowchart schematically showing an overall flow of the write operation of data on a certain state corresponding to data to be written.

In a NAND flash memory (memory device) according to the second embodiment, programming of data of a plurality of states is performed in parallel. For example, when writing data for two pages in the full sequence method or writing an upper page in the LM (lower at middle) method, programming of the plurality of states is performed simultaneously. In this case, programming of data is completed in the order from data of a lower state (low threshold voltage) toward data of an upper state (high threshold voltage).

In the present embodiment, after programming of the first state is completed, verification of the first state whose programming has been completed is performed, in addition to verification of an upper state being programmed, during verify operation of the write loop of the state higher than the first state (X state).

The flash memory according to the present embodiment can detect a defect in which the threshold voltage of the memory cell falls from the value corresponding to data to be written during write operation of data. The flash memory according to the present embodiment performs a program operation for a memory cell of the first state whose threshold voltage has fallen during program period of an upper state.

As shown in FIGS. 26 and 27, a sequencer 19 at some time starts writing of data corresponding to each of a plurality of states into the flash memory of MLC (step S20A). Programming of data corresponding to the A state, the B state, and the C state is simultaneously performed when data of two pages in full sequence format of a flash memory of MLC or data of an upper page in LM format is written. A memory cell of the Er state is set to a program inhibited state.

In the first write loop LP<1>, like in the first embodiment, the sequencer 19 applies the program voltage VPGM to the selected word line WLk (step S21A). Accordingly, charges are injected into the charge storage layer in a memory cell to be programmed. In a period before programming of the A state is completed, the program voltage VPGM is set to a voltage value such that the threshold voltage of the memory cell does not exceed the value corresponding to the A state due to injection of charges into the charge storage layer.

After the program voltage VPGM is applied, the sequencer 19 applies the verify voltage Vvfy to the selected word line WLk to perform a verify operation for the memory cell (step S22A). Accordingly, whether the memory cell verify-passes regarding data to be written is detected.

In a period before programming of the A state is completed, the verify voltage VvfyA includes the verify levels VAV, VBV, VCV of the A state, the B state, and the C state.

Based on the result of the verify operation, the sequencer 19 determines whether programming of the X state (here, the A state), which is the lowest among states currently being programmed, is completed (step S23A).

When a memory cell having verify-failed regarding the A state is detected (No in step S23A), a program operation is performed using the program voltage VPGM obtained by adding a step-up voltage Vstp in the write loop LP<2> after the write loop LP<1>. In the write loop LP<2>, a verify-passed memory cell is set to a program inhibited state. After the program operation, a verify operation is performed to determine whether writing of data of the A state is completed.

For example, in the (i−1)-th write loop LP<i−1> (time ta), the sequencer 19 detects the completion of programming of the A state based on the result of the verify operation (data in the latch circuit).

If the completion of programming of the A state is detected (Yes in step S23A), the sequencer 19 puts the memory cell of the A state for which programming is completed into a program inhibited state in the write loop LP<i> to be performed next (step S24A). If programming of the B and C states higher than the A state is incomplete, programming of the B and C states is continued in write loops of the write loop LP<i−1> and thereafter.

In the i-th write loop LP<i>, the program voltage VPGM is applied to the selected word line WLk for programming of the B state and the C state.

After the program voltage VPGM is applied, the verify voltage VvfyBX is applied to the selected word line WLk to determine whether the memory cell verify-passes (steps S25A, S26A).

In the present embodiment, like the example shown in FIG. 27, the verify voltage VvfyBx includes, in addition to the verify levels VBV, VCV concerning the B and C states, a verify level VdrA concerning the A state in the verify operation of the first write loop LP<i> after programming of the A state is completed.

The value of the verify level VdrA of the A state in a program period of the B and C states (period after programming of the A state is completed) is different from, for example, the verify level VAV of the A state. The verify level VdrA is lower than the verify level VAV and higher than the read level VAR. The verify level VdrA may have substantially the same voltage value as the verify low level VAL of the A state in QPW mode. Incidentally, the verify level VdrA may have the same value as the verify level VAV for programming of the A state.

Thus, in the flash memory 1 according to the present embodiment, after programming of the A state is completed, verification of the A state is performed again for all memory cells that should hold data of the A state during programming of a state higher than the A state. Accordingly, the threshold voltage of memory cells that should hold data of the A state is re-verified when the period Tx passes after programming of the A state is completed.

The (i+1)-th write loop LP<i+1> is performed after program verification for memory cells of the A state for which programming is completed and program verification of the state being programmed.

In the write loop LP<i+1>, a program operation is performed for memory cells that should hold data of the B and C states.

In the write loop LP<i+1>, memory cells of the A state having verify-passed are set to a program inhibited state based on the verify result of memory cells of the A state using the verify level VdrA. Accordingly, programming for verify-passed memory cells is terminated (Yes in step S26A).

It is assumed that a certain memory cell of the A state verify-fails in the verify result of memory cells of the A state using the verify level VdrA. In this case (No in step S26A), a reprogram operation is performed for verify-failed memory cells of the A state simultaneously with programming of data for memory cells of the B and C states in the (i+1)-th write loop LP<i+1> (step S27A).

When a reprogram operation for memory cells of the A state is performed in a program period of a state higher than the A state, a reprogram operation is performed for verify-failed memory cells of the A state using the program voltage to shift the threshold voltage to the voltage value corresponding to the B or C state by the potential of a bit line BL-A of memory cells of the A state being controlled.

For example, as shown in FIG. 27, the voltage VSS is applied to bit lines BL-B, BL-C corresponding to memory cells to be programmed of the B and C states. The voltage Vx is applied to bit lines BL-A, BL-B, BL-C of memory cells in a program inhibited state and verify-passed memory cells. At the same time, a voltage Vz1 is applied to the bit line BL-A corresponding to verify-failed memory cells. The voltage Vz1 is higher than the voltage VSS and lower than the voltage Vx. Accordingly, slow programming is performed for verify-failed memory cells of the A state during program operation of a state higher than the A state.

Thus, during program operation of the B and C states, which are higher than the A state, the potential difference between the selected word line WLk and a semiconductor area (channel) in verify-failed memory cells of the A state is smaller than that between the selected word line WLk and a semiconductor area in programmable memory cells of the B and C states.

Therefore, even if the program voltage VPGM that may allow the threshold voltage of a memory cell to exceed the A state is applied to the selected word line WLk, the amount of charges injected into a verify-failed memory cell of the A state is made smaller than that of charges injected into a memory cell to be programmed of the B state by controlling the potential of the bit line BL. In this manner, the amount of charges injected into verify-failed memory cells of the A state is controlled in a program period of the B state and the C state.

As a result, over-programming of memory cells of the A state is prevented. Incidentally, when a reprogram operation is performed for verify-failed memory cells of the A state, the ground voltage VSS may be applied to the bit line BL.

As described above, the threshold voltage of memory cells of the A state detected to have verify-failed in a program period of a state higher than the A state is shifted to the value corresponding to the A state.

In the write loop LP<i+1>, a verify operation is performed. The verify voltage VvfyB is applied to the selected word line WLk. The verify voltage VvfyB includes the verify levels VBV, VCV of the B state and the C state. In the second and subsequent write loops in program periods of the B state and the C state, the verify voltage VvfyB does not include the verify levels VAV, VdrA regarding the A state.

Thus, program verification is not performed for memory cells of the A state for which slow programming has been performed in a program period of the B state (and the C state).

Then, the program operation and the verify operation are repeatedly performed for memory cells into which data of the B state and the C state should be written.

For example, in the (j−1)-th write loop LP<j−1> (time tb), programming of the B state is determined to have been completed based on the result of the verify operation.

Also for memory cells of the B state, like memory cells of the A state, program verification after programming is completed is performed. In this case, memory cells of the B state (and the A state) are set to a program inhibited state in the write loop LP<j> after the write loop LP<j−1> (step S24A). Then, the program operation is continued to write data into memory cells of the C state.

In the j-th write loop (first write loop in programming of the C state) LP<j>, the program voltage VPGM for programming of the C state is applied to the selected word line WLk. At this point, the voltage Vx is applied to the bit line BL-B of memory cells of the B state.

After the program voltage VPGM is applied, a verify voltage VvfyCX is applied.

In the present embodiment, the verify voltage VvfyCX includes, in addition to the verify level VCV concerning the C state, a verify level VdrB concerning the B state during the first verify operation after programming of the B state is completed. Accordingly, the threshold voltage of memory cells that should hold data of the B state after programming is completed is re-verified (step S25A). Accordingly, whether memory cells of the B state verify-pass is determined (step S26A).

The value of the verify level VdrB of the B state in a program period of the C state (after programming of the B state is completed) is different from, for example, the verify level VBV of the B state. In this case, the voltage value of the verify level VdrB is lower than the verify level VBV and higher than the read level VBR. The verify level VdrB may have substantially the same voltage value as the verify low level of the B state in QPW mode. Incidentally, the verify level VdrB may have the same value as the verify level (verify high level) VBV.

Thus, in a flash memory according to the present embodiment, verification of the B state is performed during programming of the C state. Accordingly, the threshold voltage of memory cells that should hold data of the B state is verified when a period Txb passes after programming of the B state is determined to have been completed.

In the write loop LP<j+1> after the write loop LP<j>, program operation is performed.

If no verify-failed memory cell of the B state regarding the verify level VdrB is detected (Yes in step S26A), programming of the B state for verify-passed memory cells is not performed in the write loop LP<j+1>. If a verify-failed memory cell of the B state regarding the verify level VdrB is detected (No in step S26A), a reprogram operation is performed for the verify-failed memory cell of the B state simultaneously with programming of the C state in the write loop LP<j+1> (step S27A). Accordingly, the threshold voltage of memory cells that should hold data of the B state is shifted to the value corresponding to the B state.

When a reprogram operation (slow programming) for memory cells of the B state is performed in a program period of the C state, a voltage Vz2 is applied to the bit line BL-B connected to the memory cells. The voltage Vz2 is higher than the voltage VSS and lower than the voltage Vx. The voltage value of the voltage Vz2 may be higher than that of the voltage Vz1.

Accordingly, the potential difference between the selected word line WLk and a semiconductor area (channel) in verify-failed memory cells of the B state is smaller than that between the selected word line WLk and a semiconductor area in memory cells to be programmed of the C state. As a result, over-programming of memory cells of the B state is prevented during program operation of the C state.

In the write loop LP<j+1>, a verify operation is performed. A verify voltage VvfyC is applied to the selected word line WLk. The verify voltage VvfyC includes the verify level VCV of the C state. In the second and subsequent write loops in a program period of the C state, the verify voltage VvfyC does not include the verify level regarding the B state (and the A state). Thus, verification is not performed for memory cells of the B state for which slow programming has been performed in a program period of the C state.

Then, the program operation and the verify operation regarding the C state are repeatedly performed. In the write loop after writing of the B state is completed, in addition to program verification of the B state, program verification of the A state and a reprogram operation based on the verify result thereof may be performed.

For example, in a write loop LPZ, programming of the C state is determined to have been completed by a verify operation regarding the C state. Also regarding all memory cells that should hold data of the C state, like memory cells of the A and B states, verification after programming is completed is performed (steps S25A, S26A).

In this case, a verify voltage VvfyZ is applied to the selected word line WLk after a period Txc passes from some time tc when programming of the C state is determined to have been completed.

The verify voltage VvfyZ includes a verify level VdrC. The value of the verify level VdrC may be different from that of the verify level VCV of the C state. For example, the voltage value of the verify level VdrC is lower than the verify level VCV and higher than the read level VCR. The verify level VdrC may have substantially the same voltage value as the verify low level VCL of the C state in QPW mode. Incidentally, the verify level VdrC may have the same value as the verify level VCV.

The threshold voltage of memory cells of the C state after programming is completed is thereby verified.

If a memory cell of the C state is determined to have verify-passed by applying the verify voltage VvfyZ, programming for the memory cell is completed.

If a memory cell of the C state is detected by applying the verify voltage VCdr, a reprogram operation of the C state is performed for verify-failed memory cells.

If, after the verification using the verify level VdrC, programming of the C state is performed again, the voltage VSS is applied to, among bit lines BL-C corresponding to memory cells of the C state, the bit line BL-C of verify-failed memory cells. The voltage Vx is applied to bit lines BL-A, BL-B, BL-C corresponding to memory cells in a program inhibited state (programming completed and verify-passed). The program voltage VPGM is applied to the selected word line WLk.

When a program operation is performed for memory cells of the C state after programming is completed (step S27A), the voltage value of the program voltage VPGM is set to that of the program voltage VPGM used for program operation before verification regarding the verify level VdrC.

Incidentally, in a program operation after the verification using the verify level VdrC, a step-up voltage may be added to the program voltage. In this case, slow programming may be performed for verify-failed memory cells. To perform slow programming, a voltage Vx3 having a certain voltage value is applied to the bit line BL-C for verify-failed memory cells of the C state. The voltage value of the voltage Vx3 is lower than the voltage Vx and higher than the voltage VSS.

After the program operation for verify-failed memory cells regarding the verify level VdrC is performed, writing of data of a flash memory according to the present embodiment is completed.

Incidentally, in the verification of memory cells after programming of the C state is completed, verification to re-verify the threshold voltage may be performed after memory cells of the C state are once put into a program inhibited state in a program operation. Also, verification of at least one of the A state and the B state may be performed again in a verify operation after programming of the C state is completed.

Thus, in a flash memory according to the present embodiment, a verify operation is performed for memory cells for which programming of data of a certain state (X state) is completed in a program period of data of a state ((X+1) state) higher than the state for which programming is completed. The flash memory according to the present embodiment, like in the first embodiment, re-verifies the threshold voltage of memory cells having verify-passed (programming completed) once.

Accordingly, the flash memory according to the present embodiment can detect the fall of the threshold voltage of a memory cell caused in a relatively short period of time. Then, if, among memory cells whose threshold voltage is determined to have reached the value corresponding to data to be written, a memory cell whose threshold voltage has fallen below the value corresponding to data to be written is detected, the flash memory according to the present embodiment performs rewriting of data into the memory cell.

As a result, the flash memory according to the present embodiment can make the width of the threshold distribution of a state corresponding to data to be written smaller so that an error can be prevented from occurring in data.

Therefore, as described above, the flash memory according to the present embodiment can improve reliability of data.

(2b-2) Second Example

A second example of the operation example of the flash memory according to the present embodiment will be described with reference to FIGS. 28 and 29. FIG. 28 is a flowchart illustrating an operation of the flash memory according to the present embodiment. FIG. 29 is a timing chart schematically showing the voltage waveform (horizontal axis: time, vertical axis: potential) of each interconnect during write operation of the operation example of the flash memory according to the present embodiment. FIG. 28 is a flowchart schematically showing an overall flow of the write operation of data on each state corresponding to data to be written.

When, in a write period of data of a state ((X+1) state) higher than the X state for which the completion of programming is detected, verification of the threshold voltage of memory cells regarding the X state is performed, programming for memory cells of the X state may repeatedly be performed until verify-failed memory cells of the X state verify-pass.

As shown in FIGS. 28 and 29, after programming of the A state is completed (Yes in step S23), memory cells of the A state (X state) are set into a program inhibited state and write loops are performed for programming of the B state and the C state ((X+1) state) (step S24A).

In the write loop LP<i>, after the program voltage VPGM is applied, a verify voltage VbfyBX is applied to the selected word line WLk to perform a verify operation (step S25A).

A memory cell of the A state for which writing of data is determined to have been completed is determined whether to verify-pass by the verify level VdrA in the verify voltage VvfyBX (step S26A).

In the write loop LP<i+1>, a reprogram operation (slow programming) is performed for verify-failed memory cells of the A state regarding the verify level VdrA, along with programming of the B and C states (step S27B).

In a verify operation of the write loop LP<i+1>, the verify voltage VvfyBX including the verify level VdrA is applied to the selected word line WLk again.

At this point, the voltage Vb is applied to the bit line BL-A of reprogrammed memory cells of the A state, in addition to the bit lines BL-B, BL-C of memory cells that have failed in verification regarding the B state and the C state. Accordingly, the threshold voltage of slow-programmed memory cells of the A state is verified in program periods of the B and C states.

If a reprogrammed memory cell of the A state verify-fails, in the next write loop LP<i+2>, slow programming and verification are performed for the verify-failed memory cell of the A state together with programming (normal programming) and verification for memory cells of the B and C states. The potential of the bit line BL-A of the memory cells MC to be slow-programmed regarding the second and subsequent slow programming may be set to a value higher than the potential of the bit line BL-A used for slow programming in the last write loop.

Regarding memory cells of the B state and the C state, like memory cells of the A state, if a verify-failed memory cell is detected in verification after the completion of writing of each state is determined, reprogramming and verification are repeatedly performed until the reprogrammed memory cell is determined to have verify-passed.

Thus, in the flash memory in the present example, slow programming and verification are repeatedly performed for the verify-failed memory cell of the X state regarding the X state until the memory cell of the X state, for which programming is once determined to have been completed, passes in the verify operation performed in a program period of the (X+1) state higher than the X state.

Accordingly, a flash memory according to the present embodiment can improve reliability of data.

(2b-3) Third Example

Figure 30:
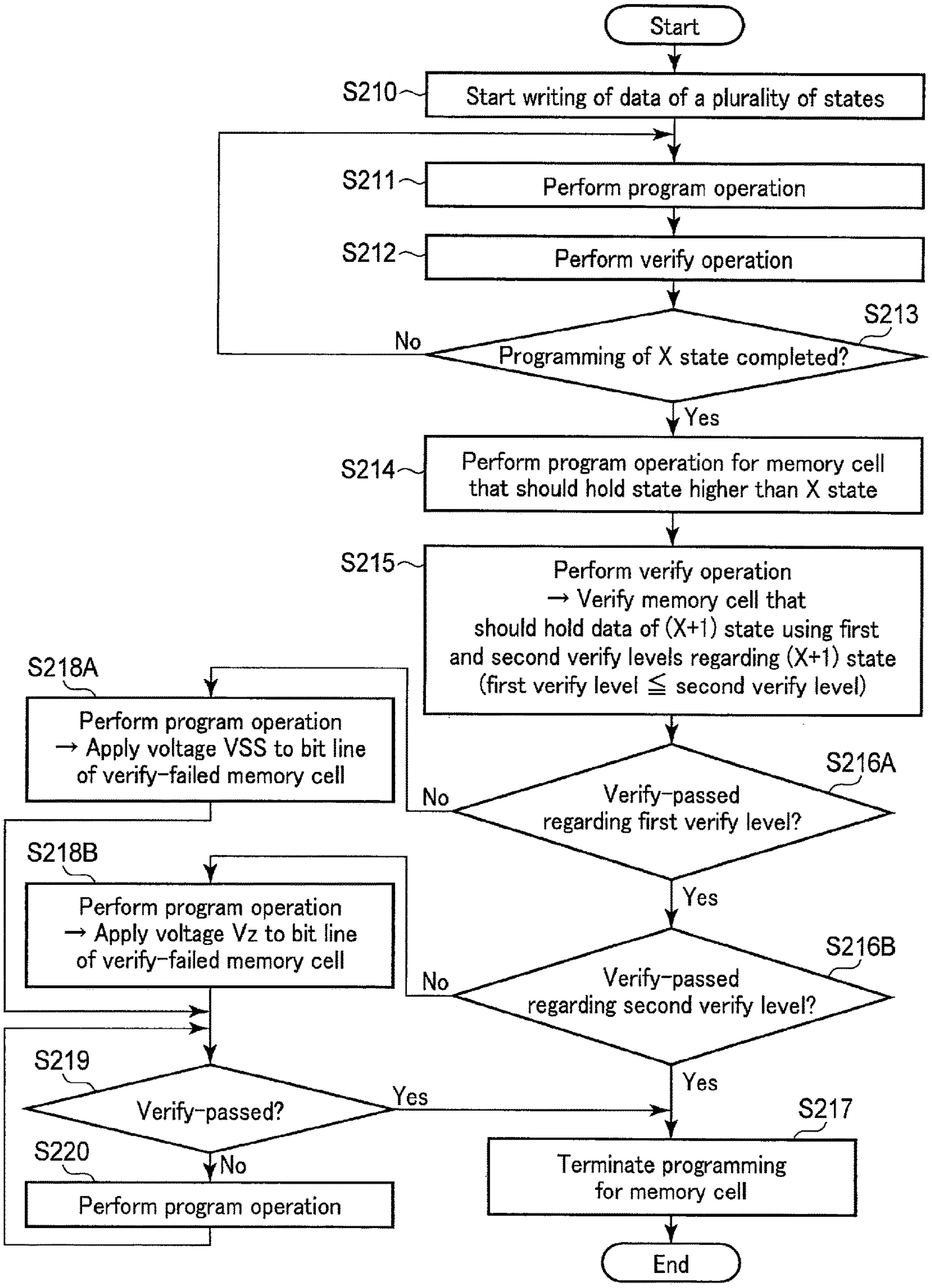
FIG. 30 is a flowchart showing an exemplary operation example of the memory device according to the second embodiment.
Figure 31:
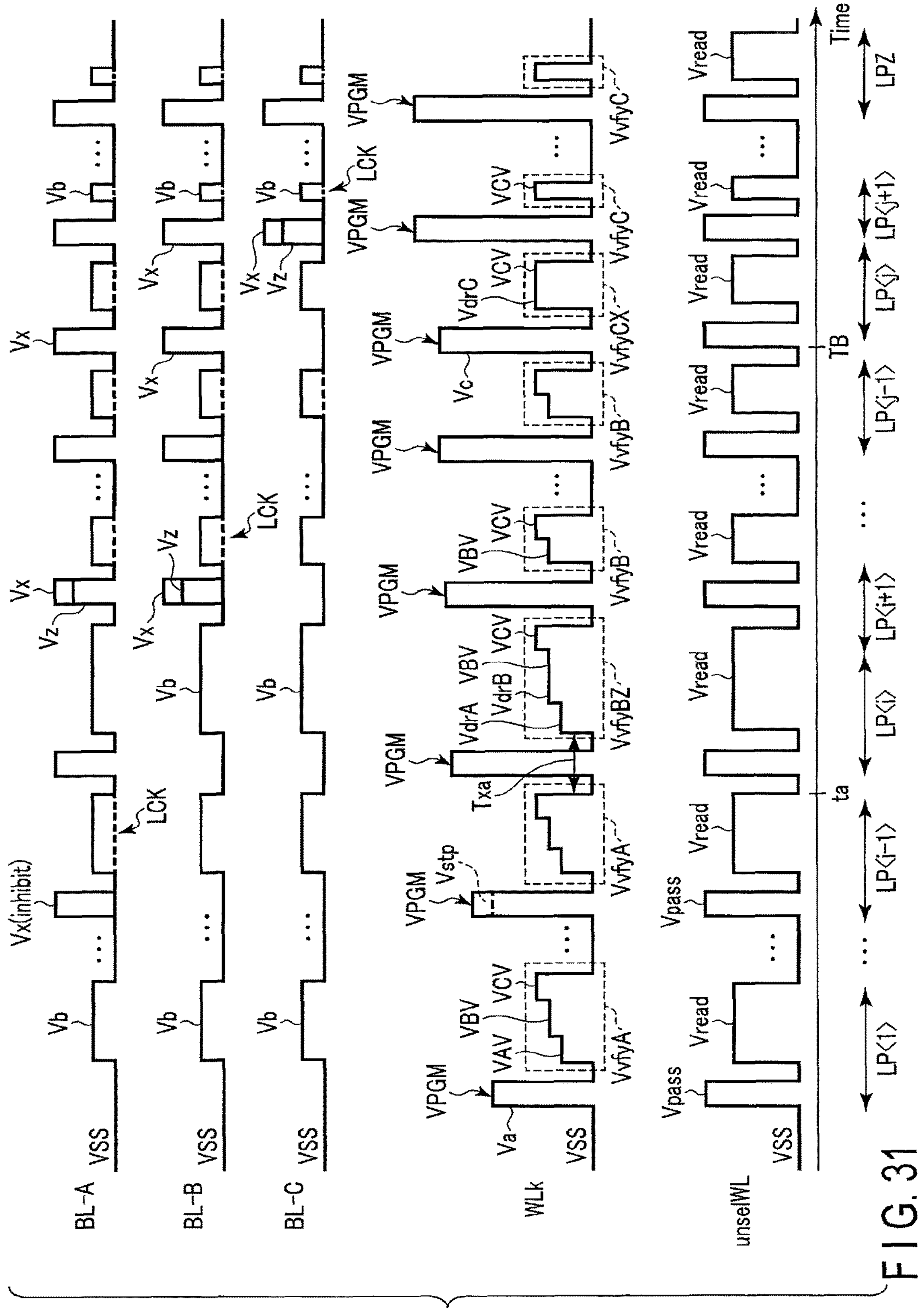
FIG. 31 is a timing chart showing an operation example of the memory device according to the second embodiment.

A third example of the operation example of the flash memory according to the present embodiment will be described using FIGS. 30 and 31. FIG. 30 is a flowchart illustrating an operation of the flash memory according to the present embodiment. FIG. 31 is a timing chart schematically showing the voltage waveform (horizontal axis: time, vertical axis: potential) of each interconnect during write operation of the operation example of the flash memory according to the present embodiment. FIG. 31 is a flowchart schematically showing an overall flow of the write operation of data regarding each state corresponding to data to be written.

As will be described below, the flash memory in the present example performs verification regarding the lower limit of the threshold distribution corresponding to data of a certain state in an initial stage of the program period of the certain state. Accordingly, the flash memory in the present example can inhibit over-programming of memory cells.

As shown in FIGS. 30 and 31, writing of data of a plurality of states is started simultaneously (step S210).

A program operation (step S211) and a verify operation (step S212) are performed. Whether programming of the X state (here, the A state), which is the lowest among a plurality of states being programmed, is completed is determined (step S213). If programming of the A state is not completed, a program operation and a verify operation are performed.

After programming of memory cells of the A state is completed, writing of data of the B state and the C state, which are higher than the A state, is continued.

In the first write loop LP<i> of the program period of the B and C states (after programming of the A state is completed), after a program operation (step S214), a verify voltage VvfyBZ is applied to the selected word line WLk (step S215).

The verify voltage VvfyBZ includes two verify levels VBV, VdrB regarding the B state ((X+1) state). The verify level (first verify level) VdrB has a voltage value higher than the verify levels VdrA, VAV and a voltage value equal to the verify level (second verify level) VBV or lower. The verify level VdrB is higher than the upper limit voltage value of the threshold distribution corresponding to data of the A state. For example, the verify level VdrB has a voltage value equal to the read level VBR or higher.

Whether memory cells that should hold data of the B state verify-pass is detected by the verify level VdrB (step S216A). Also, whether memory cells that should hold data of the B state verify-pass is detected by the verify level VVB (step S216B).

After the first write loop LP<i> in programming of a state equal to the B state or higher, the write loop LP<i+1> is performed.

In a verify-failed memory cell regarding two verify levels VdrB, VBV among memory cells to be programmed of the B state, the voltage VSS is applied to the bit line BL-B connected to the memory cell during program operation of the write loop LP<i+1> (step S218A). Accordingly, programming in normal mode is performed for the verify-failed memory cell regarding the verify levels VdrB, VBV.

In a verify-passed memory cell regarding the verify level VdrB among memory cells having failed at the verify level VBV, the voltage Vz is applied to the bit line BL-B connected to the memory cell during program operation of the write loop LP<i+1>. Accordingly, slow programming is performed for the memory cell corresponding to the bit line to which the voltage Vz is applied (step S218B).

In a verify-passed memory cell regarding the verify level VBV, the voltage Vx is applied to the bit line BL-B of the memory cell. Accordingly, a verify-passed memory cell regarding the verify level VBV is set to a program inhibited state (step S217).

Incidentally, even if a memory cell passes regarding the first verify level VdrB and fails regarding the second verify level VBV, the ground voltage VSS may be applied to the bit line BL-B corresponding to the memory cell to perform a program operation for the memory cell.

Thus, a program operation using the common program voltage VPGM can be performed for memory cells of the B state in mutually different program strengths (amount of injected charges into the charge storage layer) in accordance with the threshold voltage state of memory cells by the potential of the bit line being controlled in accordance with the verify result regarding the B state.

Incidentally, even if slow programming is performed for verify-passed memory cells of the B state regarding the verify level VdrB, the flash memory in the present example can perform slow programming for verify-failed memory cells of the A state regarding the verify level VdrA of the A state by controlling the potential of the bit line BL-A.

After the program operation (steps S218A, S218B), a verify operation is performed (step S219). In the verify operation, the verification of the verify level VdrB (and the verify level VdrA) may be omitted regarding the verification of the B state.

A program operation is performed in accordance with the verify result (S220).

Incidentally, the verify operation including the verify level VdrB and slow programming may repeatedly be performed until all memory cells into which data of the B state should be written verify-pass regarding the verify level VdrB.

After programming of the B state is completed, programming of the C state is performed (steps S213, S214).

A program operation and a verify operation are performed in a program period of the C state (steps S215, S216A, S216B). In a verify operation of the first write loop LP after programming of the B state is completed, like an operation in the program period of the B state, a verify voltage VvfyCZ includes two verify levels VCV, VdrC regarding the C state. The voltage value of the verify level VdrC is equal to the read level VCR or higher and equal to the verify level VCV or lower.

Normal programming is performed for failed memory cells regarding two verify levels of the C state (step S218A).

For example, slow programming is performed for verify-passed memory cells regarding the verify level VdrC among verify-failed memory cells regarding the verify level VCV (step S218B).

The write loop of the C state is repeatedly performed and whether the program period of the C state is completed is determined based on the verify result for memory cells of the C state (steps S219, S220).

With the completion of programming of the C state, writing of data of the flash memory is finished.

Incidentally, in a verify operation of the first write loop LP<1> regarding memory cells that should hold data of the A state, the verify operation may be performed for memory cells of the A state using two verify levels VdrA, VAV.

In a flash memory, properties may be different from memory cell to memory cell even if memory cells are connected to the same word line. In such a case, when the program voltage of a certain voltage value is applied, a memory cell whose threshold voltage is likely to rise (a memory cell whose writing speed is fast) and a memory cell whose threshold voltage is not likely to rise (a memory cell whose writing speed is slow) are present in a certain word line.

Thus, if a memory cell whose threshold voltage is likely to rise has a voltage value near the lower limit of the threshold distribution corresponding to data to be written during write operation of data, the threshold voltage of the memory cell may rise excessively when programming of data (injection of charges into the charge storage layer) is performed for the memory cell. Also, with an increasing number of times of write loop, the voltage value of a program voltage increases.

As a result, an error may be caused by over-programming in memory cells. Over-programming is a defect (data error) in which the threshold voltage of a memory cell exceeds the upper limit of the threshold distribution corresponding to data to be written. An error of data caused by over-programming cannot be corrected without performing an erase operation for memory cells.

In the present example, the flash memory according to the present embodiment verifies the threshold voltage state of a memory cell into which data of a certain state should be written using two verify levels (voltage values) set for the certain state in the initial stage of the program period of the certain state. Accordingly, the flash memory according to the present embodiment detects a memory cell that may be over-programmed.

The flash memory according to the present embodiment controls the program operation of a memory cell that may be over-programed in a stage in which, like the initial stage of programming of a certain state, the program voltage for a certain state is relatively low so that the threshold voltage of the memory cell falls within the range of the threshold voltage corresponding to data to be written. Accordingly, the flash memory according to the present embodiment can inhibit over-programming of memory cells.

Consequently, the flash memory according to the present embodiment can reduce the number of write loops by controlling programming in the initial stage of the program period.

Therefore, as described above, the flash memory according to the present embodiment can improve reliability of data.

(2b-4) Fourth Example

A fourth example of the operation example of the flash memory according to the present embodiment will be described using FIGS. 32 and 33. FIG. 32 is a flowchart illustrating the fourth example of the operation example of the flash memory according to the present embodiment.

When a verify operation for a memory cell of a certain state for which programming of data is completed is performed in the program period of an upper state, the potential of the bit line BL for slow programming may be controlled in accordance with the number of verify-failed memory cells (hereinafter, called the number of verify-fails) in the result of the verify operation of the certain state for which programming is completed.

As shown in FIG. 32, writing of data of a plurality of states is started simultaneously (step S230). A program operation (step S231) and a verify operation (step S232) are performed.

Whether programming of the X state (here, the A state), which is the lowest among a plurality of states being programmed, is completed is determined (step S233). If programming of the A state is not completed, a program operation and a verify operation are performed again.

After programming of the A state is completed, memory cells of the A state are set to a program inhibited state (step S234) and programming of data of the B state and the C state, which are higher than the A state, is continued.

In a certain write loop of the program period of the B and C states, verification including the second verify level VdrA regarding the A state is performed for memory cells of the A state, along with verification of the B and C states (step S235).

Based on the verify result, whether all memory cells of the A state verify-pass is determined (step S236).

If the verify-failed memory cell MC of the A state is not detected, the process for memory cells of the A state is completed without reprogram operation for memory cells of the A state.

If the verify-failed memory cell MC of the A state is detected, the number of verify-fails in the detected memory cell and a set value NA are compared (step S237). The set value NA is determined based on the result of experiment of flash memories and the result of test of flash memories when shipped.

The potential of the bit line is controlled based on the comparison result and a reprogram operation for verify-failed memory cells of the A state is performed. As described above, the reprogram operation for memory cells of the A state is performed simultaneously with a program operation of the B and C states.

If the number of verify-fails is equal to the set value NA or less, the potential of the bit line BL for slow programming is set to a first voltage value Vza (step S238-1).

If the number of verify-fails is larger than the set value NA, the potential of the bit line BL for slow programming is set to a second voltage value Vzb (step S238-2). The second voltage value Vzb is lower than the first voltage value Vza.

For example, the first voltage value Vza is a voltage value in the range of, for example, 0.25 V to 0.35 V and the second voltage value Vzb is a voltage value in the range of 0.15 V to 0.2 V.

The potential difference between the word line and channel in a memory cell of the bit line set to the second voltage value (for example, 0.2 V) Vzb becomes larger than the potential difference between the word line and channel in a memory cell of the bit line set to the first voltage value (for example, 0.3 V) Vza.

As a result, the amount of charges injected into the memory cell (charge storage layer) of the bit line BL-A set to the second voltage value Vzb becomes larger than that injected into the memory cell of the bit line BL-A set to the first voltage value Vza.

Thus, in the present example, if the number of verify-fails is equal to the set value NA or more, the potential is set to a value closer to the potential of the bit line of normal programming than a case when the number of verify-fails is smaller than the set value NA.

After slow programming for memory cells of the A state in accordance with the number of verify-fails, the reprogram operation of memory cells of the A state is finished without verification of the slow programming. However, programming of the B and C states is continued. The process shown in FIG. 32 is also performed on memory cells of the B and C states.

A state in which many verify-fails due to aging are present shows that the threshold voltage of a memory cell is likely to fall (charges are likely to desorb from the charge storage layer) as an overall trend of characteristics of a memory cell in a memory cell array.

An error of data in memory cells resulting from the fall of the threshold voltage can be suppressed by increasing the amount of injected charges in advance in consideration of, like in the present embodiment, the fall of the threshold voltage (desorption of charges from the charge storage layer) due to aging.

FIG. 33 is a flowchart illustrating a modification of the operation example of the flash memory according to the present embodiment shown in FIG. 32.

As shown in FIG. 33, after slow programming controlled in accordance with the number of verify-fails (steps S238-1A, S238-2A), a verify operation using the second verify level VdrA may be performed for the slow-programmed memory cell.

The flash memory according to the present embodiment can further improve reliability of data by, like the operation example of the flash memory in FIG. 33, program verification being performed for the slow-programmed memory cell.

Therefore, as described above, the flash memory according to the present embodiment can improve reliability of data.

(2c) Conclusion

In an operation in which writing of data of a plurality of states is performed simultaneously in a flash memory according to the present embodiment, a verify operation is performed again for memory cells of a lower state for which programming is completed in the program period of a certain state.

Accordingly, the flash memory according to the present embodiment can detect a memory cell in which the threshold voltage falls from the desired value during write operation.

The flash memory according to the present embodiment performs reprogramming for verify-failed memory cells regarding a lower state in the program period of a certain state. Accordingly, the flash memory according to the present embodiment can reset the threshold voltage of a memory cell to the desired value.

As a result, the flash memory according to the present embodiment can suppress broadening of the width of the threshold distribution of each state resulting from the fall of the threshold voltage of a memory cell and reduce data errors (for example, data errors resulting from the fall of the threshold voltage of a memory cell) caused in the write period of data.

Therefore, as described above, a memory device according to the present embodiment and a memory system can improve reliability of data.

(3) Third Embodiment

A memory device according to a third embodiment will be described with reference to FIGS. 34 and 40.

In a memory device (for example, a NAND flash memory) according to the present embodiment, a plurality of word lines are activated simultaneously during write operation so that writing of data into memory cells connected to each of the plurality of word lines is performed in parallel.

For example, the program voltage is applied to two selected word lines in mutually different timing. After the program voltage is applied to one word line, the program voltage is applied to the other word line. After the program voltage is applied to the other word line, the verify voltage is applied to one word line. Then, the verify voltage is applied to the other word line.

Accordingly, a flash memory according to the present embodiment (and a memory system) can secure a certain period between a program operation and a verify operation for a memory cell connected to a certain word line without pressure on the operating time regarding writing of data.

As a result, the flash memory according to the present embodiment can detect a defect in which the threshold voltage of a memory cell unintentionally changes during write operation of data and correct the detected defect.

Therefore, the flash memory according to the present embodiment can improve reliability of data.

In the present embodiment, to perform writing of data to a memory cell connected to one word line WLk and a memory cell connected to the other word line WLh in parallel, each sense amplifier unit 131 includes one or more latch circuits DL1, DL2 that holds data to be written into the memory cell of one word line WLk and one or more latch circuits DL1, DL2 that holds data to be written into the memory cell of the other word line WLh.

Hereinafter, a flash memory according to the present embodiment and a memory system will be described more concretely.

(3a-1) First Example

Figure 35:
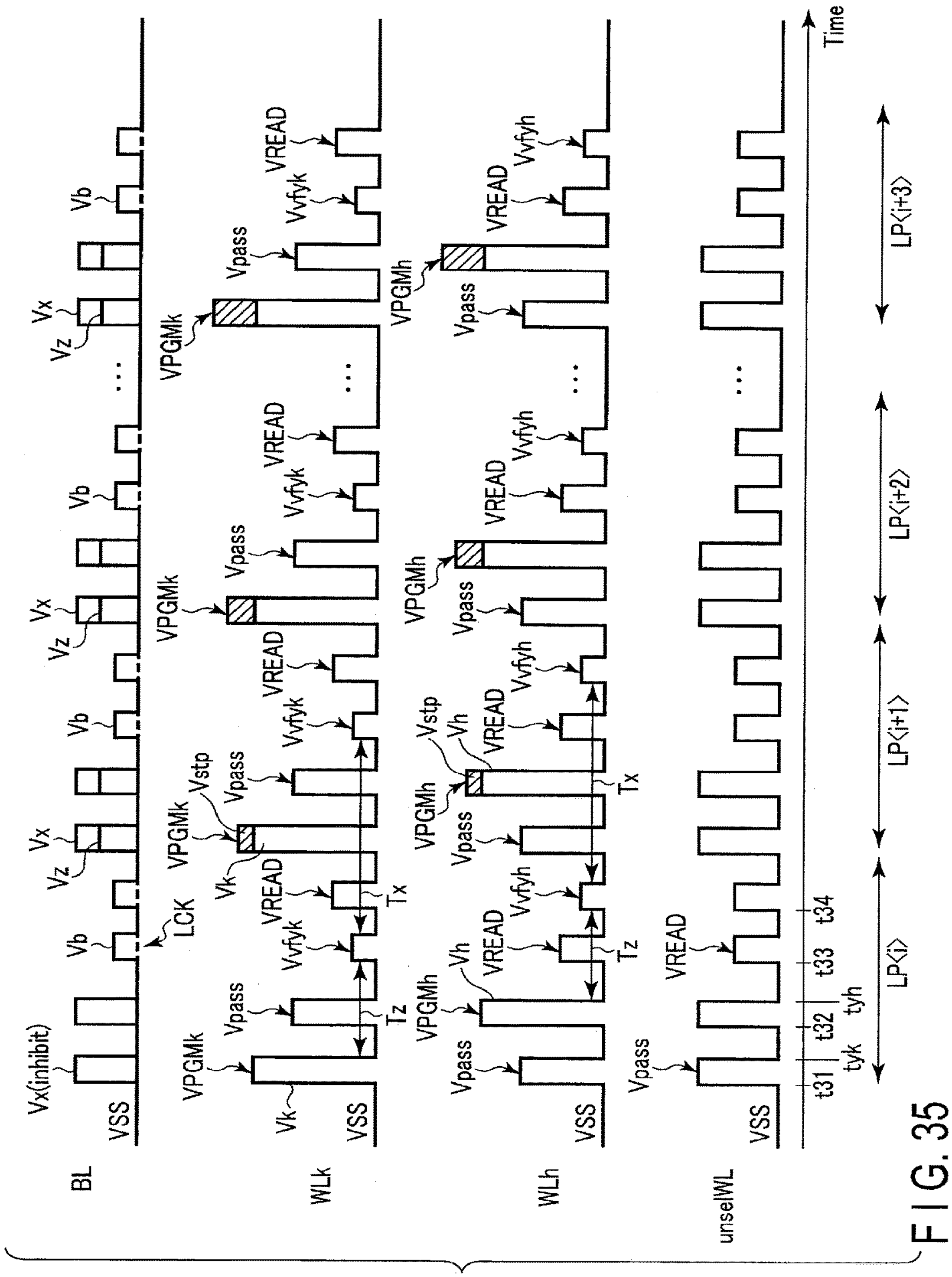

A first example of the operation example of the memory device according to the present embodiment will be described using FIGS. 34 and 35. FIG. 34 is a flowchart illustrating the first example of the operation example of the memory device according to the present embodiment. FIG. 35 is a timing chart schematically showing the voltage waveform (horizontal axis: time, vertical axis: potential) of each interconnect during write operation of the flash memory according to the present embodiment.

A flash memory 1 receives a command, a selected address, and data to be written from a memory controller 5. The command includes, for example, a signal indicating that an operation to be performed by the flash memory 1 includes performing writing of data into memory cells connected to two word lines respectively in parallel. For example, the selected address includes addresses allocated to two word lines WLk, WLh. The data includes data to be written into each of memory cells of the two word lines WLk, WLh.

As shown in FIGS. 34 and 35, a sequencer 19 activates a plurality (here, two) of word lines WLk, WLh (for example, h=k+1) simultaneously as the selected word lines based on the command and addresses from the memory controller 5 (step S30). Incidentally, the two selected word lines WLk, WLh activated simultaneously may be word lines adjacent to each other in a memory cell array (block) or word lines that are not adjacent to each other.

The sequencer 19 selects the two word lines WLk, WLh and performs the first write loop LPW<1> (LPW<i>). In the present embodiment, one write loop includes a program operation and a verify operation for one word line WLk and a program operation and a verify operation for the other word line WLh.

The potential of the bit line BL is controlled in accordance with data to be written into the memory cell MC. A voltage VSGD is applied to the select gate line SGD.

At time t31, the sequencer 19 applies a program voltage VPGMk to one selected word line WLk (step S31). Accordingly, a program operation is performed for the memory cell connected to the one selected word line WLk. In a period in which the program voltage VPGMk is applied to the selected word line WLk, the sequencer 19 applies an unselection voltage Vpass to the other selected word line WLh and unselected word lines unselWL.

At time t32, before a verify voltage is applied to the one word line WLk, the sequencer 19 applies a program voltage VPGMh to the other selected word line WLh (step S32). Accordingly, a program operation is performed for the memory cell connected to the selected word line WLh. At this point, the sequencer 19 applies the write pass voltage Vpass to the selected word line WLk and unselected word lines unselWL.

After the program voltage VPGMh is applied to the other word line WLh (after the write pass voltage Vpass is applied to the selected word line WLk), at time t33, the sequencer 19 applies a verify voltage Vvfyk to one selected word line WLk (step S33). Accordingly, a verify operation is performed for the memory cell connected to the selected word line WLk. At this point, the sequencer 19 applies the read pass voltage VREAD to the other selected word line WLh and unselected word lines unselWL.

After the verify voltage Vvfyk is applied to the one selected word line WLk, at time t34, the sequencer 19 applies a verify voltage Vvfyh to the other word line WLh (step S34). Accordingly, a verify operation is performed for the memory cell connected to the selected word line WLh. The sequencer 19 applies the read pass voltage VREAD to the one selected word line WLk and unselected word lines unselWL.

The sequencer 19 determines whether the memory cell connected to each of the selected word lines WLk, WLh verify-passes or verify-fails based on the result of the verify operation (step S35).

After a certain period Tz passes from the program operation, a verify operation is performed in each of the selected word lines WLk, WLh. In one write loop, the unselection voltage Vpass is applied to the selected word line WLk (WLh) in the period Tz between the application of the program voltage VPGMk (VPGMh) and the verify voltage Vvfyk (Vvfyh) to the memory cell of the selected word line WL. Regarding the selected word line WLk, the period Tz corresponds to a period from a fall time tyk of the program voltage VPGMk and to a rise time t33 of the verify voltage Vvfyk across an application period of the unselection voltage. Regarding the selected word line WLk, the period Tz corresponds to a period from a fall time tyh of the program voltage VPGMk and to a rise time t34 of the verify voltage Vvfyk.

If a verify-failed memory cell exists based on the result of the verify operation, the sequencer 19 performs the second write loop LPW<2> (LPW<i+1>) after the first write loop LPW<1>. Based on the result of the verify operation, the potential of the bit line BL is controlled.

In the second write loop LPW<2>, like the first write loop LPW<1>, the program voltage VPGMh is applied to the selected word line WLk and then, the program voltage VPGMh is applied to the selected word line WLh.

After the program operation for the memory cell of each of the word lines WLk, WLh, the verify voltage Vvfyk is applied to the selected word line WLk. After the verify operation for the memory cell of the word line WLk, the verify voltage Vvfyh is applied to the selected word line WLh.

In this manner, a plurality of write loops LPW<3> (LPW<i+2>), LPW<4> (LPW<i+3>), . . . is performed until the memory cell into which data should be written verify-passes in a write sequence of data and the program operation for the memory cell of the selected word line WLk and the program operation for the memory cell of the selected word line WLh are alternately performed.

Incidentally, a verify operation may be performed for a memory cell having verify-passed once. Also in the present embodiment, a period Tx is secured between two verify operations. If, in a verify operation performed again, the memory cell verify-fails, the voltage Vz is applied to a bit line Vz connected to the memory cell to perform a program operation (for example, slow programming) for the memory cell.

Like in the present example, a period to apply the program voltage VPGMh to the other word line WLh is secured between the application of the program voltage VPGMk and the application of the verify voltage Vvfyk to one word line WLk.

Thus, in one write loop, the period between the program operation and the verify operation for a certain selected word line can be made longer. Therefore, the flash memory according to the present embodiment can verify the threshold voltage of a memory cell after a period in which the threshold voltage of the memory cell converges to a certain value passes.

Accordingly, in the present example, the flash memory according to the present embodiment can detect by the verify operation any change of the threshold voltage of a memory cell resulting from movement of charges inside the charge storage layer (for example, desorption of charges from the charge storage layer) caused while data is being written.

Thus the flash memory according to the present embodiment can detect a memory cell whose threshold voltage has fallen with a relatively high degree of precision.

The flash memory according to the present embodiment selects two word lines simultaneously to perform writing of data into the memory cell of each word line in parallel. Accordingly, even if a relatively long time is set between the program operation and the verify operation, the flash memory according to the present embodiment can perform writing of data without pressure on the operating time and without making an overall length to write data into memory cells of two word lines WL longer.

Therefore, as described above, the flash memory according to the present embodiment can improve reliability of data.

(3a-2) Second Example

A second example of the operation example of the flash memory according to the present embodiment will be described using FIG. 36. FIG. 36 is a flowchart illustrating the second example of the operation example of the flash memory according to the present embodiment.

Like in the present example, the order of the program operation and the verify operation between the selected two word lines WLk, WLh may be interchanged while data is written.

In the i-th write loop LPW<i> (for example, i=1), as shown in FIG. 36, the program voltage VPGMk is applied to the selected word line WLk and then, the program voltage VPGMh is applied to the selected word line WLh. After the verify voltage Vvfyk is applied to the selected word line WLk and then, the verify voltage Vvfyh is applied to the selected word line WLh.

After the i-th write loop LPW<i>, the (i+1)-th write loop LPW<i+1> is performed. Here, the order of program operations is interchanged between the selected word line WLk and the selected word line WLh.

In the (i+1)-th write loop LPW<i+1>, at time t41, the program voltage VPGMh is applied to the selected word line WLh and the write pass voltage Vpass is applied to the selected word line WLk. Then, at time t42, the program voltage VPGMk is applied to the selected word line WLk and the write pass voltage Vpass is applied to the selected word line WLh.

Then, at time t43, the verify voltage Vvfyh is applied to the selected word line WLh. After the verify voltage Vvfyh is applied, at time t44, the verify voltage Vvfyk is applied to the selected word line WLk.

For example, regarding the selected word line WLk, a period Tx1 is set between the verify operation of the write loop LP<i> and the verify operation of the write loop LP<i+1>. For example, regarding the selected word line WLh, a period Tx2 is set between the verify operation of the write loop LP<i> and the verify operation of the write loop LP<i+1>. The period Tx1 is longer than the period Tx2.

After the (i+1)-th write loop LPW<i+1>, the (i+2)-th write loop LPW<i+2> is performed. In the (i+2)-th write loop LPW<i+2>, the operations for the selected word lines WLk, WLh are performed in the same order as that in the i-th write loop LPW<i>.

In the (i+2)-th write loop LPW<i+2>, the program voltage VPGMk is applied to the selected word line WLk and then, the program voltage VPGMh is applied to the selected word line WLh. After the verify voltage Vvfyk is applied to the selected word line WLk, the verify voltage Vvfyh is applied to the selected word line WLh.

After the (i+2)-th write loop LPW<i+2>, the (i+3)-th write loop LPW<i+3> is performed. In the (i+3)-th write loop LPW<i+3>, the program operation and the verify operation for the selected word lines WLk, WLh are performed in the same order as that in the (i+1)-th write loop LPW<i+1>.

Thus, the write loop started with the program operation of the selected word line (for example, the odd-numbered word line) WLk and the write loop started with the program operation of the selected word line (for example, the even-numbered word line) WLk+1 are alternately performed.

For example, when writing data into a flash memory, pulse widths of the program voltages VPGMk, VPGMh and those of the verify voltages Vvfyk, Vvfyh are different in accordance with data to be written into memory cells.

In the present example, the order of the program operation for the memory cell of the selected word line WLk and the program operation for the memory cell of the selected word line WLh is interchanged in each write loop.

Accordingly, the pulse widths of voltages applied to the two selected word lines WLk, WLh are different, the flash memory according to the present embodiment can level out a difference of operating periods between the program operation and the verify operation even if a difference of length of periods between the program operation and the verify operation arises between the two selected word lines WLk, WLh.

(3a-3) Third Example

A third example of the operation example of the flash memory according to the present embodiment will be described using FIGS. 37 to 39.

The write method called a pass write method may be applied to a flash memory. The pass write method includes foggy writing (rough writing) and fine writing (minute writing).

The foggy writing is a write mode in which the threshold voltage of a memory cell is shifted up to a certain level (for example, the verify low level) set for data to be written by a large shift amount for the value corresponding to data to be written. The fine writing is a write mode in which the threshold voltage of a memory cell is shifted up to the value corresponding to data to be written by a shift amount smaller than that of the threshold voltage of foggy writing. In writing of data into the flash memory, foggy writing (foggy mode) is performed and then, fine writing (fine mode) is performed.

FIG. 37 is a timing chart schematically showing the voltage waveform (horizontal axis: time, vertical axis: potential) of each interconnect during write operation of the flash memory according to the present embodiment.

As shown in FIG. 37, after two word lines WLk, WLh, are selected, one or more write loops LPfg for foggy writing are performed for the memory cell connected to the selected word line WLk.

In a period FGP1 of foggy writing into the memory cell of the selected word line WLk, the program voltage VPGMk is applied to the selected word line WLk. After the program voltage VPGMk is applied, the verify voltage Vvfyk is applied to the selected word line WLk. Accordingly, whether the memory cell connected to the selected word line WLk verify-passes is determined. The verify voltage Vvfyk includes a verify level (verify low level) for foggy writing.

In the period FGP1, the write loop LPfg for foggy writing into the memory cell of the selected word line WLk is repeatedly performed until the threshold voltage of the memory cell of the selected word line WLk becomes the verify low level set for data to be written or more.

In the period FGP1 of foggy writing into the memory cell of the selected word line WLk, the program operation and the verify operation for the memory cell of the selected word line WLh are not performed.

After foggy writing into the selected word line WLk is completed, one or more write loops LPfg for foggy writing are performed for the memory cell connected to the selected word line WLh.

In a period FGP2 of foggy writing into the memory cell of the selected word line WLh, the program voltage VPGMh is applied to the selected word line WLh.

After the program voltage VPGMh is applied, the verify voltage Vvfyh is applied to the selected word line WLh to determine whether the memory cell connected to the selected word line WLh verify-passes. The verify voltage Vvfyh includes a verify level (verify low level) corresponding to data to be written in foggy writing.

In the period FGP2, the write loop LPfg for foggy writing into the memory cell of the selected word line WLh is repeatedly performed until the threshold voltage of the memory cell of the selected word line WLh becomes the verify low level set for data to be written or more.

In the period FGP2 of foggy writing into the memory cell of the selected word line WLh, the program operation and the verify operation for the memory cell of the selected word line WLk are not performed.

Thus, when two word lines WLk, WLh are selected, foggy writing into the memory cell of each of the word lines WLk, WLh is not performed in parallel for the two word lines WLk, WLh.

After foggy writing into the memory cell of each of the word lines WLk, WLh, in a period FNP for fine writing, fine writing into memory cells of the two word lines WLk, WLh is performed in parallel (substantially simultaneously).

In fine writing, the program voltages VPGMk, VPGMh are set to their initial values and a step voltage of a certain voltage value is added with the progress of the write loop. For example, in a write operation of the pass write method, the voltage value of the step-up voltage used for fine writing is smaller than the voltage value of the step-up voltage used for foggy writing.

In fine writing for two word lines WLk, WLh, in a first write loop LPfn<1> of fine writing, like the operation example in FIGS. 34 and 35, the program voltage VPGMh is applied to the word line WLh after the program voltage VPGMk is applied to the selected word line WLk and before the verify voltage Vvfyk is applied to the selected word line WLk. After the program voltage VPGMh is applied to the selected word line WLh, the verify voltage Vvfyk is applied to the selected word line WLk. Then, the verify voltage Vvfyh is applied to the selected word line WLh. After the verify voltages Vvfyk, Vvfyh are applied to the word lines WLk, WLh respectively, whether the memory cell verify-passes is determined based on the result of the verify operation.

Substantially the same operation as this write loop is repeatedly performed until the memory cell connected to each selected word line verify-passes.

Incidentally, in fine writing, for example, the voltage of a certain voltage value Vf ($0<Vf<x$) may be applied to the bit line BL. Also, the voltage value of the step-up voltage used for fine writing may be lower than the voltage value of the step-up voltage used for foggy writing.

Figure 38:
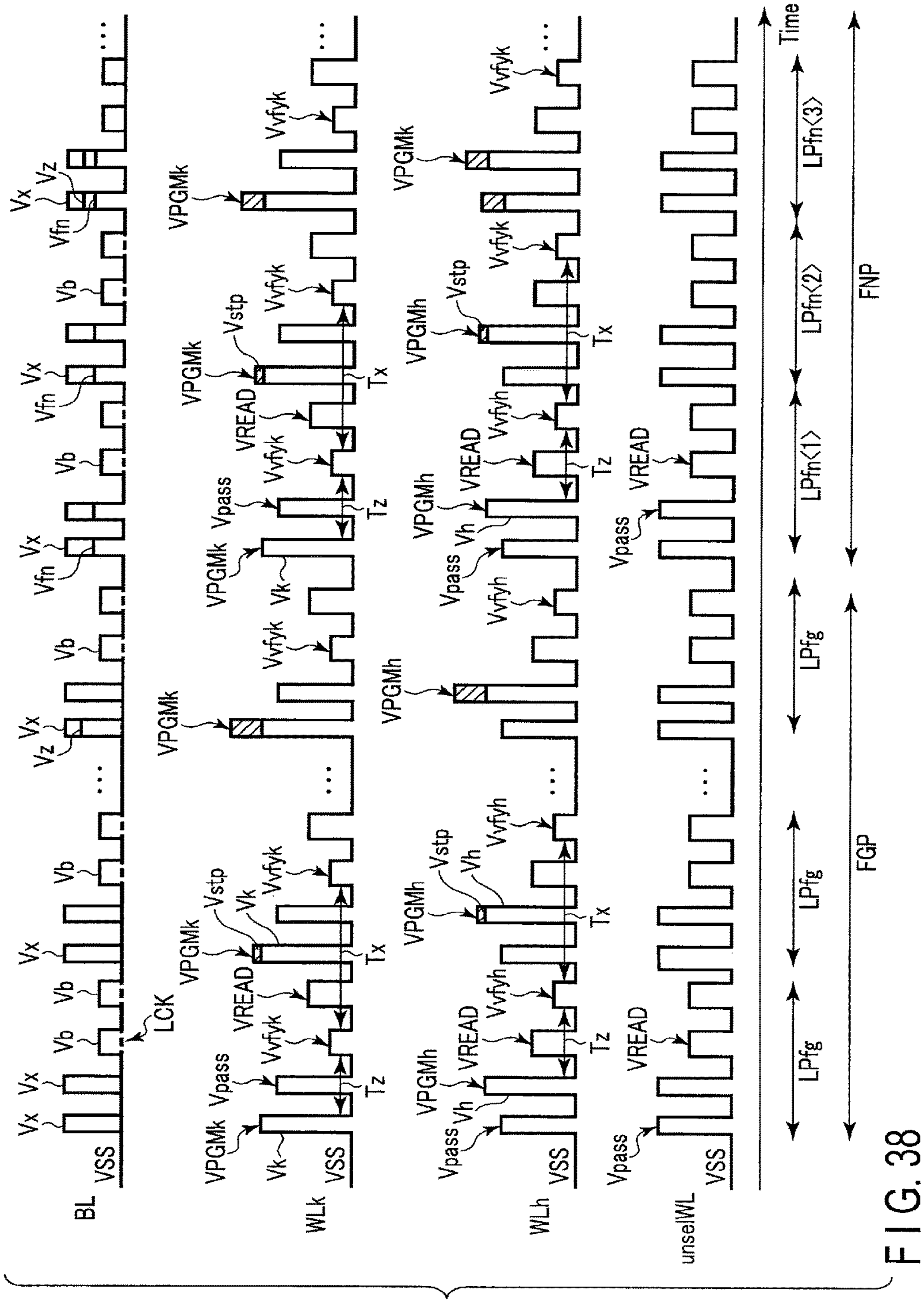
Figure 39:
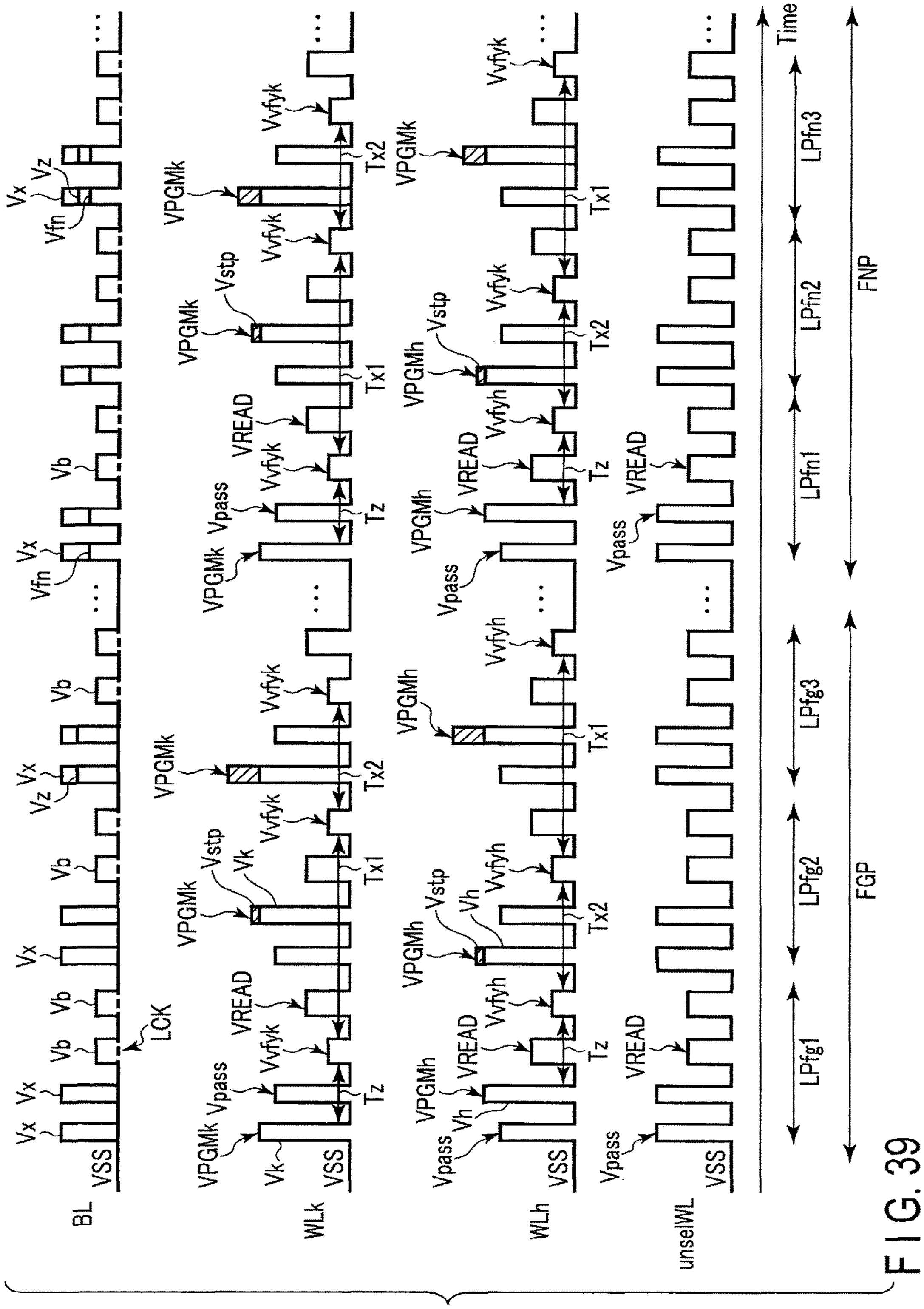

FIGS. 38 and 39 show a modification of the operation example of the flash memory in FIG. 37.

As shown in FIG. 38, in the period FGP of foggy writing, like in a period of fine writing, the program operation and the verify operation may be performed in parallel for the memory cell of the selected word line WLk and the memory cell of the selected word line WLh.

Also, as shown in FIG. 39, like the operation example in FIG. 36, the order of the program operation and the verify operation may be interchanged in accordance with the number of times of write loops in the operation for the memory cell of the selected word line WLk and the memory cell of the selected word line WLh.

In FIG. 39, the order of the program operation (and the verify operation) for the memory cell of the selected word line WLk and the memory cell of the selected word line WLh may be interchanged in accordance with the number of times of write loops only in fine writing. Also, the order of the program operation (and the verify operation) for the memory cell of the selected word line WLk and the memory cell of the selected word line WLh may be interchanged in accordance with the number of times of write loops only in foggy writing.

Even if a certain write mode such as the pass write method is applied to the flash memory as described above, a plurality of word lines WL can simultaneously be selected so that writing of data into the memory cell of each word line can be performed in parallel.

In the present example, an example in which the pass write method is applied to the write mode of the flash memory is shown. However, if the write mode allows to select a plurality of word lines WL simultaneously, a write method other than the pass write method may also be applied to the flash memory according to the present embodiment.

(3a-4) Fourth Example

A fourth example of the operation example of the flash memory according to the present embodiment will be described using FIG. 40. FIG. 40 is a timing chart schematically showing the voltage waveform (horizontal axis: time, vertical axis: potential) of each wire during write operation of the flash memory according to the present embodiment.

If a memory cell array has a three-dimensional structure containing a plurality of string units in a flash memory (see FIGS. 5 and 6), the flash memory 1 can control the operation for each string unit SU.

In the present example, the flash memory according to the present embodiment performs writing of data into the plurality of string units in parallel.

In the present example, four string units SU (SU0 to SU3) in one block BK are simultaneously selected. Then, the word line WLk is selected in the four string units SU. One select gate line is activated among the four select gate lines SOD on the drain side. Thereby, the one string unit is activated as a target of the operation and the other string units are not activated as the target of the operation. For example, the word line WLk in the four string units SU are arranged in the same interconnect layer (layer positioned in the same height from the substrate surface).

Figure 40:
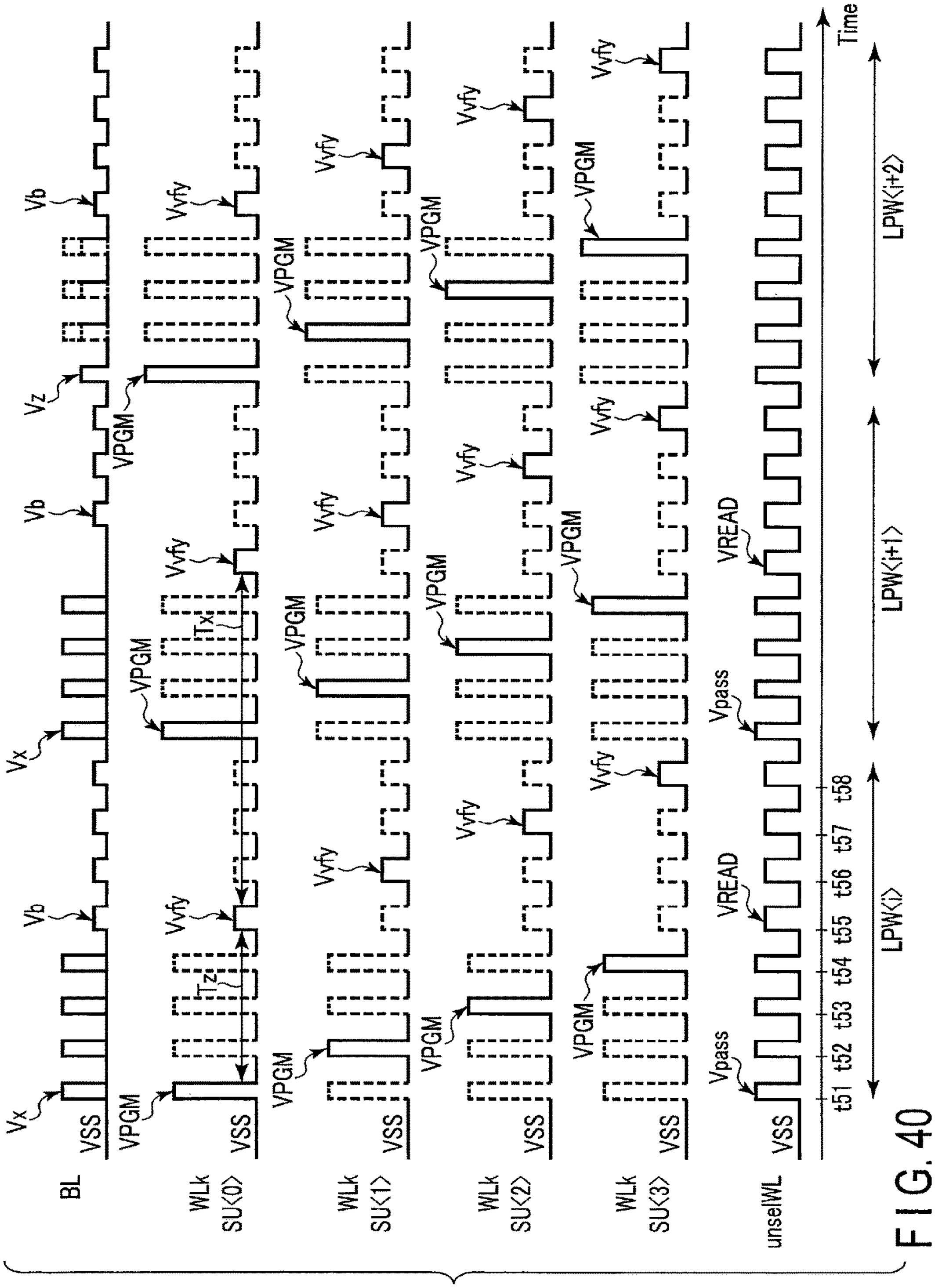

As shown in FIG. 40, the first string unit SU0 is activated to perform a program operation in a certain write loop LPW<i> (for example, i=1). At this point, the voltage VSGD is applied to the first select gate line SGD0 on the drain side and the voltage VSS is applied to the other select gate lines SGD1, SGD2, SGD3. The voltage VSS is applied to the select gate line SGS on the source side. A select transistor ST1 of the first string unit SU0 is turned on by the voltage VSGD.

At time t51, the program voltage VPGM is applied to the word line WLk of the first string unit SU0. The write pass voltage Vpass is applied to the other word lines unselWL of the first string unit SU0. Accordingly, a program operation is performed for the memory cell of the word line WLk in the first string unit SU0.

By the application of voltage VSS to the select gate lines SGD on the drain side of the other string units SU1, SU2, SU3, select gate transistors ST1 of the other string units SU1, SU2, SU3 are turned off and the selected cells of the string units SU1, SU2, SU3 are isolated form the bit lines. Thus, even if the word line WLk is shared by the string units SU, the program operation is not performed for the memory cells of the word line WLk in the string unit SU1, SU2, SU3. The voltage Vpass is applied to unselected word lines unselWL of the string units SU1, SU2, SU3.

Before the verify voltage is applied to the selected word line WLk of the first string unit SU0, the voltage VSGD is applied to the second select gate line SGD1 on the drain side to activate the second string unit. The voltage VSS is applied to the other select gate lines SGD0, SGD2, SGD3.

At time t52, the program voltage VPGM is applied to the word line WLk of the second string unit SU1. The write pass voltage Vpass is applied to the other word lines unselWL of the second string unit SU1. Accordingly, a program operation is performed for the memory cell of the word line WLk in the second string unit SU1.

In the other string units SU0, SU2, SU3, the voltage VSS is applied to the select gate lines SGD on the drain side. By the inactivated select gate lines SGD on the drain side, the program operation for the string units SU0, SU1, SU3 is not operated. The voltage Vpass is applied to unselected word lines unselWL.

Also in the third and fourth string units SU2, SU3, like the first and second units SU0, SU1, the string units SU2, SU3 are activated by applying the voltage VSG1 to the select gate lines SGD2, SGD3 on the drain side at mutually different times. Then, at times t53, t54, the program voltage VPGM is applied to the word lines WLk of the string units SU2, SU3 respectively. Thus, a program operation is performed for the memory cells of the word lines WLk in the third and fourth string units SU2, SU3.

After the program voltage VPGMk is applied to the word line WLk of each string unit SU, a verify operation for the memory cell of the word line WLk of each string unit SU is performed.

The voltage VSG is applied to the first select gate line SGD0 on the drain side to activate the first string unit SU0. The select transistor ST1 of the first string unit SU0 is turned on. The voltage VSS is applied to the other select gate lines SGD1, SGD2, SGD3. The voltage VSG is applied to the select gate line SGS on the source side.

At time t55, the verify voltage Vvfy is applied to the word line WLk of the first string unit SU0. The read voltage VREAD is applied to the other word lines unselWL of the first string unit SU0. Accordingly, a verify operation is performed for the memory cell of the word line WLk in the first string unit SU0.

The voltage VSS is applied to the select gate lines SGD on the drain side of the other string units Su1, SU2, SU3. Thereby, the memory cells of the word line WLk of the other string units SU1, SU2, SU3 are isolated from the bit lines. Thus, the verify operation is not performed for the memory cells of the word line WLk of the string units SU1, SU2, SU3. The voltage VREAD is applied to the unselected word line unselWL of the string units SU1, SU2, SU3.

After the verify voltage is applied to the selected word line WLk of the first string unit SU0, the voltage VSG1 is applied to the second select gate line SGD1 on the drain side to activate the second string unit SU. The voltage VSS is applied to the other select gate lines SGD0, SGD2, SGD3.

At time t56, the verify voltage Vvfy is applied to the word line WLk of the second string unit SU1. The read voltage VREAD is applied to the other word lines unselWL of the second string unit SU1. Accordingly, a verify operation is performed for the memory cell of the word line WLk in the second string unit an.

In the other string units SU0, SU2, SU3, the voltage VSS is applied to the select gate lines SGD on the drain side. Thus, by the inactivated select gate lines SGD, the verify operation is not performed for the memory cells of the string units SU0, SU2, SU3. The voltage VREAD is applied to unselected word lines unselWL.

Also in the third and fourth string units SU2, SU3, like the first and second units SU0, SU1, the string units SU2, SU3 are activated by applying the voltage VSG2 to the select gate lines SGD2, SGD3 on the drain side at mutually different times. Then, at times t57, t58, the verify voltage Vvfy is applied to the word line WLk. Thus, a verify operation is performed for the memory cells of the word lines WLk in the third and fourth string units SU2, SU3.

The write loops LPW<i+1>, LPW<i+2> are repeatedly performed until the memory cell of each word line verify-passes.

In the present example, word lines of the same wiring layer are selected in each string unit SU. In the present example, however, word lines in different wiring layer may also be selected.

In the flash memory according to the present embodiment, for example, the word line may be isolated for each string unit so that the application of voltage to the word line can independently be controlled for each string unit.

In the flash memory according to the present example, as described above, even if writing of data into memory cells is performed in a plurality of string units in parallel, a certain period Tx can be secured between the program operation and the verify operation.

In the present example, the flash memory according to the present embodiment performs the verify operation of each string unit after the program operation is completed in all of the plurality of string units. Accordingly, in a certain string unit, a period from the application of the program voltage to the selected word line to the application of the verify voltage can be made longer.

As a result, a period until movement of charges in the charge storage layer of a memory cell can be made longer. Therefore, the flash memory according to the present embodiment can verify the threshold voltage state of a memory cell for which programming is completed after the threshold voltage of the memory cell converges to a certain value.

Therefore, the flash memory according to the present embodiment can improve reliability of data.

(3b) Conclusion

A flash memory according to the present embodiment selects a plurality of word lines simultaneously during write operation to perform programming of data into the memory cell connected to each word line in parallel.

The flash memory according to the present embodiment can secure a certain period between the program operation and the verify operation without pressure on a period to write data into a plurality of word lines.

As a result, the flash memory according to the present embodiment can verify the threshold voltage of a memory cell after a period in which the threshold voltage of the memory cell converges to a certain value after a program operation is secured.

As a result, the flash memory according to the present embodiment can detect a memory cell in which the threshold voltage fluctuates during write operation with a relatively high degree of precision. The flash memory according to the present embodiment can delete errors of data that may arise in a memory cell by performing a reprogram operation for the memory cell in which the threshold voltage has fallen below the value corresponding to data to be written.

Therefore, the flash memory according to the present embodiment can improve reliability of data.

(4) Modification

A modification of the flash memory according to an embodiment will be described with reference to FIGS. 41 to 44.

(4a) First Example

A first example of the modification of the flash memory according to an embodiment will be described with reference to FIGS. 41 and 42. FIG. 41 is a flowchart illustrating a modification of the flash memory according to an embodiment. FIG. 42 is a timing chart illustrating the modification of the flash memory according to an embodiment. In FIG. 42, the voltage waveform (horizontal axis: time, vertical axis: potential) of each interconnect of the flash memory during write operation is schematically shown.

As shown in FIGS. 41 and 42, writing of data into the flash memory is started (step S60).

A program operation is performed for memory cells (step S61). During the program operation, the potential of the bit line BL is set to the ground voltage VSS to perform programming in normal mode.

After the program operation, a verify operation is performed (steps S62, S63). In the verify operation, the threshold voltage of a memory cell is verified regarding two levels of the verify low level and the verify high level.

If, for example, a memory cell verify-fails regarding the verify low level in the i-th write loop LP<i> (No in step S62), a program operation in normal mode is performed for the memory cell.

If the verify result of a memory cell, which has passed at the verify low level, regarding the verify high level is a pass (Yes in step S63), programming of data for the memory cell is completed.

If the verify result of a memory cell, which has passed at the verify low level, regarding the verify high level is a fail (No in step S63), in the (i+1)-th write loop LP<i+1>, the memory cell (for example, memory cells connected to the bit lines BLy, BLz) is set to a program inhibited state (step S64). The voltage Vx is applied to the bit lines BLy, BLz to put the memory cell into a program inhibited state.

A verify operation regarding the verify low level and the verify high level is performed for the memory cell set to a program inhibited state (steps S65, S66).

Here, as a defect regarding fluctuations of the threshold voltage of a memory cell, in addition to a defect in which the threshold voltage of a memory cell unintentionally falls, a defect in which the threshold voltage of a memory cell unintentionally rises.

Even if a memory cell, which has passed verification at the verify low level, is set to a program inhibited state during program operation due to the unintended rise of the threshold voltage, the memory cell may pass at the verify high level.

If a memory cell passes verification regarding the verify low level and the verify high level (Yes in step S66), the memory cell is determined to have completed programming.

If a memory cell fails in verification regarding the verify high level (No in step S66), programming of data is performed for the memory cell in a program operation (program operation in the next write loop LP<i+2>) after the verify operation.

In this case, the voltage Vz is applied to the bit line connected to the memory cell failed regarding the verify high level. Accordingly, in a program operation of the write loop LP<i+2>, slow programming is performed for the memory cell (step S67).

Accordingly, programming of data for the memory cell is completed.

Incidentally, a verify operation may be performed for the slow-programmed memory cell to determine whether the memory cell pass regarding the verify high level. Like the other above examples, the program operation and the verify operation are repeatedly performed until the memory cell passes regarding the verify high level.

In step S65, as described above, the threshold voltage of a memory cell may be lower than the verify low level. In such a case, programming in normal mode (step S61) is performed again for the verify-failed memory cell regarding the verify low level.

If the threshold voltage of a memory cell unintentionally rises, over-programming may arise in the memory cell due to program mode in normal mode for the memory cell.

Like in the present example, the flash memory according to the present embodiment puts a memory cell, which has passed regarding the verify low level and failed regarding the verify high level, into a program inhibited state once and then, verify the threshold voltage of the memory cell regarding the verify high level.

Accordingly, the flash memory according to the present embodiment can detect a memory cell in which an unintended rise of the threshold voltage arises.

As a result, the flash memory according to the present embodiment can inhibit over-programming of memory cells.

Therefore, the flash memory according to the present embodiment in the present modification can improve reliability of data.

(4b) Second Example

A first example of the modification of the flash memory according to an embodiment will be described with reference to FIG. 43. FIG. 43 is a flowchart illustrating a fifth example of the operation example of the flash memory according to the present embodiment.

As shown in FIG. 43, a write operation of data into the memory cell connected to the selected word line is started (step S70).

The sequencer 19 performs a program operation for the memory cell connected to the selected word line (step S71). Accordingly, the threshold voltage of a memory cell is shifted to the voltage value corresponding to data to be written.

After the program operation, the sequencer 19 performs a verify operation (step S72) to determine whether the certain memory cell verify-passes (step S73). If a memory cell verify-fails, the sequencer 19 performs a program operation for the memory cell again.

If a memory cell verify-passes, the sequencer 19 puts the memory cell into a program inhibited state (step S74).

The sequencer 19 counts the number of times of applying the program voltage to the selected word line after a memory cell verify-passes (or the number of times of write loops performed) (step S75).

The sequencer 19 determines whether the number of times of applying the program voltage exceeds a set value NZ (step S76).

If the number of times of applying the program voltage is the set value NZ or less (No in step S76), the sequencer 19 puts the memory cell into a program inhibited state in the next write loop.

If the number of times of applying the program voltage exceeds the set value NZ (Yes in step S76), the sequencer 19 performs program verification for the memory cell put into a program inhibited state based on the verify-pass result (step S77). In the verify operation in step S77, for example, the verify level used for program verification is a verify level corresponding to data to be written (see FIG. 5). However, a voltage value lower than the lower limit of the threshold distribution corresponding to data to be written (voltage value between the verify high level and the read level) may be used as the verify level.

Based on the result of the verify operation, whether a memory cell after a certain period passes from a verify-pass verify-passes is determined (step S78).

If the result of program verification is a pass, programming of data for the memory cell is completed (step S79).

If the result of program verification is a fail, slow programming (or programming in normal mode) is performed for the memory cell in the next write loop (step S80). After the slow programming, programming of data for the memory cell is completed. Incidentally, verification may be performed again for the slow-programmed memory cell so that slow programming and verification are repeatedly performed until the verification passes.

Thus, in the present example, the threshold voltage of a memory cell after the program voltage is applied NZ times after a verify-pass is verified.

Accordingly, the flash memory according to the present embodiment can control a period between a verify-pass regarding a certain memory cell and reverification thereof and secure the period relatively long.

Accordingly, the flash memory according to the present embodiment can improve reliability of detecting changes of the threshold voltage of a certain memory cell that may arise after the verify-pass.

Therefore, the flash memory according to the present embodiment can improve reliability of data.

(4c) Third Example

Figure 44:
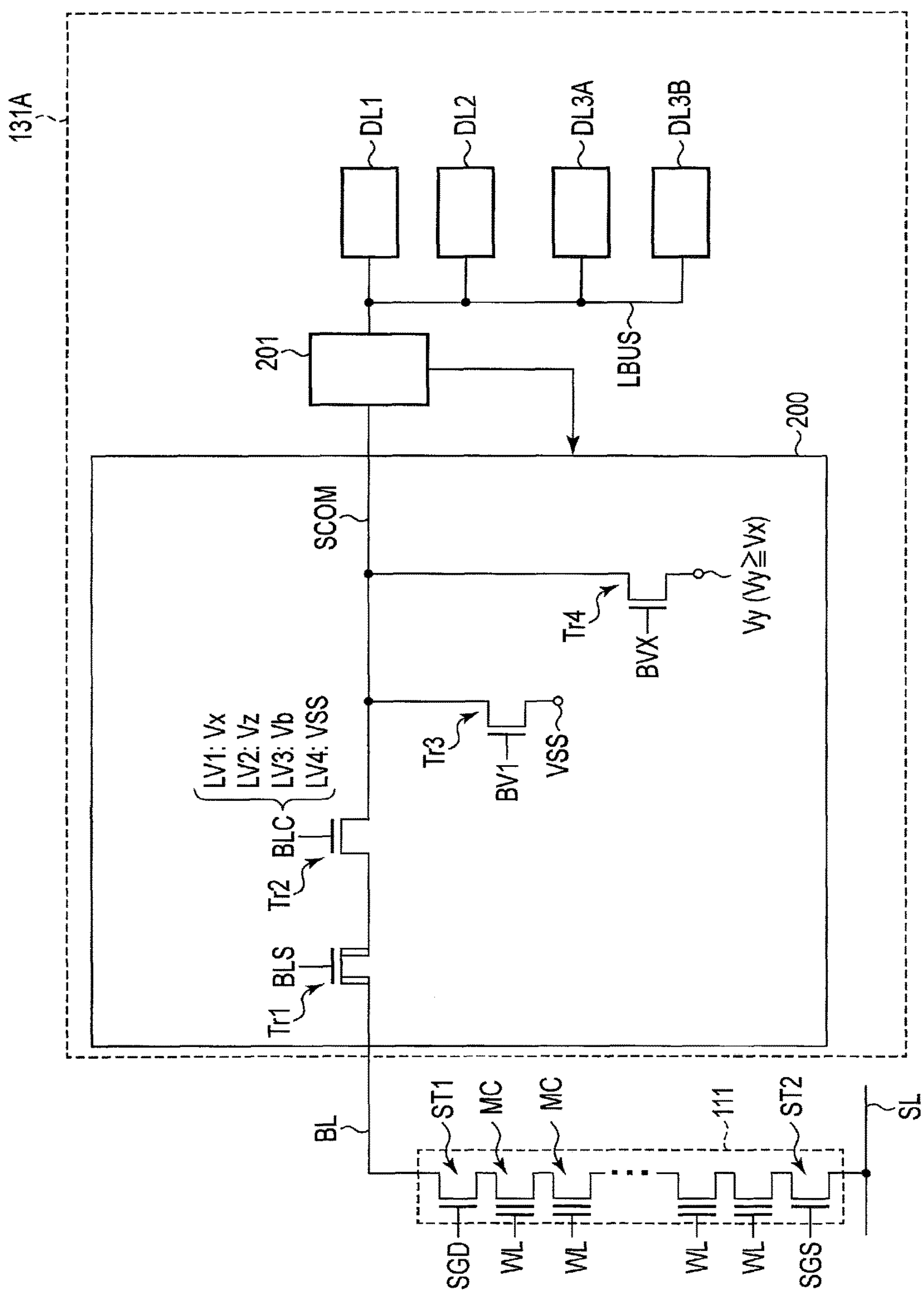
FIG. 44 is an equivalent circuit diagram showing the modification of the memory device according to an embodiment.

A third example of the modification of the flash memory according to an embodiment will be described with reference to FIG. 44. FIG. 44 is an equivalent circuit diagram showing a modification of the circuit configuration of a sense amplifier unit in the flash memory according to the present embodiment.

As shown in FIG. 44, a sense amplifier unit 131A has a terminal to which a voltage Vy is applied. The voltage Vy has a voltage value equal to the voltage Vx (Vx>Vz) to put a memory cell into a program inhibited state or more during program operation.

The sense amplifier unit 131A (or the sequencer 19) controls the signal level (voltage value) of a control signal BLC in accordance with the voltage to be supplied to the bit line BL. Accordingly, the sense amplifier unit 131A controls an output voltage (output current) of a transistor Tr2 in accordance with the signal level supplied to the gate of the transistor Tr2. The potential of the bit line BL is set to a potential in accordance with the output voltage of the transistor Tr2.

The signal level of the control signal BLC is controlled based on the calculation result of a processing unit 201 using data in a latch circuit DL (for example, data to be written and the verify result).

If, for example, the signal level of the control signal BLC is a first signal level LV1, the voltage output from the transistor is limited by a driving force of the transistor Tr2 in accordance with the first signal level. As a result, if the signal level of the control signal BLC is the first signal level, the potential of the bit line BL is set to about the voltage Vx.

If the signal level of the control signal BLC is a second signal level LV2, which is lower than the first signal level LV1, the potential of the bit line BL is set to about the voltage Vz by the driving force of the transistor Tr2 in accordance with the second signal level.

Similarly, a voltage Vb or a voltage VSS is applied to the bit line BL in accordance with a third signal level LV3 and a fourth signal level LV4 of the control signal BLC.

By controlling the signal level of a control signal supplied to the gate of a transistor like in the present example, the potential applied to the bit line BL can be controlled.

Therefore, the amount of charges injected into the charge storage layer of a memory cell can be controlled by the circuit shown in FIG. 43 during program operation into the memory cell.

Consequently, even if the configuration of a circuit to control the potential of a bit line is appropriately changed, the flash memory according to the present embodiment can implement the above operation.

(5) Others

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory device comprising:

a plurality of memory cells;

a first word line connected to the memory cells;

a first bit line connected to a first memory cell among the memory cells; and a first circuit capable of controlling a potential of the first bit line, the first circuit including a first transistor that supplies a first voltage to the first bit line, a second transistor that supplies a second voltage to the first bit line, a third transistor that supplies a third voltage to the first bit line, the second voltage higher than the first voltage, and the third voltage higher than the first voltage and lower than the second voltage, wherein when data is written, a first program voltage is applied to the first word line and the first voltage is applied to the first bit line, a first verify voltage is applied to the first word line to obtain a first verify result, a second program voltage is applied to the first word line and the second voltage is applied to the first bit line, a second verify voltage is applied to the first word line to obtain a second verify result, the first memory cell in which the first verify result is a pass is set to a program inhibited state when the second program voltage is applied and set as a target of the detection of the second verify result, and when the second verify result of the first memory cell is a fail, a third program voltage is applied to the first word line and the third voltage is applied to the first bit line to program the data into the first memory cell.

2. The device of claim 1, wherein after the third program voltage is applied, a third verify voltage is applied to the first word line to obtain a third verify result, and whether the first memory cell, which failed in the second verify result, passes in the third verify result is detected.

3. The device of claim 1, wherein the first transistor includes a first terminal connected to the first bit line, a second terminal connected to a first interconnect, and a first gate, the second transistor includes a third terminal connected to the first interconnect and a fourth terminal connected to a first voltage terminal, and the third transistor includes a fifth terminal connected to the first interconnect and a sixth terminal connected to a second voltage terminal, the first voltage is supplied to the first voltage terminal, a fourth voltage equal to the third voltage or higher is supplied to the second voltage terminal, when a first signal having a first signal level is supplied to the first gate, the first transistor supplies the first voltage from the second transistor to the first bit line, when a second signal having a second signal level higher than the first signal level is supplied to the first gate, the first transistor supplies the second voltage to the first bit line using the fourth voltage from the third transistor, and when a third signal having a third signal level higher than the first signal level and lower than the second signal level is supplied to the first gate, the first transistor supplies the third voltage to the first bit line using the fourth voltage from the third transistor.

4. A memory device comprising:

a plurality of memory cells;

a first word line connected to first memory cells among the plurality of memory cells, and a second word line connected to second memory cells among the plurality of memory cells, wherein when data is written, a first program voltage is applied to the first word line, a second program voltage is applied to the second word line after the first program voltage is applied to the first word line a first verify voltage is applied to the first word line to obtain a first verify result after the second program voltage is applied to the second word line, a third program voltage is applied to the first word line after the first verify voltage is applied to the first word line, a second verify voltage is applied to the first word line to obtain a second verify result, and among the first memory cells, a memory cell in which the first verify result is a pass is set to a program inhibited state when the third program voltage is applied and set as a target of the detection of the second verify result.

5. The device of claim 4, wherein a third verify voltage is applied to the second word line after the first verify voltage is applied and before the third program voltage is applied and a fourth program voltage is applied to the second word line after the third program voltage is applied and before the second verify voltage is applied.

6. The device of claim 4, wherein a third verify voltage is applied to the second word line after the first verify voltage is applied and before the third program voltage is applied and a fourth program voltage is applied to the second word line after the third verify voltage is applied and before the third program voltage is applied.

7. The device of claim 4, wherein the first verify voltage includes a first level and a second level higher than the first level and when the memory cell passes at the first level and fails at the second level, the memory cell is set to a program inhibited state when the third program voltage is applied and set as a target of the detection of the second verify result.

8. The device of claim 4, wherein the first verify result is based on a threshold of the memory cell by a program operation using the first program voltage and the second verify result is based on the threshold of the memory cell by the program operation using the first program voltage and the program operation using the third program voltage.

9. A memory device comprising:

first and second memory cells; and a first word line connected to the first and second memory cells, wherein in a write operation in which writing of first data into the first memory cell and writing of second data, which is different from the first data, into the second memory cell are started simultaneously, a first program voltage is applied to the first word line, a first verify voltage including a first determination level regarding the first data is applied to the first word line to obtain a first verify result, the first memory cell into which the first data has been written is set to a program inhibited state and a second program voltage to write the second data into the second memory cell is applied to the first word line after the writing of the first data is determined to be completed based on the first verify result, and a second verify voltage including a second determination level regarding the first data is applied to the first word line to obtain a second verify result.

10. The device of claim 9, wherein after the second verify voltage is applied, a third program voltage is applied to the first word line and the first memory cell whose second verify result is a pass is set to a program inhibited state when the third program voltage is applied.

11. The device of claim 9, wherein after the second verify voltage is applied, a third program voltage is applied to the first word line and the first memory cell whose second verify result is a fail is set to a programmable state when the third program voltage is applied.

12. The device of claim 11, further comprising:

a first bit line connected to the first memory cell, wherein a first voltage is applied to the first bit line when the first program voltage is applied, a second voltage, which is higher than the first voltage, is applied to the first bit line when the second program voltage is applied, and a third voltage, which is higher than the first voltage and lower than the second voltage, is applied to the first bit line when the third program voltage is applied.

13. The device of claim 9, wherein a threshold voltage of the first memory cell holding the first data has a first value, a threshold voltage of the second memory cell holding the second data has a second value higher than the first value, and the first determination level is equal to the first value or less.

14. The device of claim 9, wherein the second determination level is equal to the first determination level or less.

15. The device of claim 9, further comprising:

third memory cells connected to the first word line; and bit lines connected to each of the first memory cells and the third memory cells, wherein completion of writing of the first data into the third memory cells is determined based on the first verify result, a number of, among the first memory cells and the third memory cells, memory cells having a failed verify result is counted based on the second verify result, a fourth voltage is applied to, among the bit lines, a plurality of second bit lines connected to the memory cells having the failed verify result when the number of the memory cells having the failed verify result is equal to a first number or less, and a fifth voltage lower than the fourth voltage is applied to the second bit lines when the number of the memory cells having the failed verify result is larger than the first number.

16. The device of claim 1, wherein the first verify voltage includes a first level and a second level higher than the first level and when the first memory cell passes at the first level and fails at the second level, the first memory cell is set to a program inhibited state when the second program voltage is applied and set as a target of the detection of the second verify result.

17. The device of claim 1, wherein the first verify result is based on a threshold of the first memory cell by a program operation using the first program voltage and the second verify result is based on the threshold of the first memory cell by the program operation using the first program voltage and the program operation using the second program voltage.

* * * * *